US010256572B2

(12) United States Patent
Hirose et al.

(10) Patent No.: US 10,256,572 B2
(45) Date of Patent: Apr. 9, 2019

(54) SOCKET, ADAPTOR, AND ASSEMBLY JIG HAVING A MOVABLE PORTION WITH A ROTATION AXIS SLIDABLY CONNECTED TO A WALL PORTION THAT UPWARDLY EXTENDS FROM A BOTTOM PLATE

(71) Applicant: Panasonic Intellectual Property Management Co., Ltd., Osaka (JP)

(72) Inventors: Yutaka Hirose, Kyoto (JP); Yoshihisa Kato, Shiga (JP); Hiroyuki Mori, Osaka (JP); Taichi Sato, Kyoto (JP); Yoshihide Sawada, Kyoto (JP); Tsuyoshi Tanaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 44 days.

(21) Appl. No.: 15/711,173

(22) Filed: Sep. 21, 2017

(65) Prior Publication Data

US 2018/0019546 A1  Jan. 18, 2018

Related U.S. Application Data

(62) Division of application No. 14/823,659, filed on Aug. 11, 2015, now Pat. No. 9,799,992.

(30) Foreign Application Priority Data

Aug. 22, 2014 (JP) ................................. 2014-169405

(51) Int. Cl.
*H01R 13/64* (2006.01)
*G02B 21/34* (2006.01)
(Continued)

(52) U.S. Cl.
CPC ................ *H01R 13/64* (2013.01); *B01L 9/52* (2013.01); *F16M 11/046* (2013.01);
(Continued)

(58) Field of Classification Search
CPC .. F16M 11/046; F16M 11/10; G02B 21/0008; G02B 21/34; H01R 13/639; E05B 83/32
(Continued)

(56) References Cited

U.S. PATENT DOCUMENTS 5,195,272 A * 3/1993 Yamada ................. A45C 13/10
16/231
5,414,556 A  5/1995 Focht
(Continued)

FOREIGN PATENT DOCUMENTS

CN  102713720  10/2012
EP  1 171 761  1/2002
(Continued)

OTHER PUBLICATIONS

Partial European Search Report dated Dec. 16, 2015 in corresponding European Patent Application No. 15180724.5.
(Continued)

*Primary Examiner* — Que Tan Le
(74) *Attorney, Agent, or Firm* — Wenderoth, Lind & Ponack, L.L.P.

(57) ABSTRACT

A socket includes a first base member that includes a module mount unit allowing a module including an imaging device and an object to be placed thereon and an electric connector that electrically connects the imaging device to an external apparatus, a second base member having an opening, and an engagement unit that causes the first base member to be engaged with the second base member under a condition that the module placed on the module mount unit is sandwiched by the first and second base members. When the first base
(Continued)

member is engaged with the second base member by the engagement unit under a condition that the module placed on the module mount unit is sandwiched by the first base member and the second base member, the electric connector is electrically connected to the imaging device, and the object receives illumination light from a light source through the opening.

1 Claim, 40 Drawing Sheets

(51) Int. Cl.
    F16M 11/04      (2006.01)
    F16M 11/10      (2006.01)
    H01R 13/639     (2006.01)
    H01R 13/73      (2006.01)
    H04N 1/031      (2006.01)
    H04N 5/372      (2011.01)
    B01L 9/00       (2006.01)
    H04N 5/225      (2006.01)
    H01L 27/146     (2006.01)
    H01L 27/148     (2006.01)
    G02B 21/00      (2006.01)

(52) U.S. Cl.
    CPC ......... F16M 11/10 (2013.01); G02B 21/0008 (2013.01); G02B 21/34 (2013.01); H01L 27/14623 (2013.01); H01L 27/14818 (2013.01); H01R 13/639 (2013.01); H01R 13/73 (2013.01); H04N 1/0315 (2013.01); H04N 1/0318 (2013.01); H04N 5/2257 (2013.01); H04N 5/372 (2013.01); B01L 2300/0645 (2013.01); B01L 2300/0654 (2013.01); B01L 2300/0822 (2013.01)

(58) Field of Classification Search
    USPC .......................................... 250/239
    See application file for complete search history.

(56) References Cited

U.S. PATENT DOCUMENTS

| 7,604,777 | B2 | 10/2009 | Columbus |
| 2010/0126005 | A1 | 5/2010 | He et al. |
| 2011/0096157 | A1 | 4/2011 | Fine et al. |
| 2015/0241679 | A1 | 8/2015 | Fine et al. |

FOREIGN PATENT DOCUMENTS

| JP | 62-137037 | 6/1987 |
| JP | 2011-108788 | 6/2011 |

OTHER PUBLICATIONS

Extended European Search Report dated Feb. 23, 2016 in corresponding European Application No. 15180724.5.
Chinese Search Report dated Oct. 31, 2018 in corresponding Chinese Patent Application No. 201510487437.7.

* cited by examiner

SOCKET, ADAPTOR, AND ASSEMBLY JIG HAVING A MOVABLE PORTION WITH A ROTATION AXIS SLIDABLY CONNECTED TO A WALL PORTION THAT UPWARDLY EXTENDS FROM A BOTTOM PLATE

BACKGROUND

1. Technical Field

The present disclosure relates to a socket, an adaptor, and an assembly jig.

2. Description of the Related Art

To observe a micro structure of, for example, a body tissue, an optical microscope has been used. Optical microscopes use light transmitted through or reflected off an observation object. The observer observes an image of the object magnified by a lens. In addition, digital microscopes that capture an image magnified by a lens of the microscope and displays the image on a display have been developed. By using a digital microscope, a plurality of observers can observe an object at the same time or at different locations.

In recent years, a technology for observing a micro structure using a contact image sensing (CIS) technique has attracted attention. In the CIS technique, an observation object is placed in close proximity to an imaging surface of an image sensor. In general, a two-dimensional image sensor having a plurality of photoelectric transducers arranged in a matrix is used as the image sensor. Typically, the photoelectric transducer is a photodiode formed on a semiconductor layer or a semiconductor substrate. Upon receipt of incoming light, the photodiode produces electrical charge.

An image acquired by the image sensor is defined by a plurality of pixels. Each of the pixels is defined as a partitioned unit area including a photoelectric transducer. Accordingly, in general, the resolution of the two-dimensional image sensor depends on the arrangement pitch or the arrangement density of the photoelectric transducers in an imaging surface. As used herein, the resolution determined by the arrangement pitch is also referred to as "intrinsic resolution" of the image sensor. The arrangement pitch of the photoelectric transducers is decreased so as to be substantially the same as the wavelength of visible light. Thus, it is difficult to further improve the intrinsic resolution.

A technology for providing a resolution that is higher than the intrinsic resolution of the image sensor has been proposed. For example, Japanese Unexamined Patent Application Publication No. 62-137037 describes a technology for forming the image of an object using a plurality of images obtained by shifting the image location of the object.

SUMMARY

One non-limiting and exemplary embodiment provides a socket, an adaptor, and an assembly jig that allow an image forming system that provides a resolution higher than the intrinsic resolution of an image sensor to operate more flexibly.

In one general aspect, the techniques disclosed here feature a socket including a first base member that includes a module mount unit allowing a module including an imaging device and an object to be placed thereon and an electric connection portion electrically connecting the imaging device to an external apparatus, a second base member that has an opening, and an engagement unit that causes the first base member to be engaged with the second base member under a condition that the module placed on the module mount unit is sandwiched by the first base member and the second base member. When the engagement unit causes the first base member to be engaged with the second base member under a condition that the module placed on the module mount unit is sandwiched by the first base member and the second base member, the electric connection portion is electrically connected to the imaging device, and the object receives illumination light emitted from a light source and passed through the opening.

According to the present disclosure, the usefulness of super-resolution technology for providing a resolution that is higher than the intrinsic resolution of an image sensor can be increased.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

The principal of image capturing according to an exemplary embodiment of the present disclosure is described first with reference to FIGS. 1A to 6. In the exemplary embodiment of the present disclosure, by using a plurality of images obtained through a plurality of image capturing operations by changing the incident angle of the illumination light, an image having a resolution higher than the resolution of each of the plurality of captured images is formed (hereinafter, the formed image is referred to as a "high-resolution image". The following description is made with reference to a charged coupled device (CCD) image sensor as an example. Note that in the following description, the same numbering is used for constituent elements having substantially the same function, and descriptions of all the constituent element may not be repeated.

Figure 1A:
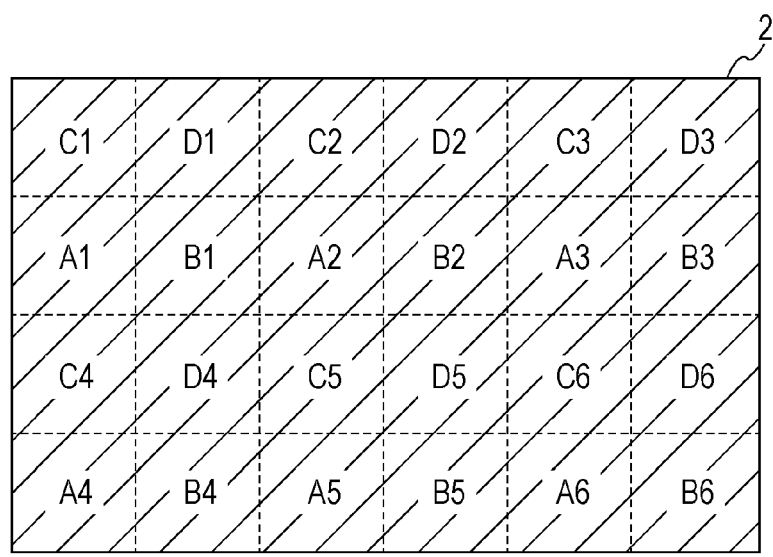
FIG. 1A is a schematic plan view of part of an object.
Figure 1B:
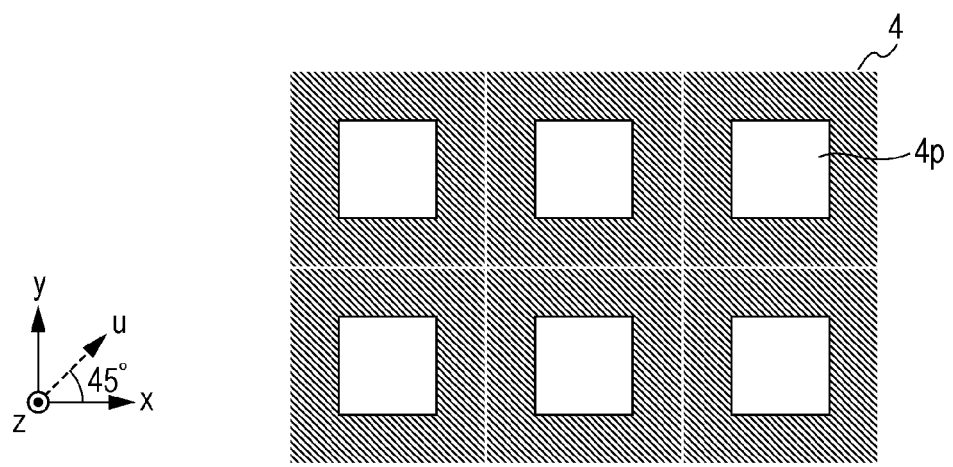
FIG. 1B is a schematic plan view of photodiodes used to capture the images of areas illustrated in FIG. 1A.

Referring to FIGS. 1A and 1B, the following description is made. FIG. 1A is a schematic plan view of part of an object 2. FIG. 1B is a schematic plan view of photodiodes used to capture the image of area illustrated in FIG. 1A among photodiodes 4p of an image sensor 4. To discuss this example, six photodiodes 4p are illustrated in FIG. 1B. Note that for the purpose of reference, arrows indicating an x-direction, a y-direction, and a z-direction which are perpendicular to one another are illustrated in FIG. 1B. The z-direction is the normal direction of the imaging surface. In addition, in FIG. 1B, an arrow indicating a u-direction is illustrated. The u-direction is a direction obtained by rotating the x-direction toward the y-direction by 45° in the xy plane. In other drawings, an arrow indicating the x-direction, the y-direction, the z-direction, or the u-direction may be illustrated.

The constituent element of the image sensor 4 other than the photodiodes 4p are covered by a light shielding layer. In FIG. 1B, an area with hatchings indicates the area covered by the light shielding layer. An area (S2) of a light receiving surface of each of the photodiode disposed on the imaging surface of the CCD image sensor is smaller than an area (S1) of a unit area including the photodiode. The ratio of the light receiving area S2 to the area S1 of the pixel (S2/S1) is referred to as an "aperture ratio". In this example, the aperture ratio is set to 25%.

Figure 2A:
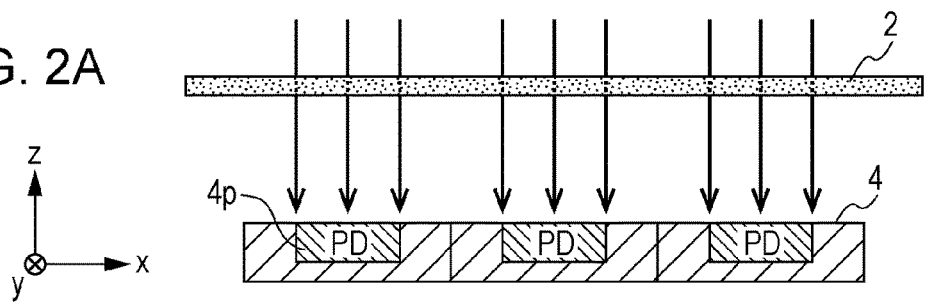
FIG. 2A is a schematic cross-sectional view illustrating the direction of a light ray that has passed through the object and is incident on the photodiodes.
Figure 2B:
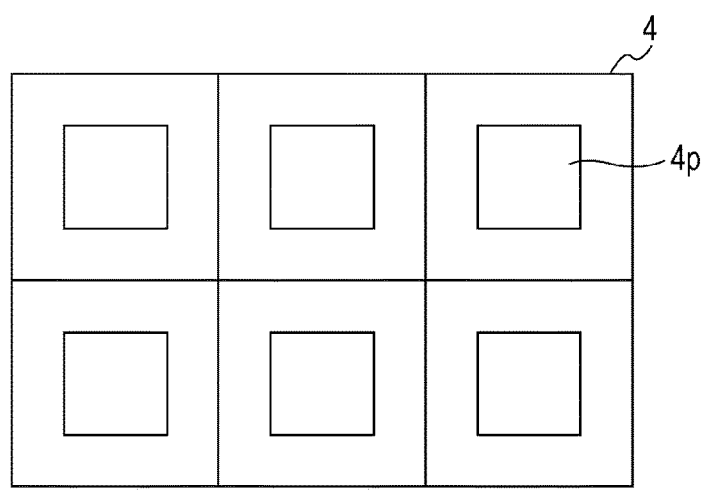
FIG. 2B is a schematic plan view illustrating an example of the arrangement of six photodiodes of interest.
Figure 2C:
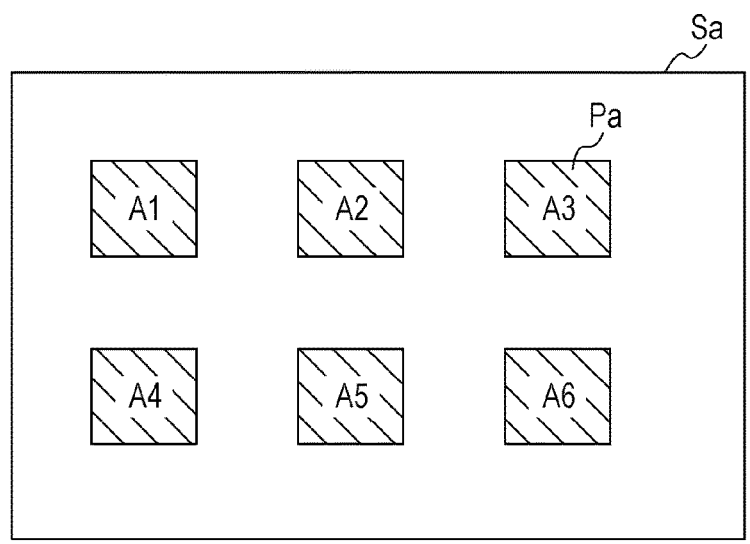
FIG. 2C is a schematic illustration of six pixels obtained by the six photodiodes.

FIG. 2A is a schematic illustration of the direction of a ray of light that has passed through the object 2 and is incident on the photodiodes 4p. In FIG. 2A, the light ray is incident on the imaging surface in a direction perpendicular to the imaging surface (a first direction). FIG. 2B is a schematic plan view illustrating an example of arrangement of six photodiodes 4p of interest. FIG. 2C is a schematic illustration of six pixels Pa obtained by the six photodiodes 4p. Each of the pixels Pa has a value indicating the intensity of light incident on a corresponding one of the photodiodes 4p (a pixel value). In this example, an image Sa (a first sub-image Sa) is formed from the pixels Pa in FIG. 2C. Among the entire area of the object 2, the first sub-image Sa has the information regarding areas A1, A2, A3, A4, A5, and A6 (refer to FIG. 1A) each located above one of the six photodiodes 4p illustrated in FIG. 2B.

As can be seen from FIG. 2A, the image of the object 2 is obtained using substantially parallel light rays that have passed through the object 2. A lens for image formation is not disposed between the object 2 and the image sensor 4. Typically, the distance between the imaging surface of the image sensor 4 and the object 2 is less than or equal to 1 mm. For example, the distance is set to about 1 μm.

Figure 3A:
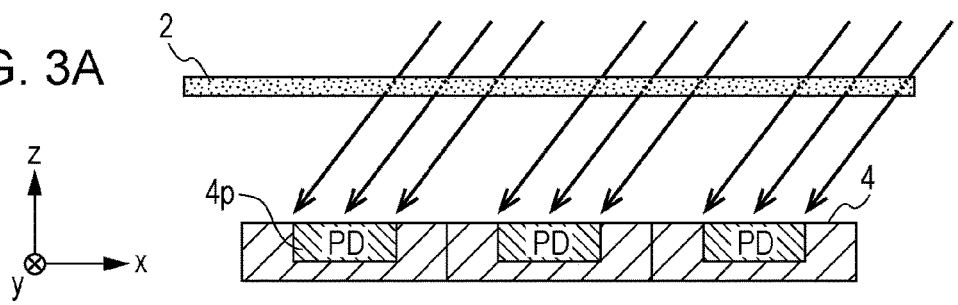
FIG. 3A illustrates a ray of light incident in a second direction that is different from a first direction.
Figure 3B:
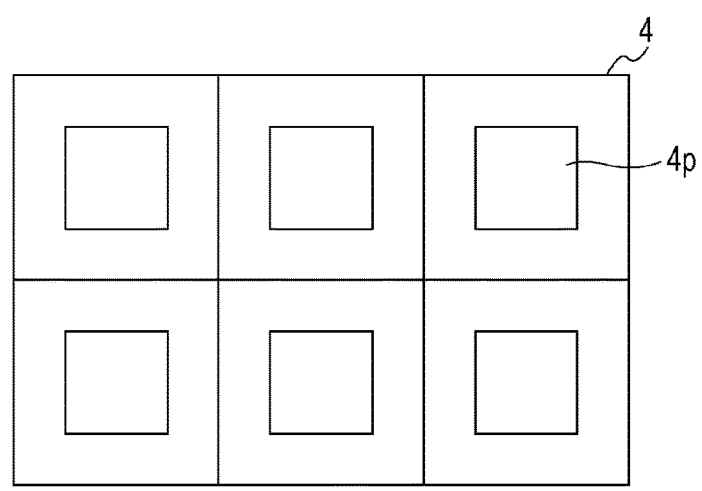
FIG. 3B is a schematic illustration of the arrangement of the six photodiodes of interest.
Figure 3C:
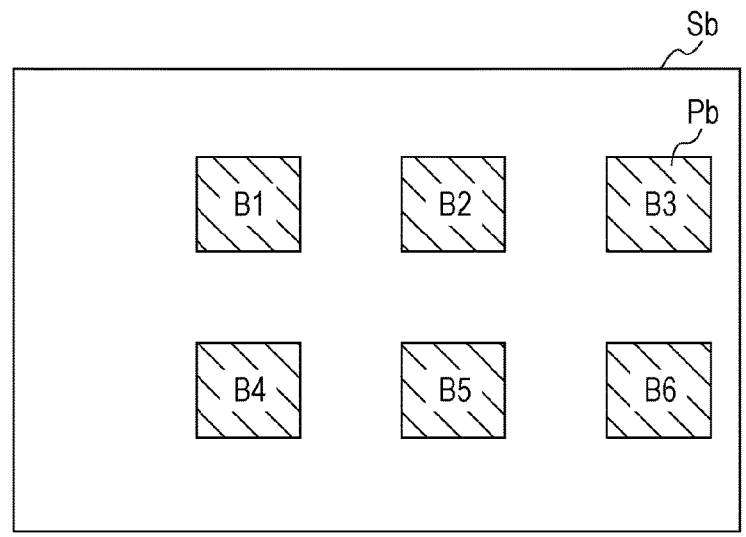
FIG. 3C is a schematic illustration of six pixels obtained by the six photodiodes.

FIG. 3A illustrates a ray of light incident in a second direction that is different from the first direction illustrated in FIG. 2A. FIG. 3B is a schematic illustration of the arrangement of the six photodiodes 4p of interest. FIG. 3C is a schematic illustration of six pixels Pb obtained by the six photodiodes 4p. An image Sb (a second sub-image Sb) is formed from the pixels Pb illustrated in FIG. 3C. Among the entire area of the object 2, the second sub-image Sb has the information regarding areas B1, B2, B3, B4, B5, and B6 (refer to FIG. 1A) that are different from the areas A1, A2, A3, A4, A5, and A6. As illustrated in FIG. 1A, for example, the area B1 is an area located immediately to the right of the area A1.

As can be seen from comparison of FIG. 2A and FIG. 3A, by appropriately setting the direction of the ray of light as it enters the object 2, the ray of light that has passed through a different area of the object 2 can be incident onto the photodiode 4p. As a result, the first sub-image Sa and the second sub-image Sb can contain the pieces of pixel information corresponding to different positions in the object 2.

Figure 4A:
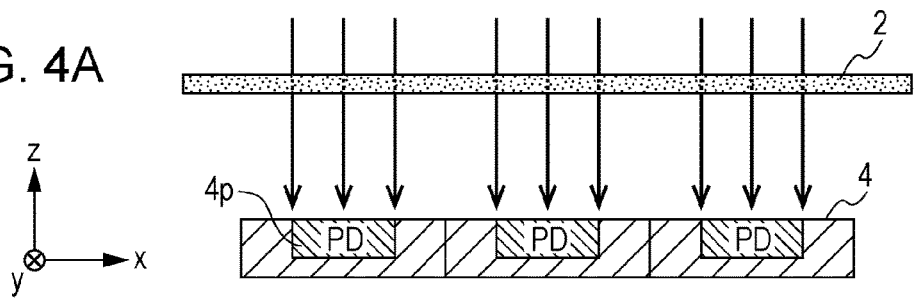
FIG. 4A illustrates a ray of light incoming from a third direction that is different from the first direction and the second direction.
Figure 4B:
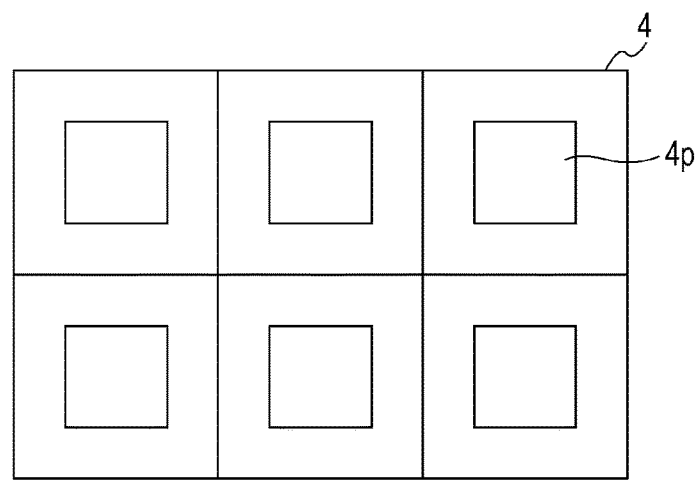
FIG. 4B is a schematic plan view of the arrangement of six photodiodes of interest.
Figure 4C:
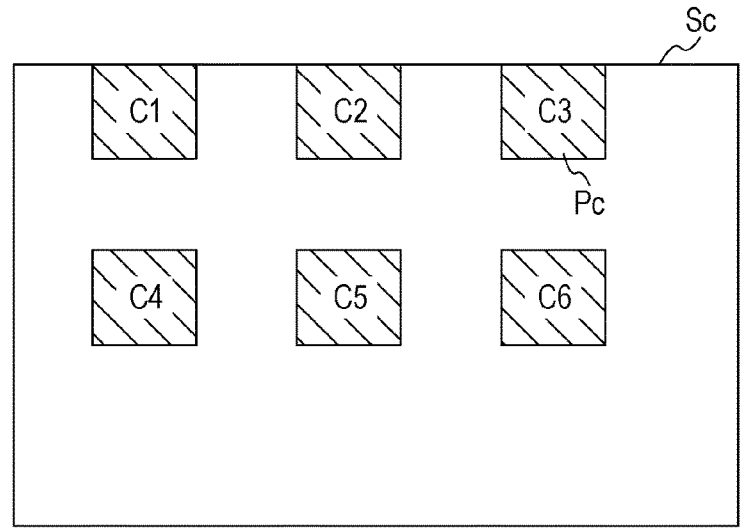
FIG. 4C is a schematic illustration of six pixels obtained from the six photodiodes.

FIG. 4A illustrates a ray of light incoming from a third direction that is different from each of the first direction illustrated in FIG. 2A and the second direction illustrated in FIG. 3A. The ray of light illustrated in FIG. 4A is inclined from the z direction in the y direction. FIG. 4B is a schematic illustration of the arrangement of six photodiodes 4p of interest. FIG. 4C is a schematic illustration of six pixels Pc obtained from the six photodiodes 4p of interest. An image Sc (a third sub-image Sc) is formed from the pixels Pc illustrated in FIG. 4C. As illustrated in FIG. 4C, the third sub-image Sc contains the information regarding areas C1, C2, C3, C4, C5, and C6 among all the areas of the object 2 illustrated in FIG. 1A. In this example, as illustrated in FIG. 1A, the area C1 is an area adjacent to the top edge of the area A1.

Figure 5A:
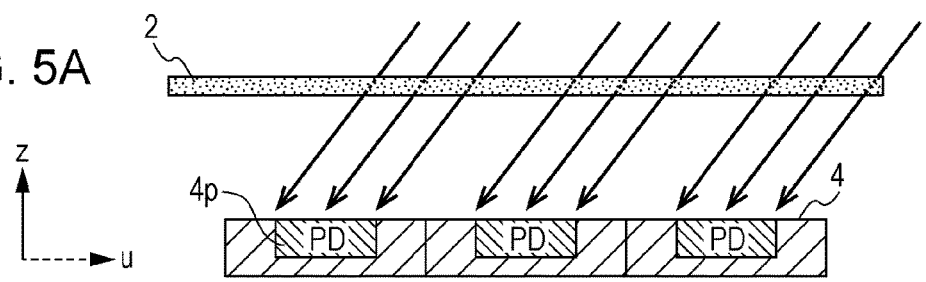
FIG. 5A is a cross-sectional view schematically illustrating a ray of light incoming from a fourth direction that is different from any one of the first direction, the second direction, and the third direction.
Figure 5B:
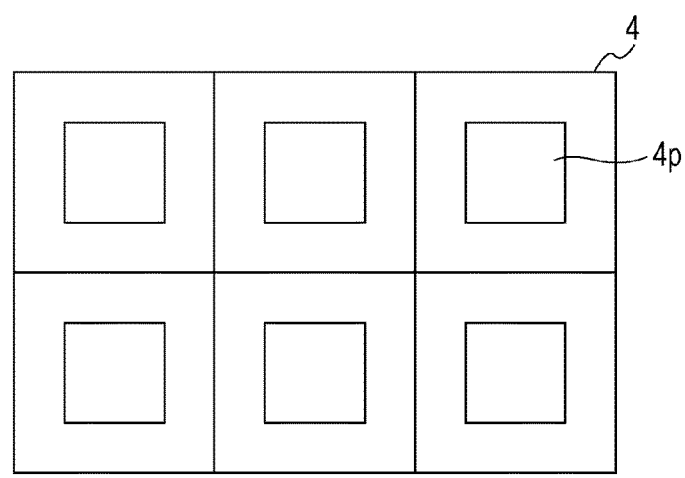
FIG. 5B is a plan view schematically illustrating the arrangement of six photodiodes of interest.
Figure 5C:
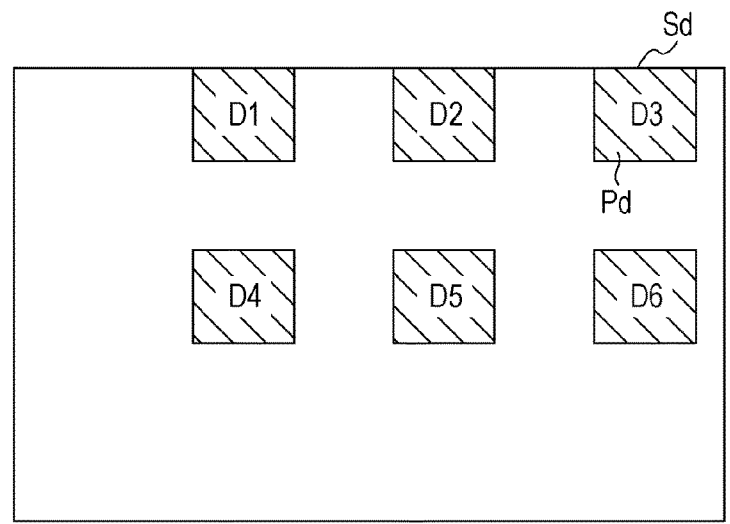
FIG. 5C is a schematic illustration of six pixels obtained from the six photodiodes.

FIG. 5A illustrates a ray of light incoming from a fourth direction that is different from any one of the first direction illustrated in FIG. 2A, the second direction illustrated in FIG. 3A, and the third direction illustrated in FIG. 4A. A ray of light illustrated in FIG. 5A is inclined from the z direction in a direction that forms an angle of 45° with the x-axis in the xy plane. FIG. 5B is a schematic illustration of the arrangement of six photodiodes 4p of interest. FIG. 5C is a schematic illustration of six pixels Pd obtained from the six photodiodes 4p of interest. An image Sd (a fourth sub-image Sd) is formed from the pixels Pd illustrated in FIG. 5C. Among the entire area of the object 2 illustrated in FIG. 1A, the fourth sub-image Sd contains the information regarding areas D1, D2, D3, D4, D5, and D6. In this example, as illustrated in FIG. 1A, the area D1 is an area located immediately to the right of the area C1.

Figure 6:
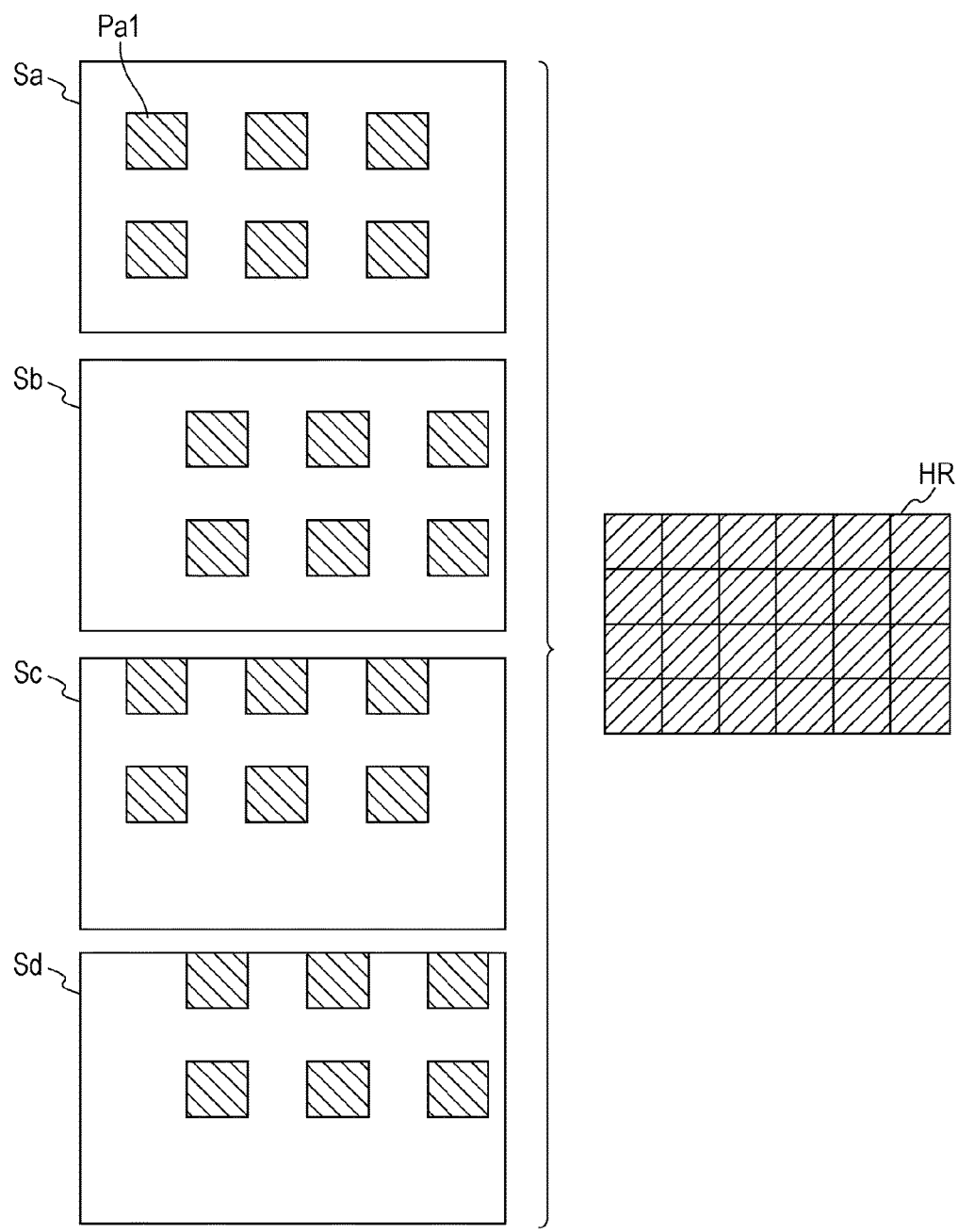
FIG. 6 illustrates a high-resolution image obtained by combining four sub-images.

FIG. 6 illustrates a high-resolution image HR obtained by combining the four sub-images Sa, Sb, Sc, and Sd. As illustrated in FIG. 6, the number of pixels or the pixel density of the high-resolution image HR is four times the number of pixels or the pixel density of each of the sub-images Sa, Sb, Sc, and Sd.

A block formed from, for example, the areas A1, B1, C1, and D1 of the object 2 illustrated in FIG. 1A is discussed below. As can be seen from the above description, a pixel Pa1 of the first sub-image Sa illustrated in FIG. 6 contains the information regarding the area A1 rather than the information regarding the entire block. Accordingly, the sub-image Sa is an image that lacks the information regarding the areas B1, C1, and D1. The resolution of each of the sub-images is the same as the intrinsic resolution of the image sensor 4.

At that time, by using the sub-images Sb, Sc, and Sd having pieces of pixel information corresponding to different positions in the object 2, the missing information of the sub-image Sa can be reconstructed, as illustrated in FIG. 6. Thus, the high-resolution image HR having the information regarding the entire block can be formed. In this example, a resolution that is four times the intrinsic resolution of the image sensor 4 is provided. In general, the level of increased resolution (the level of super-resolution) depends on the aperture ratio of an image sensor. In this example, the aperture ratio of the image sensor 4 is 25%. Accordingly, by delivering light from four different directions, the resolution can be increased to up to four times. Let N be an integer that is greater than or equal to 2. Then, if the aperture ratio of the image sensor 4 is approximately equal to 1/N, the resolution can be increased to up to N times.

By sequentially emitting parallel light in different directions to the object in this manner, the pixel information "spatially" sampled from the object can be increased. By combining a plurality of obtained sub-images, a high-resolution image having a resolution that is higher than that of each of the sub-images can be formed. Note that in the above-described example, the sub-images Sa, Sb, Sc, and Sd illustrated in FIG. 6 have pieces of pixel information regarding different areas of the object 2 which are not overlapped. However, the different sub-images may have overlapped information.

Figure 7:
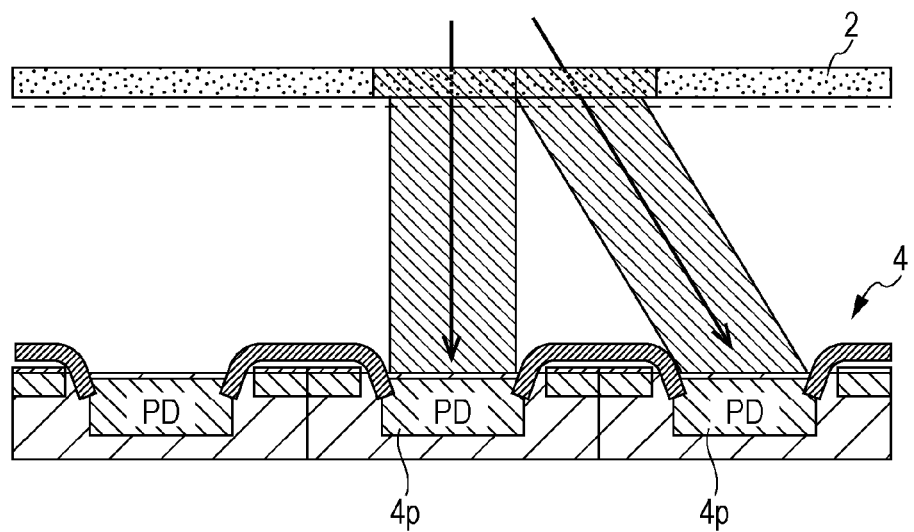
FIG. 7 is a cross-sectional view schematically illustrating the direction of the incoming ray of light controlled so that two rays of light that have passed through two neighboring areas of the object are delivered to different photodiodes.

In the above-described example, the rays of light that have passed through two areas of the object 2 that are adjacent to each other are incident on the same photodiode. However, the setting of the direction of the incoming ray of light is not limited to the above-described setting. For example, as illustrated in FIG. 7, the setting may be made so that two rays of light that have passed through two areas of the object 2 that are adjacent to each other are incident on different photodiodes. If a relative positional relationship between the area of an object which a ray of light passes through and a photodiode on which the ray of light is incident is known, a high-resolution image can be formed. Note that the direction of the incoming ray of light is not limited to each of the first to fourth directions described above with reference to FIGS. 2A, 3A, 4A, and 5A.

The configuration of a module according to the exemplary embodiment of the present disclosure is described below. According to the present exemplary embodiment of the present disclosure, a module having a configuration in which an object and an image sensor are integrated with each other is used.

Figure 8A:
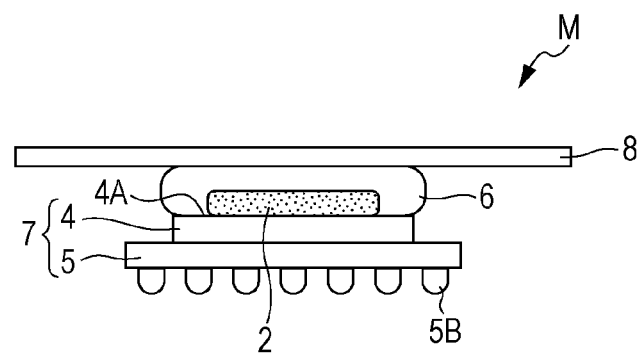
FIG. 8A is a schematic illustration of an example of a cross-section structure of a module.

FIG. 8A is a schematic illustration of an example of a cross-section structure of a module. A module M illustrated in FIG. 8A has the object 2 disposed on an imaging surface 4A of the image sensor 4. In the configuration illustrated in FIG. 8A as an example, the object 2 covered by an encapsulating medium 6 is sandwiched by the image sensor 4 and a transparent plate 8 (typically, a glass plate). For example, a widely used glass slide can be used as the transparent plate 8. Note that in the reference drawing, the elements are schematically illustrated, and the actual size and shape of each of the elements are not always the same as those in the drawings. This applies to subsequent reference drawings.

Figure 8B:
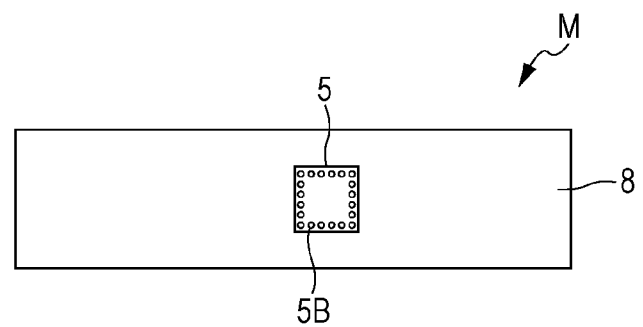
FIG. 8B is a plan view illustrating an example of an external view of the module illustrated in FIG. 8A as viewed from the side on which the image sensor is located.

In the example of the configuration illustrated in FIG. 8A, the image sensor 4 is secured to a package 5. FIG. 8B is an example of an external view of the module M illustrated in FIG. 8A as viewed from the side on which the image sensor 4 is located. As illustrated in FIG. 8B, the package 5 is typically a rectangle (or a square) in shape. As illustrated in FIGS. 8A and 8B, the package 5 has a backside electrode 5B on the side remote from the transparent plate 8. The backside electrode 5B is electrically connected to the image sensor 4 via a wiring pattern (not illustrated) formed in the package 5. That is, the output of the image sensor 4 can be retrieved via the backside electrode 5B. As used herein, the structure including a package and an image sensor integrated with each other is referred to as an "imaging device".

The object 2 can be a slice of a biological tissue having a thickness of typically several tens micrometers or less. A module having a slice of a biological tissue as the object 2 can be used for pathological diagnosis. As illustrated in FIG. 8A, unlike a prepared slide that supports an object (typically a slice of a biological tissue) for visual observation with an optical microscope, the module M includes an image sensor that obtains the image of the object. Such a module is also referred to as an "electronic prepared slide". As illustrated in FIG. 8A, by using the module M having a structure in which the object 2 and the imaging device 7 are integrated with each other, the positional relationship between the object 2 and the image sensor 4 can be advantageously kept unchanged.

An example of a method for producing a module having the structure illustrated in FIGS. 8A and 8B is described below with reference to FIG. 9. In this example, a slice of a biological tissue (a tissue slice) serves as the object 2.

Figure 9:
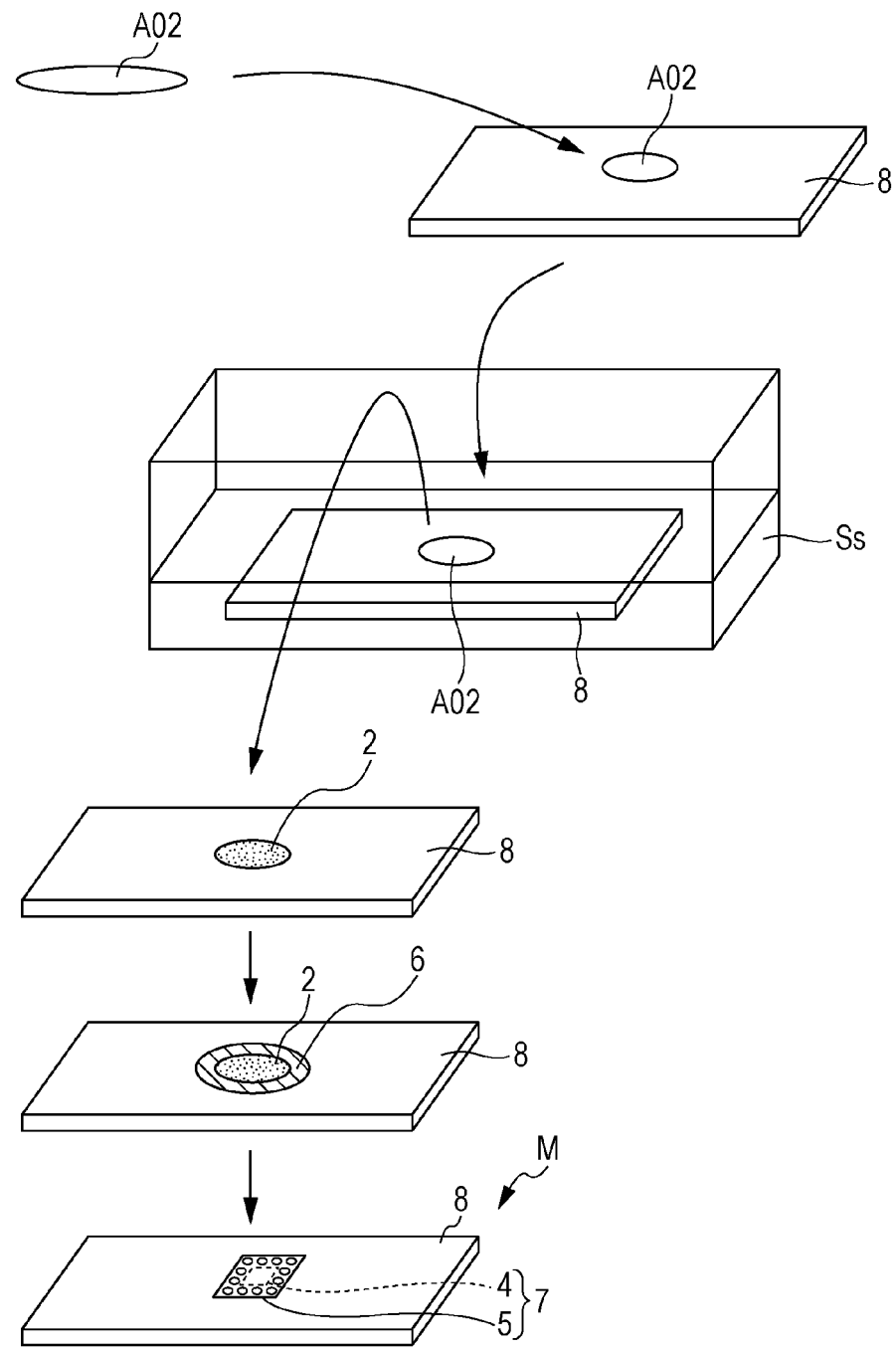
FIG. 9 illustrates an example of a method for producing the module.

As illustrated in FIG. 9, a tissue slice A02 is placed on the transparent plate 8 first. A glass slide for observation with an optical microscope can be used as the transparent plate 8. Hereinafter, description is made using a glass slide as the transparent plate 8. Typically, the glass slide is 1 mm in thickness. The length of the glass plate in the long side direction is 76 mm, and the length in the short side direction is 26 mm. Subsequently, to stain the tissue slice A02, the tissue slice A02 is dipped in staining fluid Ss together with the transparent plate 8. Subsequently, by applying the encapsulating medium 6 onto the transparent plate 8, the object 2, which is the stained tissue slice A02, is covered by the encapsulating medium 6. The encapsulating medium 6 is used to protect the object 2. Subsequently, the imaging device 7 is placed on the object 2 so that the imaging surface of the image sensor 4 faces the object 2. In this manner, the module M is achieved. The module M is produced for each of image capturing operations. For example, if ten tissue slices are observed, ten modules M are produced.

Figure 10A:
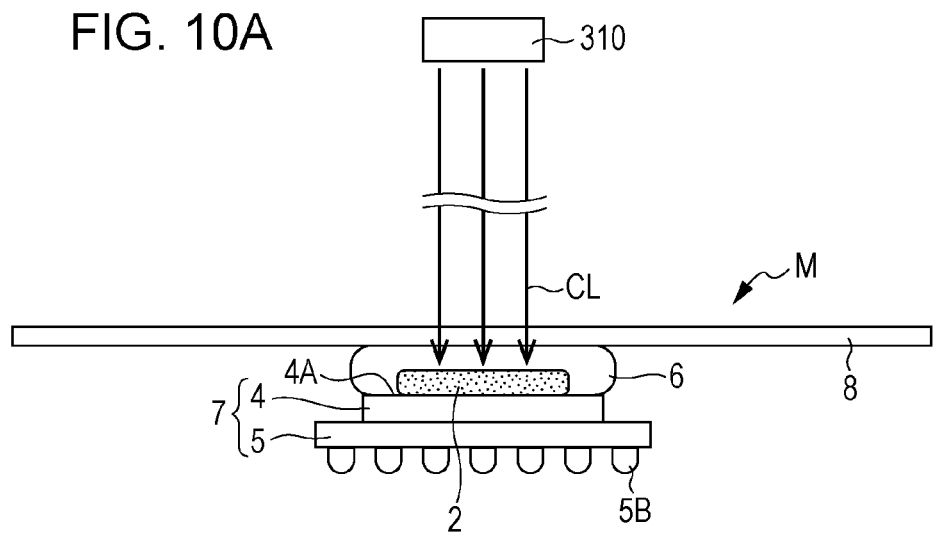
FIG. 10A is a cross-sectional view illustrating an example of an illumination angle set when a sub-image is captured.
Figure 10B:
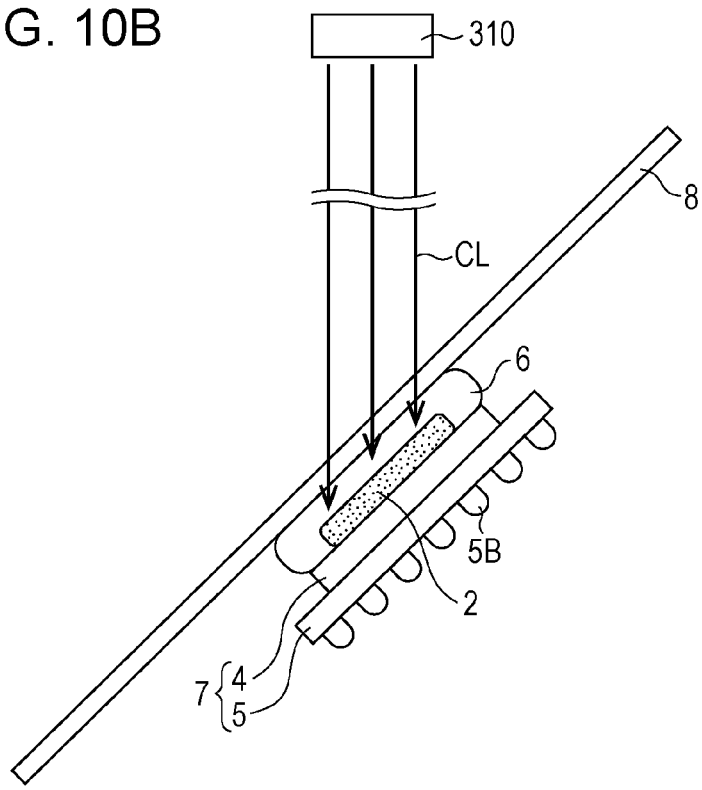
FIG. 10B is a cross-sectional view illustrating an example of a method for illuminating an object at an illumination angle that differs from the illumination angle illustrated in FIG. 10A.

To obtain the image of the object 2 using the module M, illumination light is delivered to the object 2 via the transparent plate 8. The illumination light that passes through the object 2 reaches the image sensor 4. In this manner, the image of the object 2 can be obtained. By sequentially changing a relative positional relationship between a light source and the object and capturing the image, a plurality of images captured at different illumination angles can be acquired. For example, as illustrated in FIG. 10A, a light source 310 is disposed immediately above the image sensor 4. Thereafter, by emitting collimated light CL to the object 2 in a direction normal to the imaging surface 4A of the image sensor 4 and capturing an image, a sub-image that is similar to the sub-image Sa illustrated in FIG. 2C can be obtained. In addition, as illustrated in FIG. 10B, by emitting collimated light CL to the object 2 with the module M inclined and capturing an image, a sub-image that is similar to the sub-image Sb illustrated in FIG. 3C (or the sub-image Sc illustrated in FIG. 4C) can be obtained. In this manner, by sequentially changing the orientation of the module M with respect to the light source and capturing an image, a high-resolution image based on the principle described above with reference to FIGS. 1A to 6 can be obtained.

Figure 11:
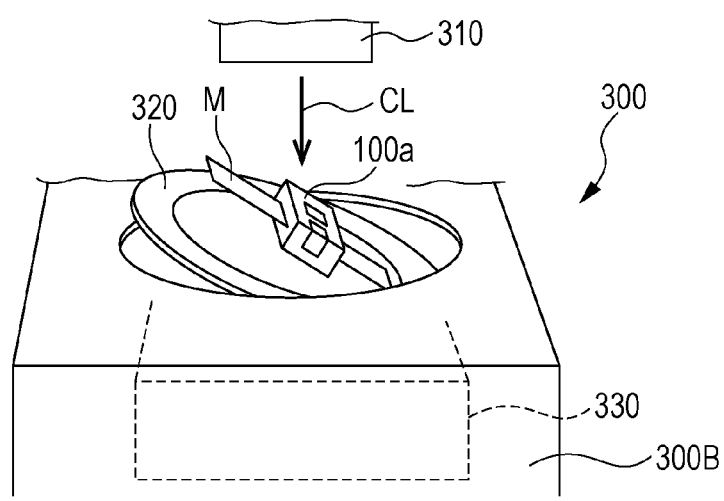
FIG. 11 illustrates an example of an image capturing operation using an image acquiring apparatus.

According to the exemplary embodiment of the present disclosure, the image of an object is captured using an image acquiring apparatus (a digitizer) including a light source and a movable stage. FIG. 11 illustrates an example of an image capturing operation using an image acquiring apparatus. In the example illustrated in FIG. 11, a socket 100a is attached to a stage 320 of an image acquiring apparatus 300. The socket 100a supports the module M. The socket 100a is an example of a socket used in the image acquiring apparatus 300. The structure of the socket 100a is described in more detail below. The illumination light emitted from the light source 310 is delivered to the module M supported by the socket 100a. Typically, the light emitted from the light source 310 is collimated light. Note that if the light incident on an object is substantially parallel light, the light emitted from the light source 310 need not be collimated. As described in detail below, according to the exemplary embodiment of the present disclosure, the image acquiring apparatus receives the output of the image sensor via the socket.

Figure 12:
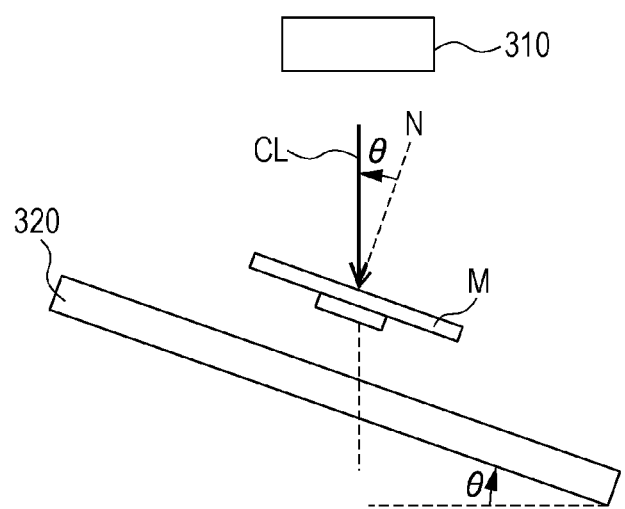
FIG. 12 is a schematic illustration of a change in the direction of a ray of light delivered to the object when a stage is tilted at an angle of θ relative to a reference plane.

The stage 320 of the image acquiring apparatus 300 is connected to a stage drive mechanism 330 that changes the orientation of the stage 320. The stage drive mechanism 330 includes, but not limited to, a GONIO mechanism and a rotation mechanism. The stage drive mechanism 330 changes the inclination of the stage 320 from a body 300B of the image acquiring apparatus 300 and/or the rotation angle of the stage 320 about an axis that passes through the central point of the stage 320. In the example of the structure illustrated in FIG. 11, the stage 320 has a disc shape. In the illustrated example, the module M is supported by the socket 100a attached to the stage 320. Accordingly, the orientation of the module M changes as the orientation of the stage 320 changes. Thus, by changing the orientation of the stage 320, the direction of the incoming ray of light onto the object can be changed. For example, when the stage 320 is not inclined relative to a reference plane, let the incoming direction of the illumination light be the normal direction of the imaging surface of the image sensor. Then, as illustrated in FIG. 12, the stage 320 is inclined relative to the reference plane (typically, a horizontal plane) at an angle of θ. At that time, if a relationship between the inclination of the stage 320 relative to the reference plane and the inclination of the module M relative to the reference plane (i.e., the inclination of the transparent plate 8) (e.g., a parallel relationship) is kept unchanged before and after a change in the orientation of the stage 320, the direction of the incoming ray of light onto the object is also inclined at an angle of θ. Note that in FIG. 12, a dashed line N represents the normal line of the imaging surface of the image sensor.

As described above, by changing the orientation of the module M together with the stage 320 of the image acquiring apparatus 300, the illumination light can be sequentially delivered to the object in different directions toward the object. Each of the directions of the incoming ray of light toward the object is expressed by, for example, a pair consisting of an angle formed by the normal line of the imaging surface of the image sensor (the zenith angle) and an angle formed by the reference azimuth set on the imaging surface and the projection of the incoming ray of light onto the imaging surface (the azimuth angle).

Hereinafter, the outline of the exemplary embodiment of the present disclosure is described first. Thereafter, the exemplary embodiment of the present disclosure is described in detail.

According to an aspect of the present disclosure, a socket includes a first base member that includes a module mount unit allowing a module including an imaging device and an object to be placed thereon and an electric connection portion electrically connecting the imaging device to an external apparatus, a second base member that has an opening, and an engagement unit that causes the first base member to be engaged with the second base member under a condition that the module placed on the module mount unit is sandwiched by the first base member and the second base member. When the engagement unit causes the first base member to be engaged with the second base member under a condition that the module placed on the module mount unit is sandwiched by the first base member and the second base member, the electric connection portion is electrically connected to the imaging device, and the object receives illumination light emitted from a light source and passed through the opening.

Each of the first base member and the second base member may have an area formed of one of polyetherimide and polycarbonate, and the area may be in contact with the module.

The electric connection portion may include a plurality of bottom surface electrodes on a surface opposite a surface of the first base member having the module mount unit disposed thereon.

The module mount unit may have a concave portion formed therein, and the concave portion may allow the imaging device to be placed therein.

The module mount unit may have a marker formed thereon, and the marker may indicate a direction in which the module is mounted.

The module mount unit may be removable from the first base member.

An area of the opening formed in a first surface of the second base member may be smaller than an area of the opening formed in a second surface of the second base member opposite to the first surface. When the engagement unit causes the first base member to be engaged with the second base member under a condition that the module placed on the module mount unit is sandwiched by the first base member and the second base member, a distance between the first surface and the module may be less than a distance between the second surface and the module.

The module may further include a transparent plate, and the object may be located between the imaging device and the transparent plate.

The module mount unit may have a flat portion that is in contact with the transparent plate when the engagement unit causes the first base member to be engaged with the second base member under a condition that the module placed on the module mount unit is sandwiched by the first base member and the second base member.

The socket may further include a first pressing portion and a second pressing portion formed on the second base member. When the engagement unit causes the first base member to be engaged with the second base member under a condition that the module placed on the module mount unit is sandwiched by the first base member and the second base member, the first pressing portion may press a first surface of the transparent plate and the second pressing portion may press a surface opposite to the first surface. A pressing force of the second pressing portion may be greater than a pressing force of the first pressing portion.

The pressing force of the first pressing portion and the pressing force of the second pressing portion may be determined so that a distance between the transparent plate and the imaging device is not greater than a predetermined distance.

According to another aspect of the present disclosure, an adaptor includes a support plate having a supporting surface that allows a module including an imaging device and an object to be placed thereon and a presser that pinches the module and the support plate under a condition that the module is placed on the support plate.

The adaptor may be attached to a socket including a first base member that includes a module mount unit allowing the module to be placed thereon and a second base member having an opening. When an engagement unit causes the first base member to be engaged with the second base member under a condition that the module placed on the module mount unit is sandwiched by the first base member and the second base member, the presser may be accommodated in the opening.

According to still another aspect of the present disclosure, an assembly jig includes a bottom plate including a first holding portion that allows a support plate to be placed thereon, a wall portion that extends upward from the bottom plate in a direction perpendicular to the bottom plate, and a movable portion that has a rotation axis perpendicular to the wall portion and that is connected to the wall portion in a slidable manner in a direction perpendicular to the bottom plate, where the movable portion includes a second holding portion that allows a presser to be inserted thereinto. The assembly jig has a first state in which the bottom plate is parallel to the movable portion and a second state in which the movable portion is rotated about the rotation axis from the first state at an angle greater than or equal to 90° and less than or equal to 180°. In one of the first state and the second state, the movable portion is located so that the first holding portion is disposed on top of the second holding portion.

In the socket according to one of the aspects of the present disclosure, a module formed by integrating an imaging device with an object is removably connected to an image acquiring apparatus. The socket includes a first base member, a second base member, and an engagement unit. The first base member includes a module mount unit that allows the module to be placed thereon and an electric connection portion that electrically connects, to the image acquiring apparatus, the imaging device of the module placed on the module mount unit. The second base member faces the module when the module is placed on the module mount unit of the first base member. The second base member has an opening that allows a ray of light incoming to the object to pass therethrough. The engagement unit fixes the second base member to the first base member so that the module is held between the first base member and the second base member.

In one aspect, an area of each of the first base member and the second base member that is in contact with the module is formed of one of polyetherimide and polycarbonate.

In one aspect, the electric connection portion includes a plurality of bottom surface electrodes on the bottom surface of the first base member.

Each of the bottom surface electrodes may be a pin electrode.

In one aspect, the bottom surface of the first base member has a protruding portion formed therein. The bottom surface electrode may be disposed on a side surface of the protruding portion.

In one aspect, the bottom surface of the first base member has a plurality of leg portions formed thereon. The leg portions extend from the bottom surface, and the length of the leg portions is greater than the length of the bottom surface electrodes.

In one aspect, the module mount unit has a concave portion formed therein, and the concave portion allows the imaging device of the module to be placed therein. The concave portion may have a shape that conforms to the imaging device of the module.

In one aspect, the module mount unit has a marker formed thereon, and the marker indicates a direction in which the module is mounted.

In one aspect, the module mount unit is removable from the body of the first base member.

In one aspect, the shape of a side surface of the opening of the second base member is tapered. Thus, the opening space of the opening of the second base member may decrease toward the surface facing the module in the thickness direction of the second base member.

In one aspect, the module further includes a transparent plate, and the module has a layered structure in which the object and the transparent plate are stacked on the imaging surface of the imaging device in this order.

In one aspect, the module mount unit has a flat portion that is in contact with the transparent plate of the module.

In one aspect, the transparent plate is rectangular in shape as viewed from a direction perpendicular to the flat portion of the module mount unit when the module is held between the first base member and the second base member. In addition, the length of the transparent plate measured along a short side direction of the transparent plate is greater than the length of a short side of the transparent plate.

In one aspect, the socket further includes a first pressing portion that presses a principal surface of the transparent plate of the module adjacent to the first base member when the module is held between the first base member and the second base member. The second base member includes a second pressing portion that presses a principal surface of the transparent plate of the module adjacent to the second base member when the module is held between the first base member and the second base member. A pressing force of the second pressing portion may be greater than a pressing force of the first pressing portion.

In one aspect, the pressing force of the first pressing portion and the pressing force of the second pressing portion are determined so that a distance between the transparent plate and the imaging device is not greater than a predetermined distance.

In another aspect of the present disclosure, an adaptor for the module used for any one of the above-described sockets is provided. The adaptor includes a support plate and a presser. The support plate has a supporting surface that allows a module to be placed thereon and one of a via and an electrode that allows the imaging device of the module to be electrically connected to an electric connection portion of the socket. The presser is connected to the support plate to pinch the module together with the support plate. The presser has a counter surface that faces the supporting surface of the support plate when the presser is connected to the support plate. The presser fixes the module to the support plate so that the distance between the supporting surface and the counter surface is within a predetermined range.

In one aspect, the presser has an opening located above the imaging device when pinching the module together with the support plate. The shape of a side surface of the opening of the presser may be tapered. Thus, the opening space of the opening of the presser may decrease toward a surface facing the module in the thickness direction of the presser.

In one aspect, when the module is held between the first base member and the second base member, the presser is located inside the opening of the second base member.

In one aspect, an area of each of the support plate and the presser that is in contact with the module is formed of one of polyetherimide and polycarbonate.

In one aspect, the support plate has a concave portion formed therein, and the concave portion allows the imaging device of the module to be placed therein. The concave portion may have a shape that conforms to the imaging device of the module.

In one aspect, the support plate has a marker formed thereon, and the marker indicates a direction in which the module is mounted.

In one aspect, the support plate has a pressing portion formed on the supporting surface. The pressing portion has an elastic force exerted thereon in a direction away from the supporting surface.

In one aspect, the module further includes a transparent plate, and the module has a layered structure in which the object and the transparent plate are stacked on the imaging surface of the imaging device in this order.

In one aspect, the support plate has a flat portion that is in contact with the transparent plate of the module.

In one aspect, the transparent plate is rectangular in shape as viewed from a direction perpendicular to the flat portion of the support plate when the module is held between the first base member and the second base member. In addition, the length of the transparent plate measured along a short side direction of the transparent plate is greater than the length of a short side of the transparent plate.

In still another aspect of the present disclosure, an object unit includes any one of the above-described sockets and a laminate body held between the first base member and the second base member of the socket so that the transparent plate faces the second base member of the socket. The laminate body includes an imaging device, an object, and the transparent plate, and the object and the transparent plate are stacked on the imaging surface of the imaging device in this order.

In yet still another aspect of the present disclosure, an object unit includes any one of the above-described adaptors and a laminate body fixed between a support plate and a presser so that the transparent plate faces the presser. The laminate body includes an imaging device, an object, and the transparent plate, and the object and the transparent plate are stacked on the imaging surface of the imaging device in this order.

In yet still another aspect of the present disclosure, an image forming system includes any one of the above-described object units, an image acquiring apparatus, and an image processing apparatus. The image acquiring apparatus includes a stage that allows the object unit to be removably connected thereto, a stage drive mechanism that changes the orientation of the stage, and a light source. The image acquiring apparatus sequentially delivers illumination light emitted from the light source to an object in different directions of the incoming ray of light toward the object. The image processing apparatus combines a plurality of images captured by changing the direction of the incoming ray of illumination light and forms a high-resolution image of the object having a resolution that is higher than that of each of the captured images.

In yet still another aspect of the present disclosure, an assembly jig used for assembling any one of the above-described adaptors is provided. The assembly jig includes a bottom plate including a first holding portion that allows a support plate to be placed thereon, a wall portion that extends upward from the bottom plate in a direction perpendicular to the bottom plate, and a movable portion that has a rotation axis perpendicular to the wall portion and that is connected to the wall portion in a slidable manner in a direction perpendicular to the bottom plate, where the movable portion includes a second holding portion that allows a presser to be inserted thereinto. The assembly jig has a first state in which the bottom plate is parallel to the movable portion and a second state in which the movable portion is rotated about the rotation axis from the first state at an angle greater than or equal to 90° and less than or equal to 180°. In one of the first state and the second state, the movable portion is located so that the first holding portion is disposed on top of the second holding portion.

In yet still another aspect of the present disclosure, a module held by any one of the above-described socket is provided. The module includes an imaging device, an object, and a transparent plate. In addition, the object and the transparent plate are stacked on the imaging surface of the imaging device in this order.

In one aspect, the imaging device has a marker formed thereon. The marker indicates a direction in which the module is mounted on the module mount unit.

In yet still another aspect of the present disclosure, a module fixed to any one of the above-described adaptors is provided. The module includes an imaging device, an object, and a transparent plate. In addition, the object and the transparent plate are stacked on the imaging surface of the imaging device in this order.

In one aspect, the imaging device has a marker formed thereon. The marker indicates a direction in which the module is mounted on the support plate.

Exemplary embodiments of the present disclosure are described in detail below with reference to the accompanying drawings. Note that the shapes of the elements illustrated in the drawings are only examples and can be modified in various ways.

Socket and Object Unit

Figure 13A:
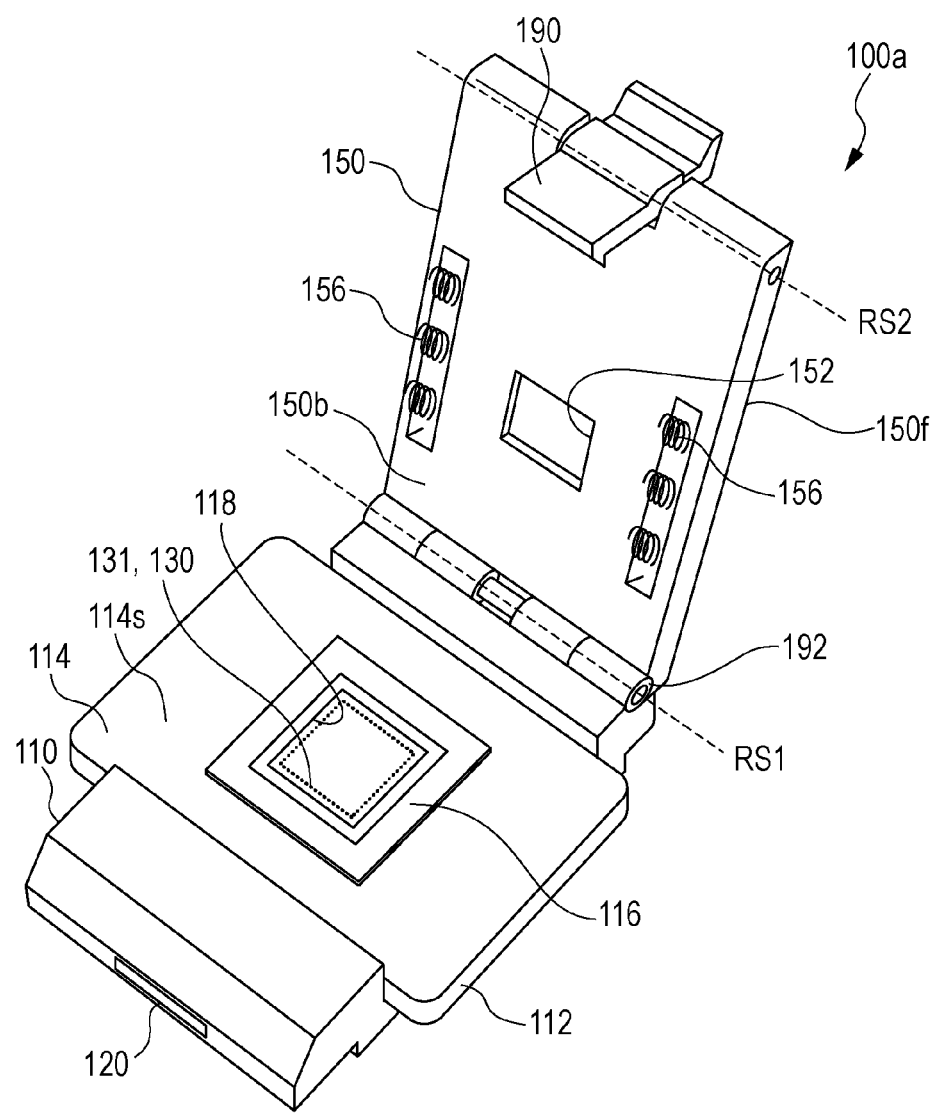
FIG. 13A is a perspective view of an example of a socket according to an exemplary embodiment of the present disclosure.
Figure 13B:
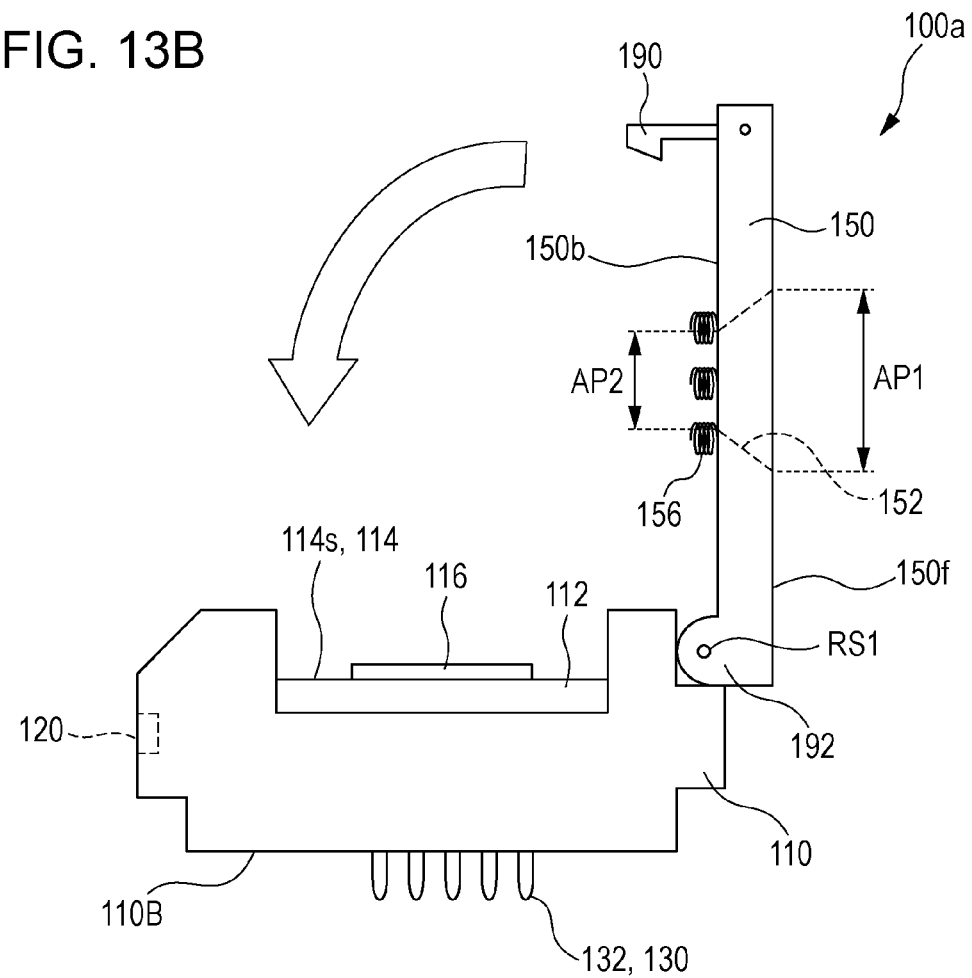
FIG. 13B is a side view of the socket illustrated in FIG. 13A.

FIG. 13A illustrates an example of a socket 100a according to the exemplary embodiment of the present disclosure. FIG. 13B is a side view of the socket 100a illustrated in FIG. 13A. As schematically illustrated in FIG. 13A, the socket 100a includes a first base member 110 having a module mount unit 112 that allows a module to be mounted thereon, a second base member 150 configured to be connectable to the first base member 110, and an engagement unit that allows the second base member 150 to be engaged with the first base member 110.

In the example of the configuration illustrated in FIG. 13A, the module mount unit 112 includes a flat portion 114 and a protruding portion 116. As described below, in the configuration, the protruding portion 116 has an elastic force exerted thereon in a direction in which the protruding portion 116 protrudes from the top surface 114s of the flat portion 114. As used herein, the term "top surface" is referred to as a particular surface of a structure. That is, the "top surface" does not limit the orientation of the structure. This also applies to the terms "front surface", "back surface", and "bottom surface" used in the following description. In the example illustrated in FIGS. 13A and 13B, the protruding portion 116 has a concave portion 118 formed therein. As described in more detail below, the module is placed on the module mount unit 112 so that the imaging device is located inside the concave portion 118.

The first base member 110 includes an electric connection portion 130. The electric connection portion 130 electrically connects the imaging device of the module placed on the module mount unit 112 to the image acquiring apparatus. According to the exemplary embodiment of the present disclosure, the image acquiring apparatus receives the output of the image sensor via the electric connection portion 130 of the first base member 110. A technique for electrically connecting the electric connection portion 130 of the first base member 110 to the module is described below. Holes 131 that constitute the electric connection portion 130 are formed in the inner surface of the concave portion 118. In addition, a bottom surface electrodes 132 that constitute the electric connection portion 130 are disposed on a bottom surface 110B of the first base member 110. In the example of the configuration illustrated in FIG. 13B, the bottom surface electrodes 132 are pin electrodes.

In the example of the configuration illustrated in FIG. 13A, the second base member 150 has an opening 152 formed therein. The opening 152 allows a front surface 150f to communicate with a back surface 150b of the second base member 150. The opening 152 is formed at such a position that when the second base member 150 faces the first base member 110, the opening 152 faces the concave portion 118 of the module mount unit 112. In addition, in the example of the configuration illustrated in FIG. 13A, pressing portions 156 are formed on the back surface 150b of the second base member 150 so as to protrude from the back surface 150b. In this example, each of the pressing portions 156 includes three springs, and an end portion of each of the spring protrudes from the back surface 150b. In the example illustrated in FIGS. 13A and 13B, two pressing portions 156 are disposed so that the opening 152 is located between the two pressing portions 156.

In the example illustrated in FIGS. 13A and 13B, a hook 190 serving as the engagement unit is connected to the second base member 150. In this example, the hook 190 is connected to the second base member 150 in a rotatable manner about a rotation axis RS2. In addition, in the example illustrated in FIGS. 13A and 13B, the second base member 150 is connected to the first base member 110 using a hinge 192 in a rotatable manner. By rotating the second base member 150 about a rotation axis RS1, the top end of the hook 190 is inserted into a hole 120 formed in the first base member 110 (refer to FIG. 13B). If the second base member 150 is rotated about the rotation axis RS1 to insert the top end of the hook 190 into the hole 120 with the module M placed on the module mount unit 112, the first base member 110 and the second base member 150 can be fixed to each other with the module M held between the first base member 110 and the second base member 150.

Figure 13C:
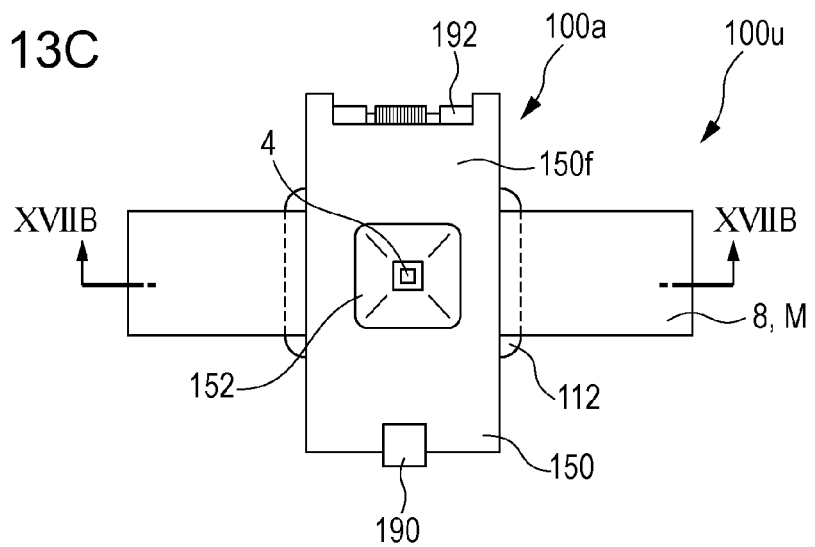
FIG. 13C is a top view of the socket with the module sandwiched between a first base member and a second base member.

FIG. 13C is a top view of the socket 100a when the module M is held between the first base member 110 and the second base member 150. In the following description, a structure in which a module is integrated with a socket by sandwiching the module M between the first base member 110 and the second base member 150 is also referred to as a "object unit". For example, by preparing a plurality of object units 100u equal in number to the number of objects, the target of an image capturing operation can be switched by replacing the socket 100a including the module M set in the image acquiring apparatus 300. The module M may be replaced by a new one with the socket 100a fixed to the stage 320 of the image acquiring apparatus 300.

As described above with reference to FIG. 9, to observe the tissue slice A02, producing the module M typically requires the encapsulating medium 6. In general, to dry the encapsulating medium 6, a long time (60 minutes or longer) is required. Until the encapsulating medium 6 is completely dried, the distance between the transparent plate 8 and the imaging surface of the imaging device 7 easily varies.

According to the exemplary embodiment of the present disclosure, the module M having the encapsulating medium 6 that is undried can be sandwiched between the first base member 110 and the second base member 150. Accordingly, the encapsulating medium 6 can be dried with the module M sandwiched between the first base member 110 and the second base member 150. That is, the distance between the transparent plate 8 and the imaging surface of the imaging device 7 can be kept unchanged, and the encapsulating medium 6 can be dried. Thus, a variation of the distance between the transparent plate 8 and the imaging surface of the imaging device 7 can be reduced. In addition, since the module M is held between the first base member 110 and the second base member 150, the module M can be placed on, for example, a desk in the form of an object unit 100u even when the encapsulating medium 6 is undried. As a result, handling of the module M can be facilitated.

In addition, since the distance between the transparent plate 8 and the imaging surface of the imaging device 7 is kept unchanged, a variation of the distance between the transparent plate 8 and the imaging surface of the imaging device 7 can be reduced even when the object unit 100u is inclined. Thus, according to the exemplary embodiment of the present disclosure, even when the encapsulating medium 6 is undried, an image can be captured.

By fixing the second base member 150 to the first base member 110 with the module M sandwiched between the first base member 110 and the second base member 150, movement of the module M between the first base member 110 and the second base member 150 is prevented. Thus, the module M can be reliably held. In particular, when the encapsulating medium 6 (refer to FIG. 9) is used to produce the module M and if the encapsulating medium 6 that is undried is deposited to the module M, the module M easily slides (moves) between the first base member 110 and the second base member 150. If the module M moves before and after a variation of the orientation of the module M, the image of a desired area cannot be captured and, therefore, the high-resolution image may not be obtained. According to the exemplary embodiment of the present disclosure, the occurrence of such a disadvantage can be prevented.

The first base member 110 and the second base member 150 can be formed of, for example, a resin material. Note that in some cases, an encapsulating medium that contains xylene is used as the encapsulating medium 6 (refer to FIG. 9). If such an encapsulating medium is used, a problem, such as a change of color and/or dissolution, may arise due to deposition of the encapsulating medium, although depending on the material of the socket. In such a case, if at least an area of the first base member 110 and the second base member 150 that is in contact with the module M is formed of polyetherimide (e.g., ULTEM™), the problem can be solved. Note that according to an experiment conducted by the present inventor, if the first base member 110 and the second base member 150 formed of polycarbonate are used, the problem of a change of color and/or dissolved socket does not arise. Accordingly, polycarbonate can be used as the material of the first base member 110 and the second base member 150. If polyetherimide or polycarbonate is used as the material of the first base member 110 and the second base member 150, heat resistance that is required by the second base member 150 disposed on a connection side with the image acquiring apparatus 300 can be ensured. Thus, use of polyetherimide or polycarbonate is desirable. The area that is in contact with the module M may be the module mount unit 112 including the flat portion 114 and the protruding portion 116 and the back surface 150b.

In the object unit 100u illustrated in FIG. 13C, the second base member 150 faces the module M. At that time, the opening 152 is located on the image sensor 4 of the module M. In addition, as described above with reference to FIG. 8A, in the module M, the object 2 and the transparent plate 8 are stacked in this order on the imaging surface 4A of the imaging device 7. Accordingly, the illumination light can be delivered to the object via the opening 152 and the transparent plate 8 of the module M.

In the example illustrated in FIG. 13C, the side surface of the opening 152 is tapered. Thus, the opening space of the opening 152 reduces toward the back surface 150$b$ of the second base member 150 in the thickness direction of the second base member 150. That is, in the example illustrated in FIG. 13C, an opening space AP1 in the front surface 150$f$ of the second base member 150 is larger than an opening space AP2 in the back surface 150$b$ (refer to FIG. 13B). Accordingly, even when the orientation of the module M held by the socket 100$a$ is changed by tilting the stage 320 of the image acquiring apparatus 300, the illumination light can be reliably delivered to the object (refer to FIG. 11). Note that the shape of the side surface of the opening 152 is not limited to a tapered shape. For example, if the opening space is sufficiently large, the side surface of the opening 152 may be perpendicular to the front surface 150$f$ and the back surface 150$b$ of the second base member 150 (AP1=AP2). However, by tapering the side surface of the opening 152 and making the opening space AP2 in the back surface 150$b$ close to the area of the imaging surface of the image sensor 4, the illumination light incoming to a portion outside the imaging surface of the image sensor 4 can be blocked. In this manner, unlike the case in which the side surface of the opening 152 is perpendicular to the front surface 150$f$ and the back surface 150$b$ of the second base member 150, the occurrence of stray light can be prevented and, thus, degradation of the quality of the sub-image can be reduced. Note that the opening 152 is not limited to a through-hole. The opening 152 may be filled with a light transmissive material (e.g., a transparent resin).

Figure 14:
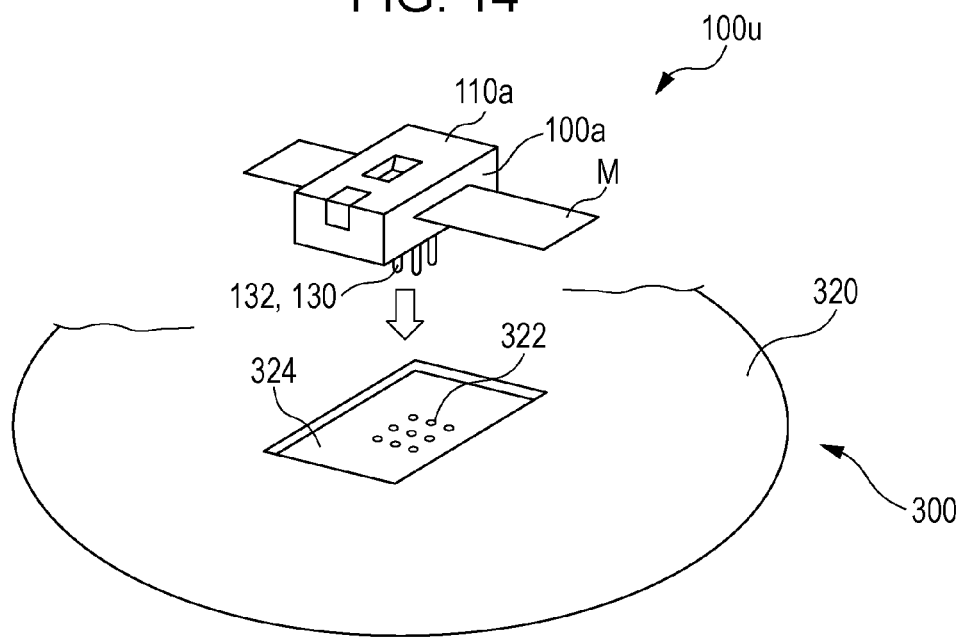
FIG. 14 illustrates a method for mounting an object unit on a stage of an image acquiring apparatus.

A method for mounting the object unit 100$u$ on the stage 320 of the image acquiring apparatus 300 is described below with reference to FIG. 14. As illustrated in FIG. 14, the object unit 100$u$ is mounted on a mount unit 324 provided in the stage 320 of the image acquiring apparatus 300. At that time, the object unit 100$u$ is mounted on the stage 320 so that the bottom surface electrodes 132 of the socket 100$a$ are inserted into jacks 322 provided in the mount unit 324. By inserting the bottom surface electrodes 132 into the jacks 322, the imaging device in the module M held by the socket 100$a$ is electrically connected to the image acquiring apparatus 300. Accordingly, the image acquiring apparatus 300 can acquire information representing the image of the object (an image signal or image data) via the object unit 100$u$.

In addition, by mounting the object unit 100$u$ on the mount unit 324 of the stage 320, the bottom surface 110B (not illustrated in FIG. 14) of the socket 100$a$ can be kept in tight contact with the top surface of the mount unit 324. Thus, the positional relationship between the socket 100$a$ and the stage 320 can be fixed, and the positional relationship between the socket 100$a$ and the stage 320 can be kept unchanged before and after a variation of the orientation of the stage 320. Typically, the flat portion 114 of the module mount unit 112 is made substantially parallel to the stage 320 (refer to FIG. 13B).

Figure 15:
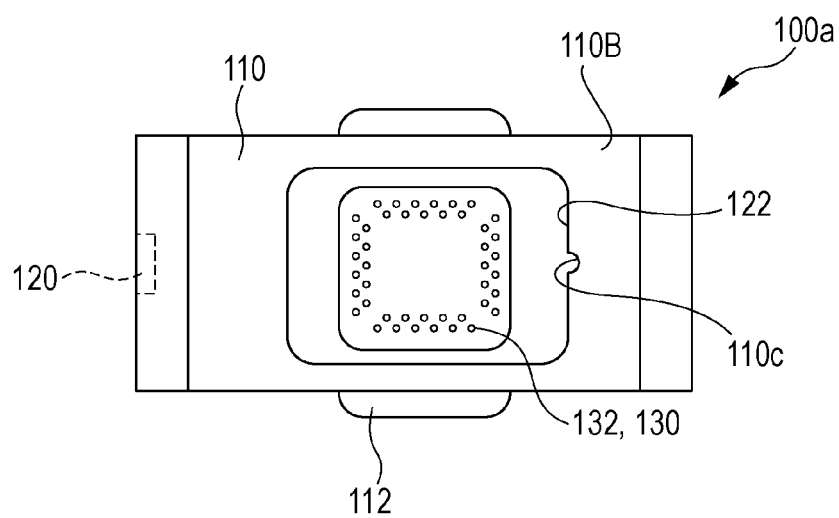
FIG. 15 is a bottom view of the socket illustrated in FIG. 13A.

FIG. 15 illustrates the bottom surface of the socket 100$a$ illustrated in FIG. 13A. In the example illustrated in FIG. 15, the bottom surface electrodes 132 are arranged inside a concave portion 122 formed in the bottom surface 110B of the first base member 110. Note that the size, the number, and the arrangement of the bottom surface electrodes 132 are only illustrative. In the example illustrated in FIG. 15, the bottom surface electrodes 132 are arranged along the four sides of a rectangle. However, the arrangement of the bottom surface electrodes 132 is not limited thereto. For example, the bottom surface electrodes 132 may be disposed along two sides that face each other among the four sides of the rectangle. Alternatively, for example, the bottom surface electrodes 132 may be arranged in an asymmetric manner. By arranging the bottom surface electrodes 132 in an asymmetric manner, a direction in which the socket 100$a$ is mounted on the stage 320 of the image acquiring apparatus 300 can be set to a predetermined direction. That is, only when the socket 100$a$ is oriented to a predetermined correct direction, the socket 100$a$ can be mounted. Alternatively, as illustrated in FIG. 15, a notch 110$c$ may be formed in the first base member 110, and a positioning pin may be provided on the mount unit 324 of the stage 320 (refer to FIG. 14) at a position corresponding to the notch 110$c$. In this manner, the direction in which the socket 100$a$ is mounted can be set to the predetermined direction.

Figure 16A:
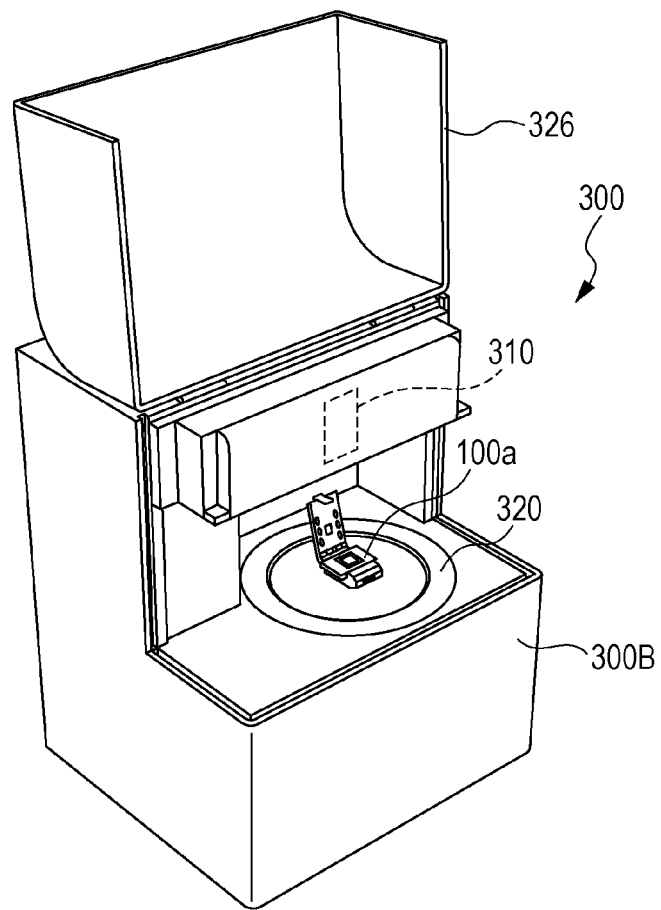
FIG. 16A is a perspective view of an exemplary external view of the image acquiring apparatus.

FIG. 16A is an exemplary external view of the image acquiring apparatus 300. In FIG. 16A, the socket 100$a$ is mounted on the stage 320. As described above with reference to FIG. 14, the stage 320 includes the mount unit 324, and the socket 100$a$ is releasably connected to the mount unit 324. As described above with reference to FIG. 11, the image acquiring apparatus 300 includes the stage drive mechanism 330 (not illustrated in FIG. 16A) and, thus, can change the orientation of the stage 320. If a module held by the socket 100$a$ is mounted on the stage 320, the orientation of the module can be changed together with the stage 320. Accordingly, the image acquiring apparatus 300 can deliver an illuminating ray of light to the object in a plurality of different directions by changing the orientation of the stage 320. Alternatively, the image acquiring apparatus 300 can deliver an illuminating ray of light to the object in a plurality of different directions by moving the light source 310 in the image acquiring apparatus 300 or sequentially turning on a plurality of the light sources. For example, by combining an operation to vary the orientation of the stage 320 with an operation to move the light source 310, the direction of the incoming ray of light may be changed.

Figure 16B:
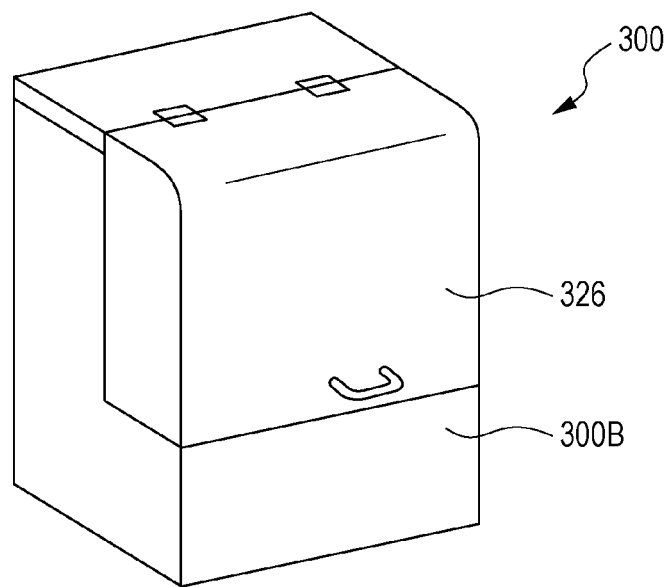
FIG. 16B is a perspective view of the image acquiring apparatus illustrated in FIG. 16A with a lid closed.

In the example of the configuration illustrated in FIG. 16A, the body 300B of the image acquiring apparatus 300 includes an openable lid 326. By closing the lid 326, a dark room can be formed inside the image acquiring apparatus 300 (refer to FIG. 16B).

An example of a technique for electrically connecting the electric connection portion 130 of the first base member 110 to the module M is described below with reference to FIGS. 17A and 17B.

Figure 17A:
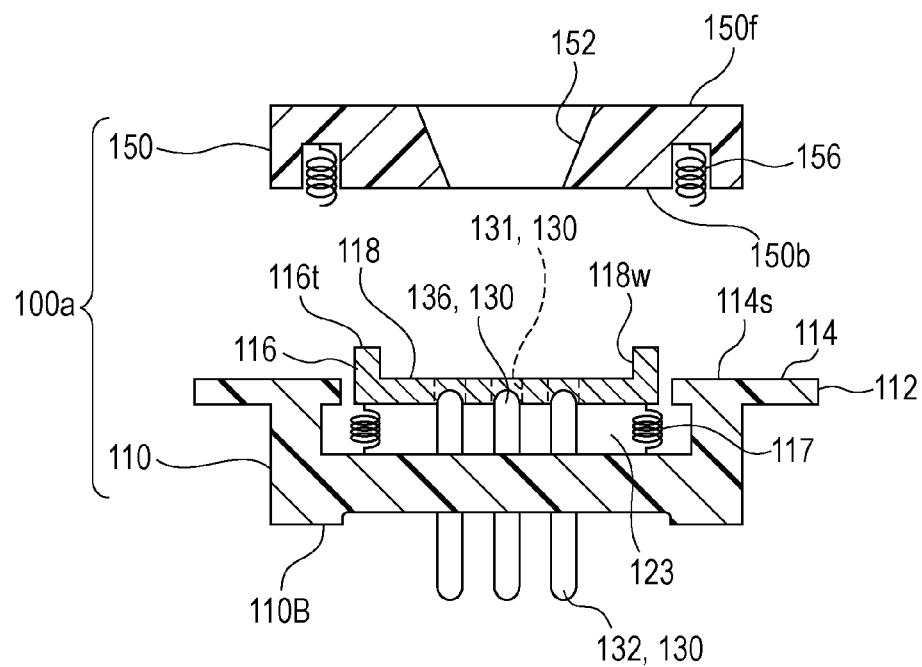
FIG. 17A is a schematic cross-sectional view of the socket.
Figure 17B:
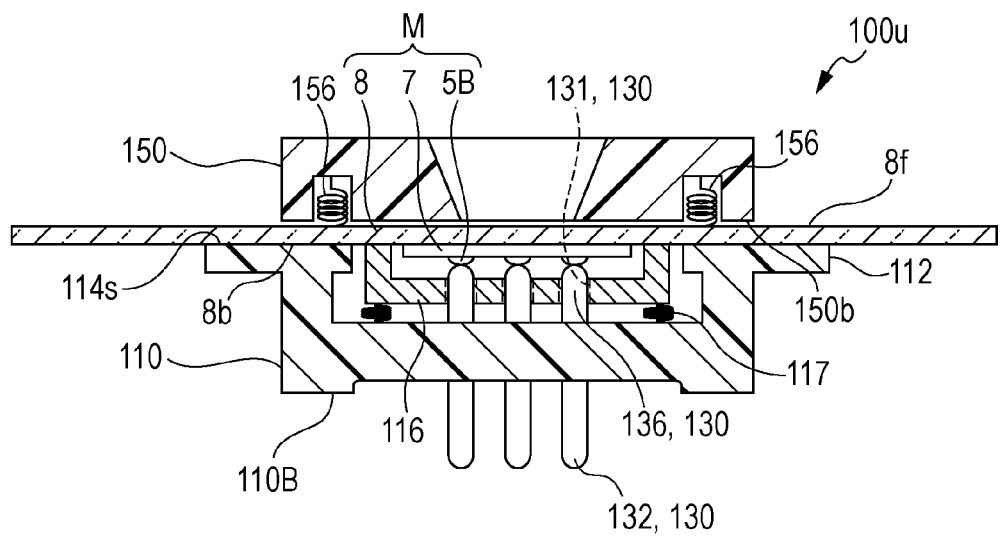
FIG. 17B is a cross-sectional view taken along a line XVIIB-XVIIB of FIG. 13C.

FIGS. 17A and 17B are schematic cross-sectional views of the socket 100$a$. FIGS. 17A and 17B are cross-sectional views taken along a line XVIIB-XVIIB of FIG. 13C. Note that FIG. 17A illustrates the first base member 110 and the second base member 150 separately disposed from each other when the module M is not held between the first base member 110 and the second base member 150.

In the example of the configuration illustrated in FIG. 17A, the protruding portion 116 of the module mount unit 112 is connected to an elastic member 117 disposed inside a cavity (a concave portion) 123 formed in the first base member 110. In this manner, an elastic force is exerted on the protruding portion 116 upward in FIG. 17A. In this example, a spring is used as the elastic member 117. However, the configuration of the elastic member 117 is not limited thereto. As illustrated in FIG. 17A, when the module M is not placed on the module mount unit 112, a top end portion 116$t$ of a protruding portion 116 protrudes upward from the top surface 114$s$ of the flat portion 114 in FIG. 17A.

In addition, in the example of the configuration illustrated in FIG. 17A, a top surface electrodes 136 are disposed inside the cavity 123 of the first base member 110. The top surface electrodes 136 constitute the electric connection portion 130. Each of the top surface electrodes 136 is disposed inside one of the holes 131 formed in the concave portion 118 of the protruding portion 116. The top surface electrode 136 is electrically connected to the bottom surface electrode 132. When the module M is not placed on the module mount unit 112, the top end portion of the top surface electrode 136 does not protrude from the front surface of the concave portion 118.

Referring to FIG. 17B, the module M is placed on the module mount unit 112 so that a principal surface 8b, which is one of the principal surfaces of the transparent plate 8 on the side on which the imaging device 7 is fixed, (hereinafter also referred to as a "back surface 8b of the transparent plate 8") faces the top surface 114s of the flat portion 114. Note that among the surfaces of the transparent plate 8, a surface that is in contact with a specimen and a surface opposite to the surface are referred to as "principal surfaces", and the other surfaces are referred to as "side surfaces". At that time, as illustrated in FIG. 17B, the imaging device 7 is disposed inside the concave portion 118 of the protruding portion 116. Typically, the concave portion 118 has a shape that conforms to the shape of the imaging device 7. For example, if the outer shape of a package of the imaging device 7 is a square, the shape of the concave portion 118 as viewed from the normal line direction of the flat portion 114 of the module mount unit 112 is typically a square. As used herein, the term "shape that conforms to the shape of the imaging device 7" refers to a shape that can contain the package of the imaging device 7 and that can determine the direction in which the module is mounted when the package is stored. An example of a shape that can determine the direction in which the module is mounted is a shape that, when the package of the imaging device 7 is in contact with the bottom surface of the concave portion 118, inhibits movement of the package in the same plane (e.g., rotational movement and translation) with the package in contact with the bottom surface. That is, a side surface of the package need not be parallel to a side wall 118w of the concave portion 118, and the side surface of the package need not be in tight contact with the side wall 118w of the concave portion 118. In addition, the shape of the concave portion 118 need not be similar to the outer shape of the package. A gap may be formed between a side surface of the package and the side wall 118w of the concave portion 118. The top end portion 116t of the protruding portion 116 (refer to FIG. 17A) is located outside the imaging device 7 so as to face the back surface 8b of the transparent plate.

As illustrated in FIG. 17B, when the second base member 150 is fixed to the first base member 110, a principal surface 8f of the transparent plate 8, which is one of the principal surfaces to which the imaging device 7 is not fixed, (hereinafter also referred to as a "front surface 8f of the transparent plate 8") is in contact with the pressing portion 156 of the second base member 150. Thus, the pressing portion 156 urges the transparent plate 8 downward in FIG. 17B, and the back surface 8b of the transparent plate 8 is urged against the flat portion 114. In addition, since the top end portion 116t of the protruding portion 116 is brought into contact with the back surface 8b of the transparent plate 8, the protruding portion 116 is urged downward in FIG. 17B. At that time, the top end of each of the top surface electrodes 136 protrudes from the surface of the concave portion 118 and is brought into contact with the backside electrode 5B of the imaging device 7. In this manner, the imaging device 7 of the module M is electrically connected to the electric connection portion 130 of the first base member 110.

As described above, by pressing the principal surface 8f of the transparent plate 8 from the side adjacent to the second base member 150, the back surface 8b of the transparent plate 8 can be reliably brought into contact with the flat portion 114. That is, a positional relationship between the transparent plate 8 and the first base member 110 can be fixed and, thus, a positional relationship between the socket 100a and the module M can be kept unchanged before and after the orientation of the socket 100a varies. That is, when the object unit 100u is mounted on the stage 320 and, thereafter, the orientation of the stage 320 is changed, the relationship between the inclination of the stage 320 relative to the reference plane and the inclination of the module M relative to the reference plane (e.g., a parallel relationship) can be kept unchanged. Accordingly, for example, by controlling the tilt angle of the stage 320 at a desired angle, a desired direction of the incoming ray of light can be set.

In addition, by pressing the principal surface 8f of the transparent plate 8 from the side adjacent to the second base member 150, movement of the transparent plate 8 on the module mount unit 112 and/or a variation of the distance between the transparent plate 8 and the imaging surface of the imaging device 7 can be prevented.

As described above, when the tissue slice A02 is selected as a target of observation, the encapsulating medium 6 is typically used. If the encapsulating medium 6 that is undried is deposited onto the module, the module may slide between the first base member 110 and the second base member 150 and, thus, the module may move. If the module slides before and after a change in the orientation of the module, the backside electrode 5B of the imaging device 7 may be separated from the top end of the top surface electrode 136 and, thus, electric connection between the imaging device 7 and the electric connection portion 130 of the first base member 110 may be lost. In addition, if the encapsulating medium 6 is undried, the distance between the transparent plate 8 and the imaging surface of the imaging device 7 may vary when the module is inclined. If the distance between the transparent plate 8 and the imaging surface of the imaging device 7 varies before and after a change in the orientation of the module, the image qualities of the sub-images differ from one another and, thus, a sharp high-resolution image may not be obtained.

By urging the transparent plate 8 of the module against the flat portion 114 of the module mount unit 112, the occurrence of such a defect can be prevented. For example, poor electrical connection between the imaging device 7 and the electric connection portion 130 can be avoided.

In addition, by pressing the principal surface 8f of the transparent plate 8 from the side adjacent to the second base member 150, the object sandwiched by the transparent plate 8 and the imaging device 7 can be appropriately flattened so as to have a substantially uniform thickness along its length. As illustrated in FIG. 17B, when the module M is held between the first base member 110 and the second base member 150, the imaging device 7 is supported by the top surface electrodes 136. Accordingly, by pressing the principal surface 8f of the transparent plate 8 with the imaging device 7 supported by the top surface electrodes 136, the distance between the transparent plate 8 and the imaging surface of the imaging device 7 can be decreased. In this manner, the object can be appropriately flattened so as to have a substantially uniform thickness along its length and, thus, blurring due to out-of-focus caused by a variation of the thickness of the object along its length can be reduced. In addition, by decreasing the distance between the transparent plate 8 and the imaging surface of the imaging device 7, bubbles mixed into the encapsulating medium 6 (refer to FIG. 9) during production of the module M can be expelled. By reducing bubbles mixed into the encapsulating medium 6, drying of the object (the specimen) can be avoided and, thus, deterioration of the object (the specimen) can be avoided. Note that as can be seen from FIG. 17B, if the back surface 8b of the transparent plate 8 is in contact with the flat portion 114, the transparent plate 8 does not move any more. Accordingly, the object is not completely flattened.

Note that the need for the pressing portion 156 provided in the second base member 150 can be eliminated. If the back surface 150b of the second base member 150 can appropriately press the front surface 8f of the transparent plate 8, the above-described effect can be obtained.

When a pressing portion having an elastic force exerted thereon (the protruding portion 116 in this example) is provided in the first base member 110 and a pressing portion having an elastic force exerted thereon (the pressing portion 156 in this example) is provided in the second base member 150, the pressing force in the first base member 110 and the pressing force in the second base member 150 can be controlled so as to have an appropriate greater-lesser relationship. For example, by controlling the pressing force in the first base member 110 and the pressing force in the second base member 150 so that the distance between the transparent plate 8 and the imaging device 7 is no greater than a predetermined distance, a variation of the thickness of the object along its length can be reduced.

The setting may be made so that the pressing force of the pressing portion 156 is greater than the pressing force of the protruding portion 116. If the pressing force of the protruding portion 116 that presses the back surface 8b of the transparent plate 8 is significantly greater than the pressing force of the pressing portion 156, the back surface 8b of the transparent plate 8 may separate from the flat portion 114. Thus, the distance between the transparent plate 8 and the imaging surface of the imaging device 7 may not be decreased. Alternatively, the backside electrode 5B of the imaging device 7 may separate from the top end of the top surface electrodes 136 and, thus, electric connection between the imaging device 7 and the electric connection portion of the first base member 110 may be lost. By setting the pressing force of the pressing portion 156 to a value greater than the pressing force of the protruding portion 116, the occurrence of such a defect can be prevented.

The electric connection portion 130 may include a movable electrode having an elastic force exerted thereon. In a socket 100f illustrated in FIG. 17C, each of the top surface electrodes 136 is connected to an elastic member 117e (e.g., a spring) supported by the first base member 110. That is, in the example illustrated in FIG. 17C, an upward elastic force is exerted on each of the top surface electrodes 136.

Figure 17C:
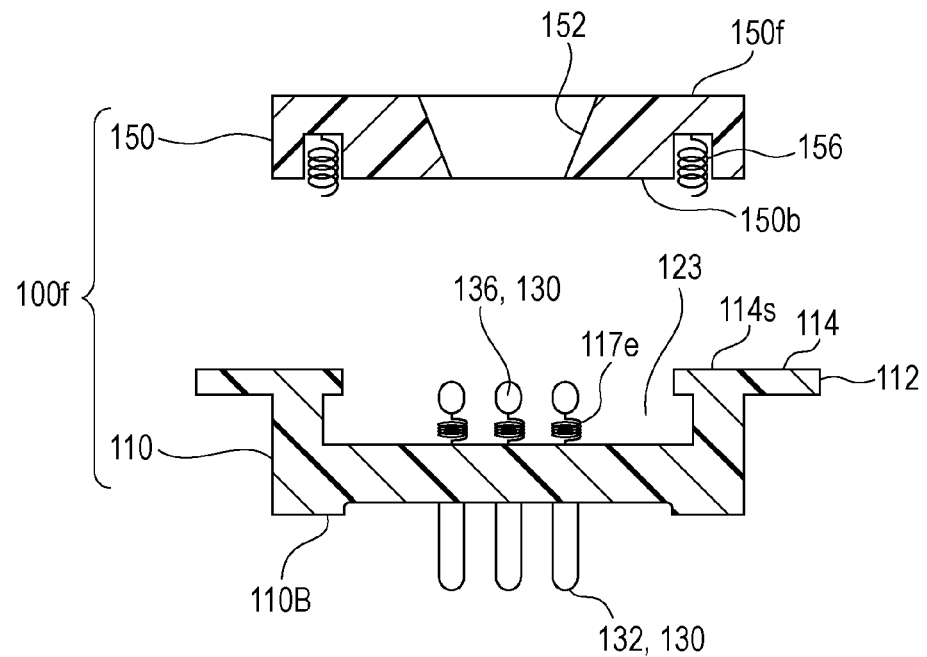
FIG. 17C is a schematic cross-sectional view of a socket including top surface electrodes connected to an elastic member.
Figure 17D:
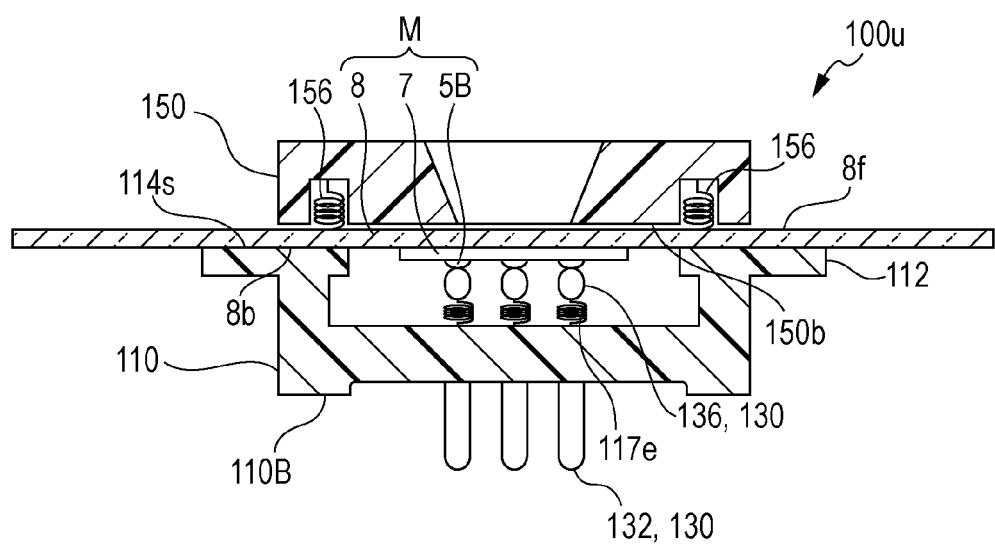
FIG. 17D is a cross-sectional view of a module held between the first base member and the second base member using the socket illustrated in FIG. 17C.

FIG. 17D illustrates the module M held between the first base member 110 and the second base member 150 using the socket 100f illustrated in FIG. 17C. By exerting the elastic force on each of the top surface electrodes 136 in a direction toward the backside electrode 5B of the imaging device 7, the imaging device 7 can be electrically connected to the electric connection portion 130 in a reliable manner.

At that time, let P1 be the magnitude of a force exerted on the second base member 150 in a direction toward the first base member 110. Let P2 be the magnitude of the elastic force of the pressing portion 156. Let P3 be the magnitude of the elastic force of an elastic member 117e. Then, it is desirable that the sum of P1, P2, and P3 be no greater than P4 representing the magnitude of a force that destroys the object (the specimen). That is, it is desirable that P4>P1+P2+P3. In addition, if the sum of P2 and P3 is greater than P1, the second base member 150 fixed to the first base member 110 is unfixed. Accordingly, it is desirable that P1>P2+P3.

As described above, the module M is placed on the module mount unit 112 so that the imaging device 7 is disposed inside the concave portion 118 of the protruding portion 116. At that time, if the module M is placed on the module mount unit 112 in a wrong mounting direction, the imaging device 7 cannot be connected to the electric connection portion 130 of the first base member 110 depending on the position setting of the backside electrode 5B of the imaging device 7 (refer to FIG. 17B). Alternatively, if the module M is placed on the module mount unit 112 in a wrong mounting direction and the imaging device 7 is connected to the electric connection portion 130, unwanted short circuit may occur and, thus, the imaging device 7 may be damaged.

Figure 18A:
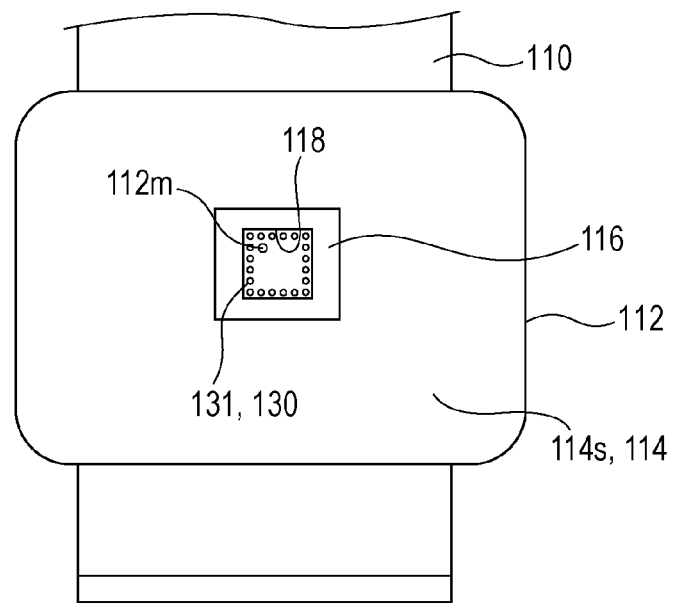
FIG. 18A is a plan view illustrating an example of a module mount unit having a marker formed thereon, where the marker indicates a correct mounting direction of the module.

Accordingly, as illustrated in FIG. 18A, if a marker, for example, that indicates a correct direction in which the module M is mounted is formed on the module mount unit 112, the damage of the imaging device 7 can be prevented. In the example illustrated in FIG. 18A, a marker 112m that indicates a correct direction in which the module M is mounted is formed on the protruding portion 116 of the module mount unit 112. The marker may be in the form of a dent. However, the form of the marker is not limited thereto. The marker may be formed from printing, coloring, a projection, or any combination thereof.

In addition to forming a marker on the module mount unit 112, it is desirable that a marker corresponding to the marker formed on the module mount unit 112 be formed on the module M. In a module Mm illustrated in FIG. 18B, circular coloring 5m is formed on the front surface of the backside electrode 5B of the imaging device 7 at a position corresponding to the marker of the module mount unit 112. In this example, if the module Mm illustrated in FIG. 18B is turned over and, thereafter, the module Mm is placed on the module mount unit 112 so that the coloring 5m is overlapped with the marker (dent) 112m of the module mount unit 112, the module Mm can be placed on the module mount unit 112 in the correct mounting direction.

In addition, the image acquiring apparatus 300 may detect the direction in which the module is mounted. If a wrong mounting direction is detected, the image acquiring apparatus 300 may output an error message to a user of the image acquiring apparatus 300. Furthermore, the electric connection portion 130 may include a short circuit prevention circuit.

Figure 18B:
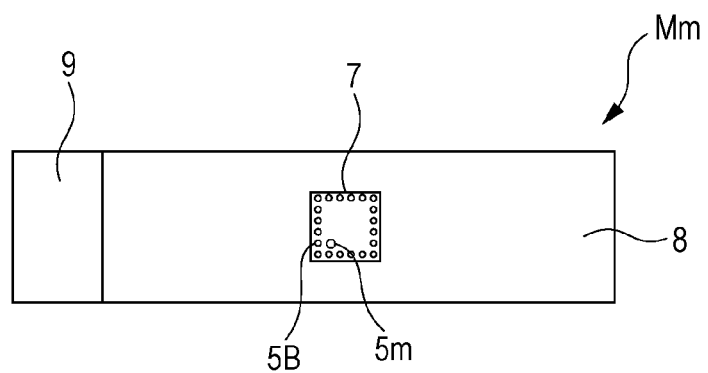
FIG. 18B is a plan view of a module having a marker formed on a surface of an imaging device adjacent to a backside electrode at a position corresponding to the marker of the module mount unit.

As illustrated in FIG. 18B, the transparent plate 8 may have a direction display portion 9 therein. The direction display portion 9 can be formed by sticking a color identification tape onto the transparent plate 8 or providing a printable portion on the transparent plate 8. For example, the reference direction of the socket can be predetermined, and the module Mm can be placed on the module mount unit 112 so that the direction display portion 9 of the transparent plate 8 is located on the left side of the socket.

Figure 19A:
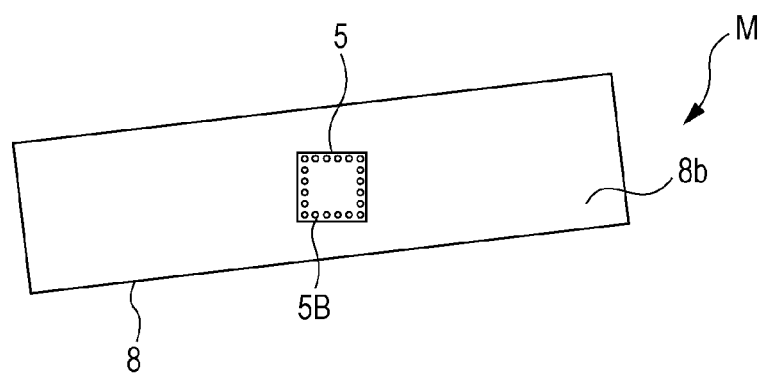
FIG. 19A is a plan view of an example of a module in which a package is disposed at an angle relative to the direction of a transparent plate.

As described above with reference to FIG. 9, to produce the module M, the imaging device 7 is disposed on the object 2 covered by the encapsulating medium 6. When the imaging device 7 is disposed and if, in particular, the production step is carried out manually, the orientation of the package 5 is easily tilted with respect to the orientation of the transparent plate 8, as illustrated in FIG. 19A. That is, as viewed from a direction of the normal line of the principal surface of the transparent plate 8, the long side of the transparent plate 8 is not parallel to one of the sides of the package 5 (e.g., a square) that is the closest to the long side, in general.

Figure 19B:
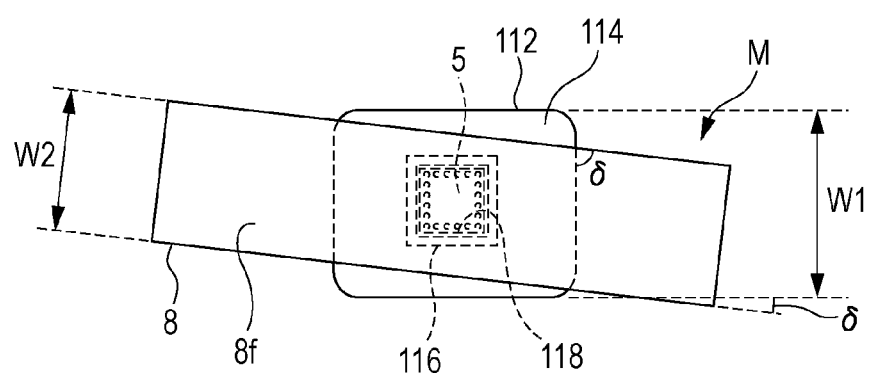
FIG. 19B is a plan view of the module held between the first base member and the second base member and the module mount unit as viewed from a direction perpendicular to a flat portion of the module mount unit.

Accordingly, as illustrated in FIG. 19B, when viewed from a direction perpendicular to the flat portion 114 of the module mount unit 112, it is desirable that the length of the flat portion 114 measured along the short side direction of the transparent plate 8 (a rectangle in this example) (i.e., the length indicated by an arrow W1 in FIG. 19B) be greater than the length of a short side of the transparent plate 8 (i.e., the length indicated by an arrow W2 in FIG. 19B). As used herein, the term "length of the flat portion 114 measured along the short side direction of the transparent plate 8" refers to the distance between, among the sides of the flat portion 114 as viewed from a direction perpendicular to the flat portion 114, a side that makes the smallest angle to a long side of the transparent plate 8 of the module M held between the first base member 110 and the second base member 150 (i.e., an angle δ illustrated in FIG. 19B, where δ<90°) and a side facing the side. If W1>W2, the module M can be diagonally disposed on the module mount unit 112 even when the orientation of the package 5 is at an angle to the orientation of the transparent plate 8. Accordingly, the module M can be electrically connected to the electric connection portion of the socket in an appropriate manner.

Modification of Socket

A modification of the socket is described below with reference to FIGS. 20A to 22.

Figure 20A:
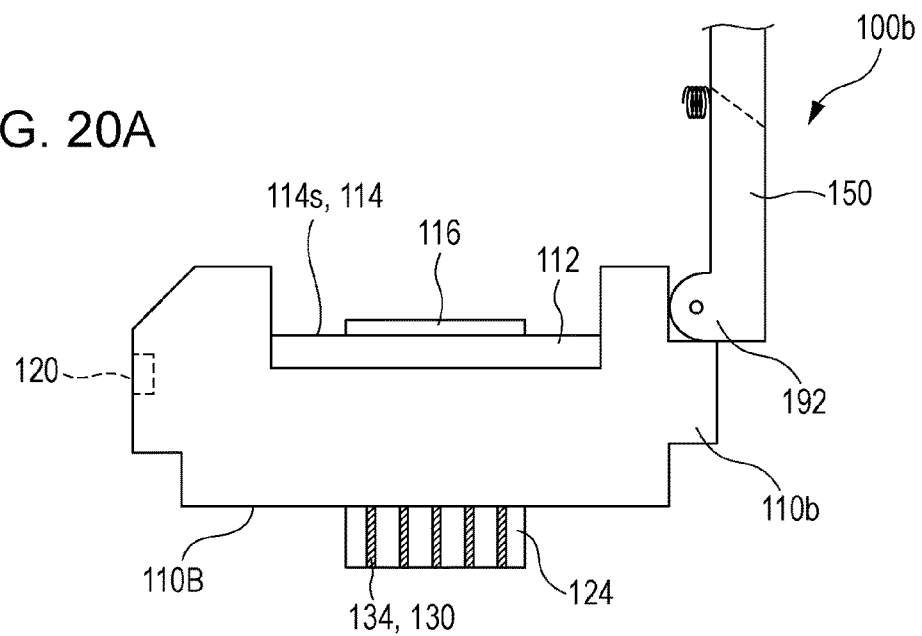
FIG. 20A is a side view of a socket having a protruding portion on the bottom surface of the first base member.
Figure 20B:
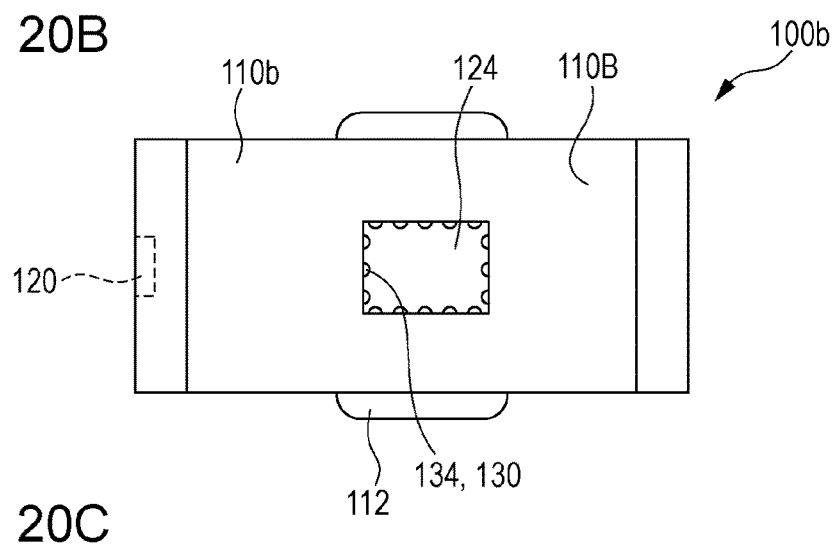
FIG. 20B is a bottom view of the socket illustrated in FIG. 20A.
Figure 20C:
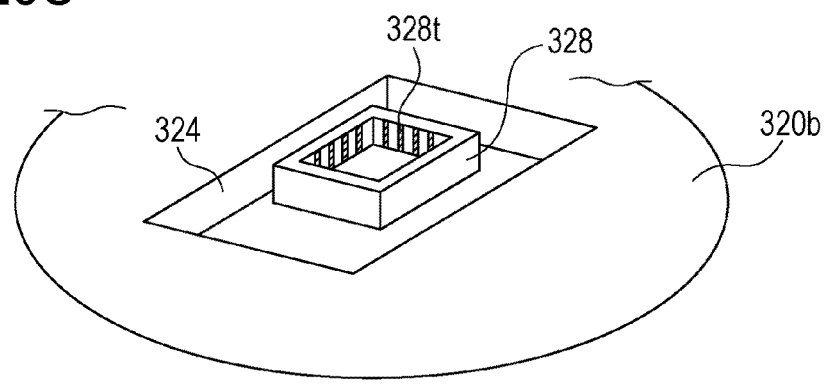
FIG. 20C is a perspective view illustrating an example of the configuration of a stage from which the socket illustrated in FIGS. 20A and 20B is removable.

FIGS. 20A and 20B illustrate a socket 100b having a protruding portion 124 formed on the bottom surface 110B of a first base member 110b. FIG. 20C illustrates an example of the configuration in which a stage 320b allows the socket 100b illustrated in FIGS. 20A and 20B to be removable. In the example of the configuration illustrated in FIGS. 20A and 20B, bottom surface electrodes 134 are disposed on side surfaces of the protruding portion 124. In addition, in the example of the configuration illustrated in FIG. 20C, a stage socket 328 is provided on the mount unit 324 of a stage 320b on which the socket 100b is to be mounted. As illustrated in FIG. 20C, stage electrodes 328t are disposed inside the stage socket 328 at positions corresponding to the bottom surface electrodes 134 of the socket 100b. By mounting the socket 100b on the stage 320b so that the protruding portion 124 of the first base member 110b is inserted into the stage socket 328, the socket 100b can be fixed to the stage 320b, and the bottom surface electrodes 134 are electrically connected to the stage electrodes 328t.

By forming the protruding portion 124 on the bottom surface 110B of a first base member 110b and disposing the bottom surface electrodes 134 that constitute the electric connection portion 130 on the side surface of the protruding portion 124, the socket can be more easily mounted and dismounted from the stage 320b. In addition, in this example, the bottom surface electrodes 134 are supported by the protruding portion 124. Accordingly, unlike in the case in which a pin electrode is inserted into a jack, the occurrence of damage (fracture or bend) of the electrodes caused by a socket mounting or dismounting operation can be reduced.

Figure 21A:
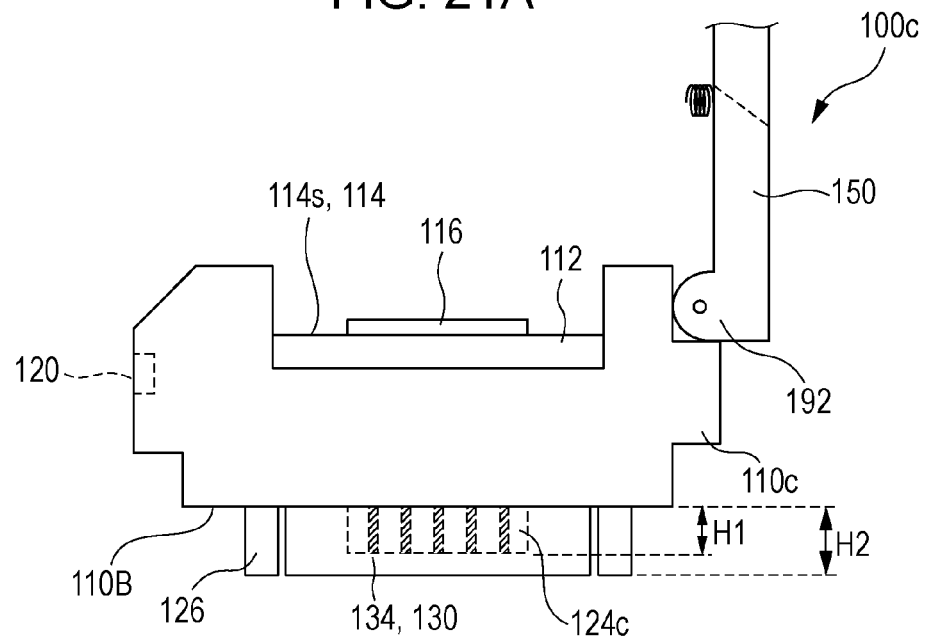
FIG. 21A is a side view of a socket having a leg portion on the bottom surface of a first base member.
Figure 21B:
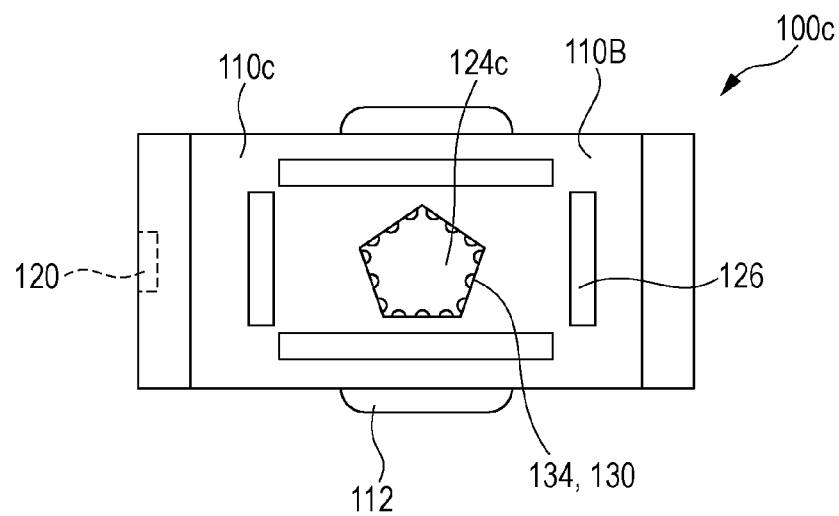
FIG. 21B is a bottom view of the socket illustrated in FIG. 21A.

FIGS. 21A and 21B illustrate a socket 100c having a leg portion 126 on a bottom surface 110B of a first base member 110c. In an example of the configuration illustrated in FIGS. 21A and 21B, the leg portion 126 is formed on the bottom surface 110B of a first base member 110c so as to extend perpendicularly from the bottom surface 110B. In this example, as illustrated in FIG. 21B, four leg portions 126 are formed on the bottom surface 110B so as to surround a protruding portion 124c.

By providing the leg portion 126 on the bottom surface 110B of a first base member 110c, the orientation of the socket mounted on the stage can be more reliably kept unchanged. In addition, the socket can be more easily and stably placed on, for example, a desk. To prevent damage of the bottom surface electrodes 134, it is desirable that the height of the leg portion 126 (a height indicated by an arrow H2 in FIG. 21A) be greater than the length of the bottom surface electrode 134 or the length of protrusion of the protruding portion (a height indicated by an arrow H1 in FIG. 21A). The shape of the leg portion 126 is not limited to a plate shape. For example, the leg portion 126 may have a bar shape.

In the example of the configuration illustrated in FIG. 21B, the shape of the protruding portion 124c as viewed from a direction perpendicular to the bottom surface 110B is a pentagon. By setting the shape of the protruding portion as viewed from a direction perpendicular to the bottom surface 110B to a shape having a symmetric property that is lower than a rectangle, the mounting direction of the socket on the stage can be regulated. According to such a configuration, mounting the socket on the stage in a wrong mounting direction can be prevented.

Figure 22:
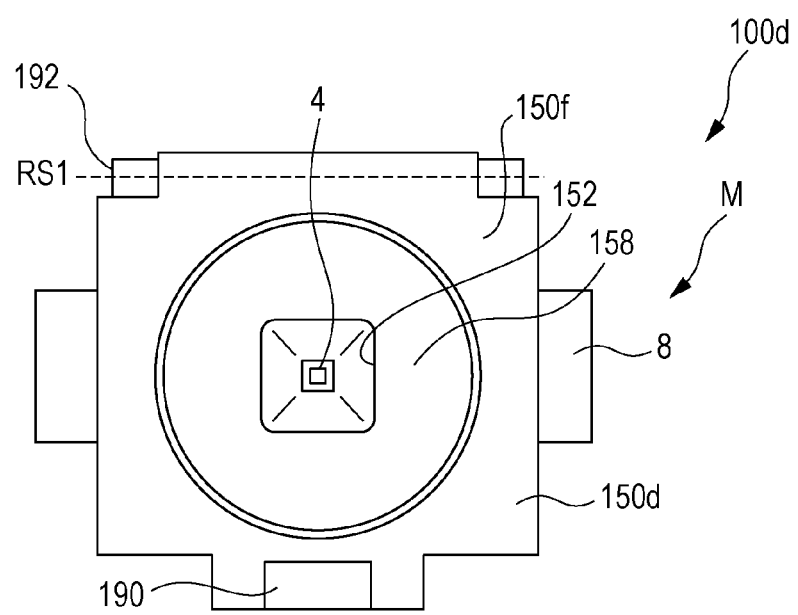
FIG. 22 is a plan view of a socket having a filter mount unit provided on a second base member.

FIG. 22 illustrates a socket 100d having a filter mount unit 158 provided on a second base member 150d. In an example of the configuration illustrated in FIG. 22, a circular concave portion that serves as the filter mount unit 158 is formed in the front surface 150f of the second base member 150d. As illustrated in FIG. 22, the opening 152 is formed in the central area of the concave portion. By providing such a filter mount unit 158, an optical filter, such as a neutral density (ND) filter or a color filter, can be attached to the socket. According to such a configuration, an optical filter can be disposed in the vicinity of the object, and light that does not spread out significantly can be used for image capturing.

In addition to the above-described modification, a variety of modifications can be made. For example, instead of providing a hook on the second base member 150, a hook may be provided on the first base member 110, and a hole corresponding to the hook provided on the first base member 110 may be provided in the second base member 150. The first base member 110 may be configured to be separable from the second base member 150.

Image Forming System

An example of an image forming system according to an exemplary embodiment of the present disclosure and the operation performed by the image forming system are described below with reference to FIG. 23.

Figure 23:
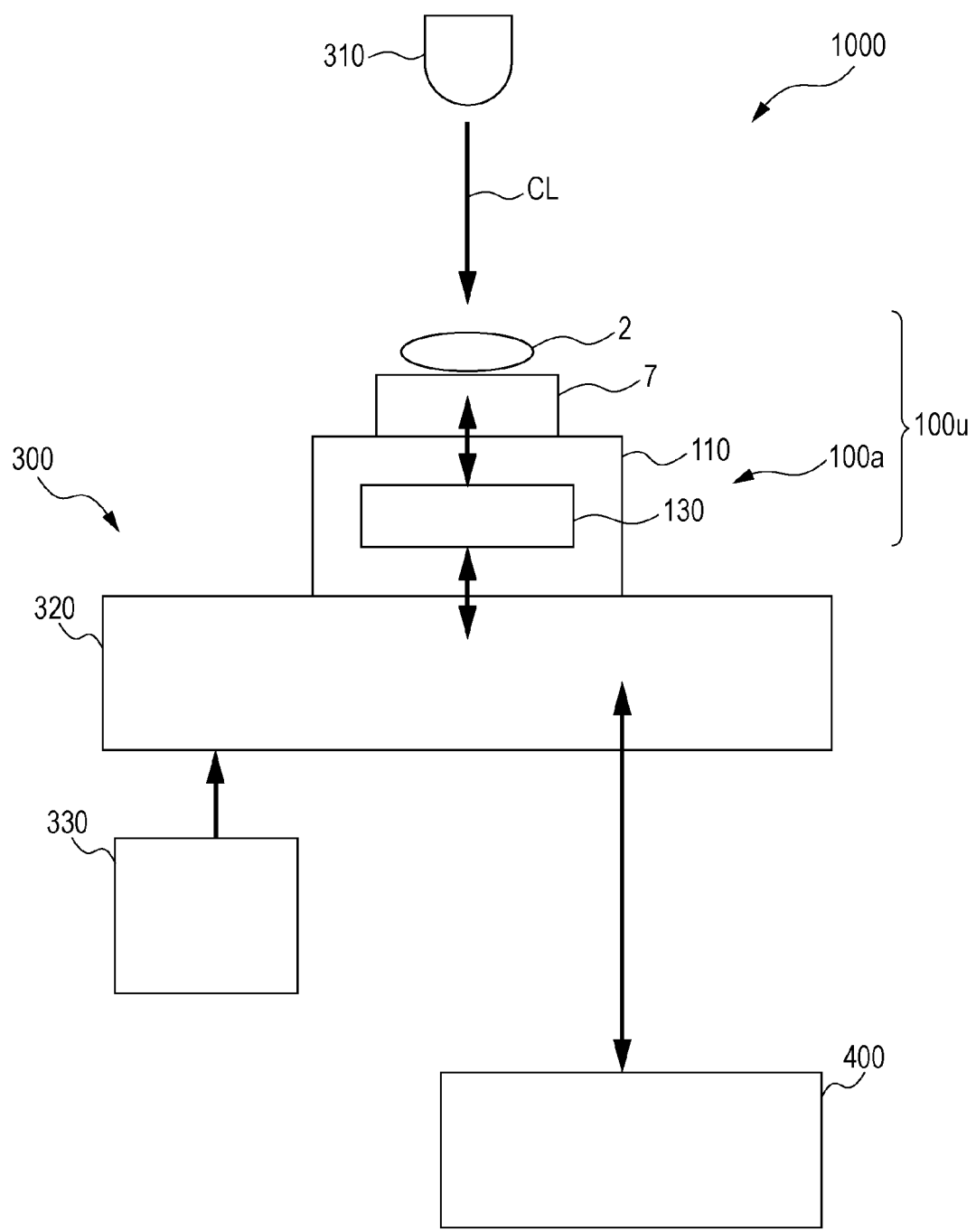
FIG. 23 is a schematic illustration of an example of the configuration of an image forming system according to an exemplary embodiment of the present disclosure.

FIG. 23 is a schematic illustration of an example of the configuration of the image forming system according to the exemplary embodiment of the present disclosure. As illustrated in FIG. 23, an image forming system 1000 includes the above-described object unit 100u and image acquiring apparatus 300 and an image processing apparatus 400. Note that for simplicity, some of the elements of the object unit 100u and the image acquiring apparatus 300 are not illustrated in FIG. 23.

The image processing apparatus 400 of the image forming system 1000 can be achieved by a general-purpose computer or a dedicated computer. The image processing apparatus 400 is connected to the image acquiring apparatus 300 wirelessly or using wired connections. The image processing apparatus 400 may be connected to the image acquiring apparatus 300 via a network, such as the Internet. The image processing apparatus 400 installed at a location other than the location of the image acquiring apparatus 300 may receive the data of a sub-image from the image acquiring apparatus 300 via a network and form a high-resolution image. The image processing apparatus 400 may be separated from the image acquiring apparatus 300 or may be mounted in the image acquiring apparatus 300. The image processing apparatus 400 can serve as a control apparatus that supplies a variety of commands for controlling the operation performed by the units of the image acquiring apparatus 300.

The operation performed by the image forming system 1000 is described below with reference to FIG. 23. By operating the stage drive mechanism 330 and changing the orientation of the stage 320, the image acquiring apparatus 300 changes the orientation of the object unit 100u mounted on the stage 320. In addition, the image acquiring apparatus 300 delivers the illumination light from the light source 310 to the object 2 in the object unit 100u. The light transmitted through the object 2 is incident on the image sensor of the imaging device 7. In this manner, the image of the object with the illumination light delivered in a desired direction can be captured by the imaging device 7. The information regarding the image of the object acquired by the imaging device 7 is transferred to the stage 320 via the electric connection portion 130 of the first base member 110 of the socket 100a. The electric connection portion 130 includes electrodes and circuit elements. Upon receiving the information regarding the image of the object, the image acquiring apparatus 300 sends the image data of the object (the data of a sub-image) to the image processing apparatus 400. Thereafter, the above-described procedure is repeated. That is, after changing the orientation of the stage 320 again, the image acquiring apparatus 300 captures the image of the object. The data of a sub-image acquired at that time is sent from the image acquiring apparatus 300 to the image processing apparatus 400. In this manner, a plurality of different image data items captured by changing the angle of incoming ray of illumination light (the data items of the sub-images) are sent to the image processing apparatus 400.

The image processing apparatus 400 receives the data items of the plurality of sub-images acquired by the image acquiring apparatus 300 and processes the data items to increase the resolution. More specifically, the image processing apparatus 400 combines the plurality of sub-images using the principal described with reference to FIGS. 1A to 6 and forms a high-resolution image of the object having a resolution that is higher than the resolution of each of the sub-images.

Adaptor

While the above configurations have been described with reference to a module directly disposed and fixed to the module mount unit by being sandwiched between the first base member and the second base member, a portion that allows the module M to be placed thereon may be removable from the first base member, as described below.

Figure 24:
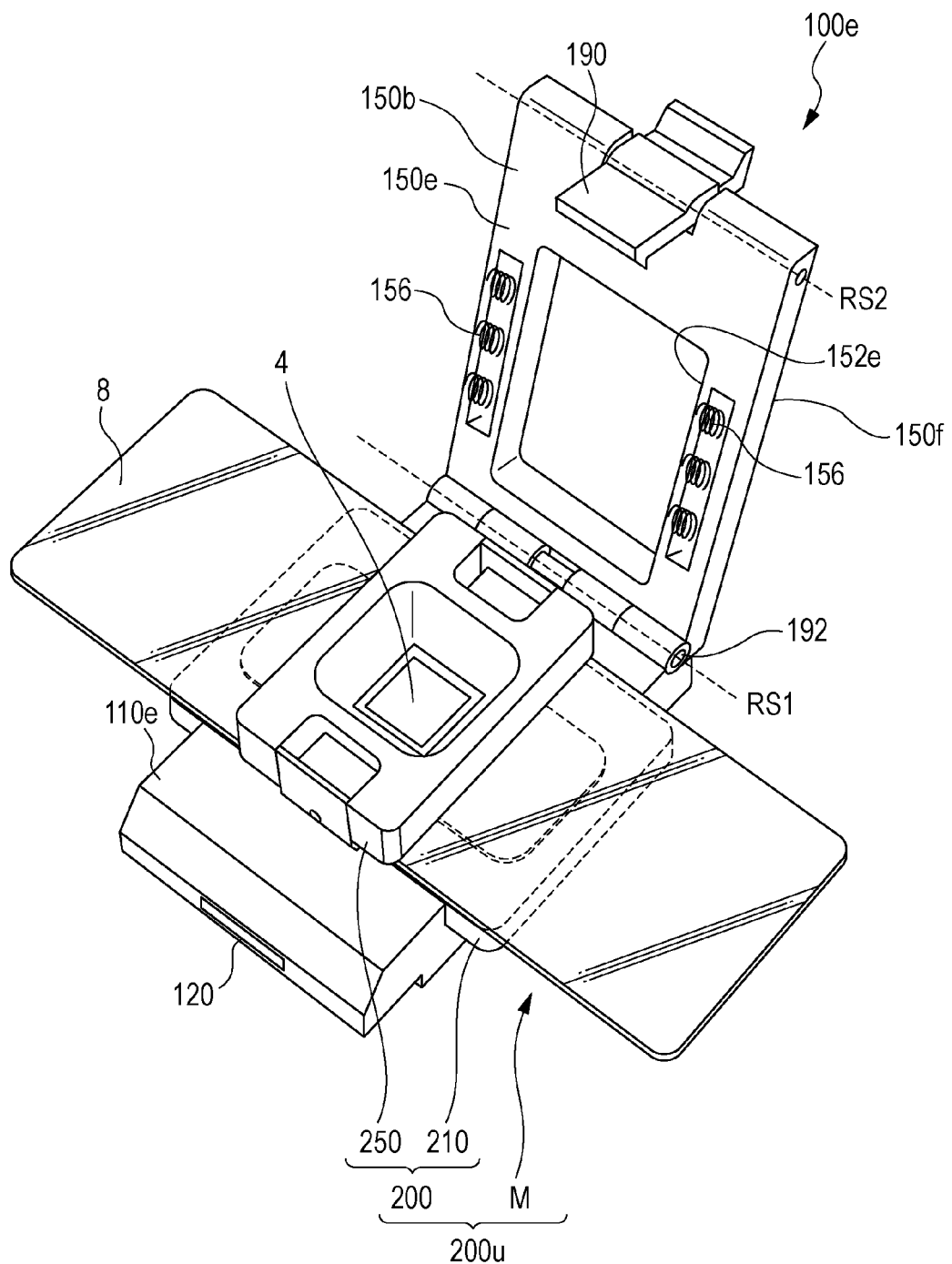
FIG. 24 is a perspective view of an adaptor according to an exemplary embodiment of the present disclosure and a socket having the adaptor attached thereto.

FIG. 24 illustrates an adaptor according to an exemplary embodiment of the present disclosure and a socket having the adaptor attached thereto. As illustrated in FIG. 24, an adaptor 200 includes a support plate 210 and a presser 250. As illustrated in FIG. 24, the module M is held by the adaptor 200 and is attached to a socket 100e. Hereinafter, like the structure in which a module is integrated with a socket, a structure in which a module is integrated with an adaptor is also referred to as a "object unit".

Like the above-described socket, the socket 100e illustrated in FIG. 24 includes a first base member 110e, a second base member 150e, and a hook 190 serving as an engagement unit. In this example, the side surface of an opening 152e of the second base member 150e is perpendicular to the front surface 150f and the back surface 150b of the second base member 150e. By rotating the second base member 150e illustrated in FIG. 24 about the rotation axis RS1 and fitting the hook 190 into the hole 120 of the first base member 110e, the second base member 150e can be fixed to the first base member 110e. By fixing the second base member 150e to the first base member 110e, an object unit 200u placed on a module mount unit (not illustrated in FIG. 24) of the first base member 110e is fixed between the first base member 110e and the second base member 150e. That is, the module M is held between the first base member 110e and the second base member 150e. When the second base member 150e faces the module M, the presser 250 is located inside the opening 152e of the second base member 150e. The external view of the object unit 200u in which the module M is held between the first base member 110e and the second base member 150e and the socket 100e viewed in a direction perpendicular to the front surface 150f of the second base member 150e is substantially the same as that in FIG. 13C. Thus, according to the present exemplary embodiment, the drawing of the object unit 200u in which the module M is held between the first base member 110e and the second base member 150e and the socket 100e when the module M is held between the first base member 110e and the second base member 150e is not provided.

Figure 25:
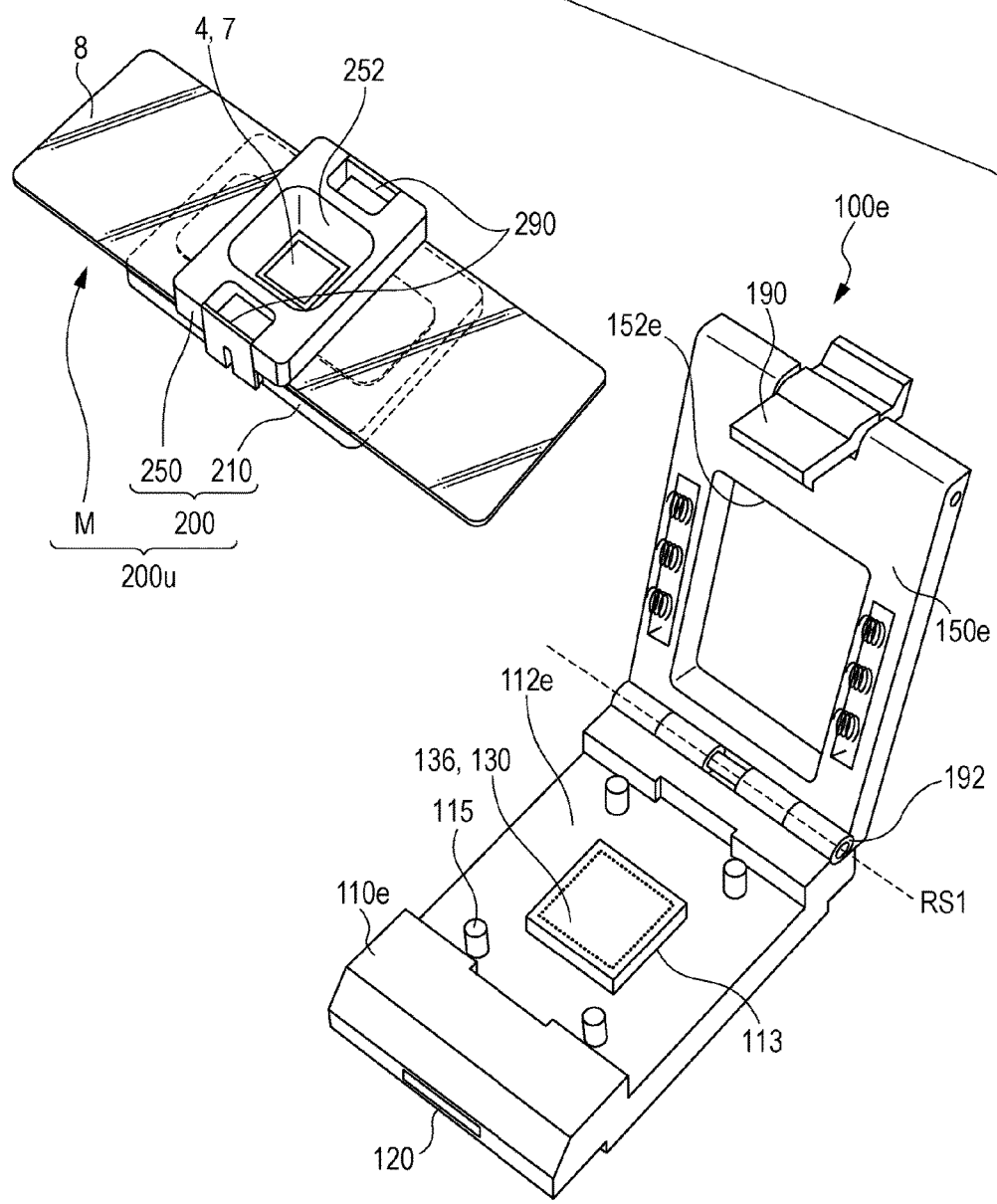
FIG. 25 is a perspective view of an object unit and a socket separated from each other.

FIG. 25 illustrates the object unit 200u and the socket 100e separated from each other. In the example of the configuration illustrated in FIG. 25, the module mount unit 112e of the first base member 110e has a protruding portion 113 formed thereon. Four pins 115 are disposed so as to surround the protruding portion 113. As illustrated in FIG. 25, the top surface electrodes 136 that constitute the electric connection portion 130 are disposed on the top surface of the protruding portion 113. In this example, the top surface electrodes 136 are pin electrodes. As described below, the top ends of the top surface electrodes 136 are in contact with back surface electrodes of the imaging device 7 of the module M and, thus, the imaging device 7 is electrically connected to the electric connection portion 130. Note that the four pins 115 are provided to place the object unit 200u on the first base member 110e in position. A technique for positioning the object unit 200u on the first base member 110e is not limited thereto. The shape of the pin 115 and the number of the pins 115 are not limited to those in this example.

As described in more detail below, in the adaptor 200 of the object unit 200u, by connecting the presser 250 to the module M placed on the support plate 210, the module M is held between the support plate 210 and the presser 250. In the example illustrated in FIG. 25, the presser 250 has two hooks 290 formed therein. By using the hooks 290, the presser 250 is connected to the support plate 210. As illustrated in FIG. 25, the presser 250 has an opening 252 formed therein. When the module M is held, the opening 252 is located above the image sensor 4 of the imaging device 7. Accordingly, the illumination light can be delivered to the object through the opening 252, and the image of the object can be captured by the imaging device 7 using the illumination light that has transmitted the object.

The structure of the adaptor 200 is described in detail below with reference to FIGS. 26A to 28C.

Figure 26A:
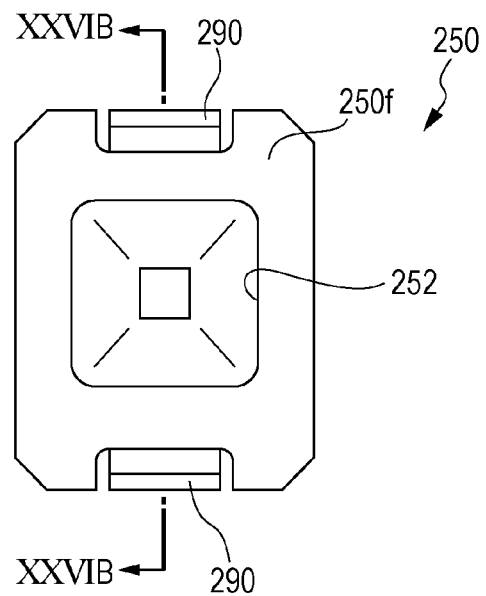
FIG. 26A is a plan view of a presser illustrated in FIG. 25 that is separated from a support plate.

FIG. 26A illustrates the presser 250 illustrated in FIG. 25 that is separated from the support plate 210. A front surface 250f of the presser 250 as viewed from a direction perpendicular to the surface that does not face the module M when the module M is held between the presser 250 and the support plate 210 is illustrated in FIG. 26A. In the example illustrated in FIG. 26A, the presser 250 is substantially rectangular in shape.

Figure 26B:
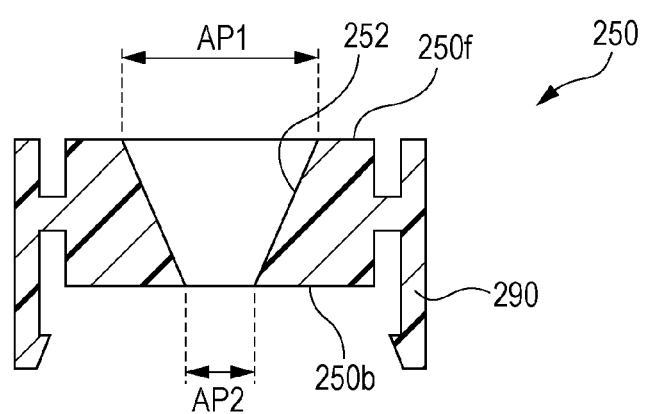
FIG. 26B is a cross-sectional view taken along a line XXVIB-XXVIB of FIG. 26A.

FIG. 26B is a cross-sectional view taken along a line XXVIB-XXVIB of FIG. 26A. As illustrated in FIG. 26B, the side surface of the opening 252 is tapered. Thus, the opening space of the opening 252 decreases from the front surface 250f of the presser 250 toward the back surface 250b of the presser 250 in the thickness direction of the presser 250. That is, in the example illustrated in FIG. 26B, AP1>AP2. Thus, even when the orientation of the object unit 200u is changed in the image acquiring apparatus 300, the illumination light can be reliably delivered to the object in the module. In addition, the occurrence of stray light can be prevented. Note that the opening 252 is not limited to a through-hole. The opening 252 may be filled with a light transmissive material (e.g., a transparent resin).

As illustrated in FIG. 26B, the hooks 290 extend in a direction from the front surface 250f of the presser 250 to a back surface 250b of the presser 250. By fitting the support plate 210 into between the hooks 290, the presser 250 can be fixed to the support plate 210 with the module M sandwiched between the presser 250 and the support plate 210. Note that the presser 250 need not be separable from the support plate 210. For example, like the socket 100e in which the first base member 110e is connected to the second base member 150e using a hinge, the presser 250 may be connected to the support plate 210 using a hinge.

When the module M is held between the presser 250 and the support plate 210, the back surface 250b of the presser 250 faces the module M. That is, when the module M is held between the presser 250 and the support plate 210, the back surface 250b of the presser 250 is in contact with the front surface 8f of the transparent plate 8 of the module M. In this example, the distance between the back surface 250b of the presser 250 and a supporting surface 212s of the support plate 210 (refer to FIG. 27A described below) is determined by the length of the hooks 290. Accordingly, the adaptor 200 can hold the module M such that the distance between the back surface 250b of the presser 250 and the supporting surface 212s of the support plate 210 is regulated within a predetermined range. That is, the sum of the distance between the imaging surface of the imaging device 7 and the object and the thickness of the object can be maintained within the predetermined range. As described above, the adaptor 200 can regulate a relationship between the object and the image sensor in addition to holding the module M. By using the adaptor 200, the object can be appropriately flattened so as to have a substantially uniform thickness along its length and, thus, blurring due to out-of-focus caused by a variation of the thickness of the object along its length can be reduced. In addition, bubbles mixed into the encapsulating medium 6 (refer to FIG. 9) during production of the module M can be expelled.

Figure 27A:
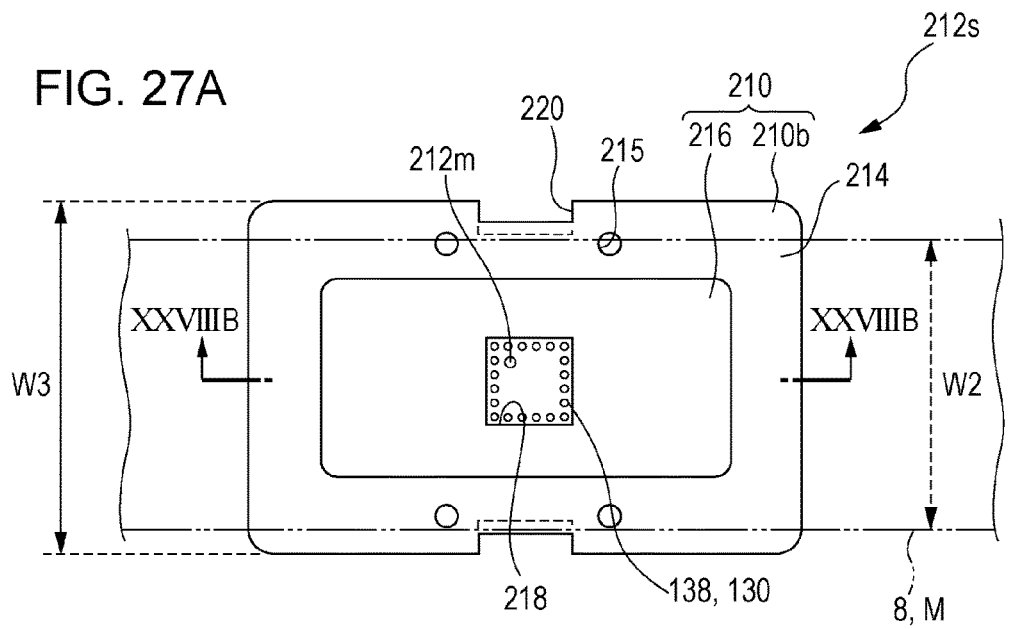
FIG. 27A is a plan view schematically illustrating a supporting surface of the support plate on which the module is to be placed.

FIG. 27A is a schematic illustration of the supporting surface 212s of the support plate 210 on which the module M is to be placed. In the example of the configuration illustrated in FIG. 27A, the support plate 210 includes a lower plate 210b having a flat portion 214 formed therein and an upper plate 216. As illustrated in FIG. 27A, in this example, the lower plate 210b is substantially rectangular in shape. Among the four sides of the rectangle, two sides that face each other have notches 220 formed therein. The notches 220 catch the hooks 290 of the presser 250. In addition, in the example illustrated in FIG. 27A, the lower plate 210b has positioning holes 215 formed therein. The positioning holes 215 are formed in the lower plate 210b at positions corresponding to the pins 115 (refer to FIG. 25) of the module mount unit 112e of the first base member 110e. When the object unit 200u is mounted on the module mount unit 112e of the first base member 110e, the pins 115 of the module mount unit 112e are inserted into the positioning holes 215 of the lower plate 210b. In this manner, the object unit 200u can be mounted on the module mount unit 112e in place. By arranging the pins 115 and the positioning holes 215 in an asymmetric manner, a direction in which the object unit 200u is mounted on the module mount unit 112e can be regulated. In this manner, mounting of the object unit 200u in a wrong mounting direction can be prevented.

As described below, the flat portion 214 of the lower plate 210b is in contact with the back surface 8b of the transparent plate 8 when the module M is held between the support plate 210 and the presser 250. Note that as schematically illustrated in FIG. 27A, the length of the flat portion 214 measured along the short side direction of the transparent plate 8 (a rectangle in this example) as viewed from a direction perpendicular to the flat portion 214 (i.e., the length indicated by an arrow W3 in FIG. 27A) is typically greater than the length of a short side of the transparent plate 8 (i.e., the length indicated by an arrow W2 in FIG. 27A). If, as in this example, W3>W2, it is beneficial because of a reason that is the same as described with reference to FIG. 19B. That is, even when the orientation of the package 5 is at an angle to the orientation of the transparent plate 8, the module M can be diagonally disposed on the support plate 210.

Figure 27B:
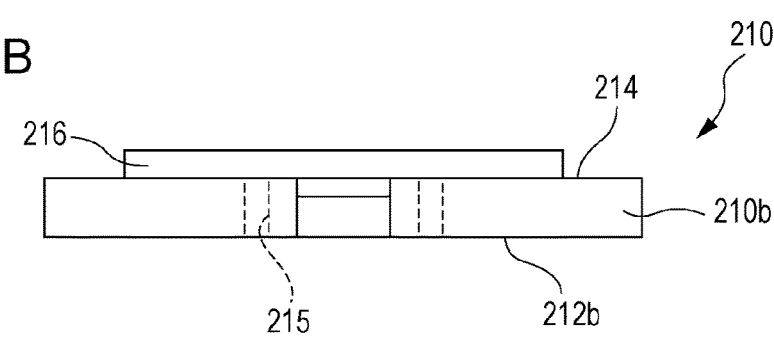
FIG. 27B is a side view schematically illustrating the support plate illustrated in FIG. 27A.

FIG. 27B is a schematic illustration of the side surface of the support plate 210 illustrated in FIG. 27A. As illustrated in FIG. 27B, when the module M is not mounted on the supporting surface 212s, the top surface of the upper plate 216 protrudes beyond the top surface of the flat portion 214. As described below, an elastic force is exerted on the upper plate 216 in a direction in which the upper plate 216 protrudes from the supporting surface 212s (the upward direction in FIG. 27B), and the upper plate 216 is supported by the lower plate 210b in a movable manner in the vertical direction in FIG. 27B. Note that as used herein, the terms "upper" and "lower" are not intended to be limiting the orientation of a structure.

As illustrated in FIG. 27A, in this example, the concave portion 218 that allows the module M to be disposed therein is formed in the central area of the upper plate 216. In addition, holes 138 are formed inside the concave portion 218. As described in more detail below, the holes 138 are formed so as to correspond to the top surface electrodes 136 illustrated in FIG. 25. The holes 138 constitute the electric connection portion 130 together with the top surface electrodes 136.

Typically, the concave portion 218 of the upper plate 216 has a shape that conforms to the shape of the imaging device 7. When the module M is mounted on the supporting surface 212s, the module M is placed on the support plate 210 so that the imaging device 7 is disposed inside the concave portion 218 of the upper plate 216. A marker indicating a correct direction in which the module M is mounted may be formed on the support plate 210. In the example illustrated in FIG. 27A, a marker 212m is formed on the inner side of the concave portion 218 of the upper plate 216. In this manner, damage of the imaging device 7 caused by electrical connection between the module M and the image acquiring apparatus 300 occurring when the module M is placed on the support plate 210 in a wrong mounting direction can be prevented. The location at which the marker 212m is formed is not limited to a location on the inner side of the concave portion 218 of the upper plate 216. For example, the marker 212m may be formed on the outer side the concave portion 218 of the upper plate 216. A marker that indicates a correct direction in which the object unit 200u is mounted on the module mount unit 112e may be formed on the support plate 210. A marker that indicates a correct direction in which the module M is mounted on the support plate 210 may be formed on the imaging device 7 (refer to FIG. 18B).

Figure 27C:
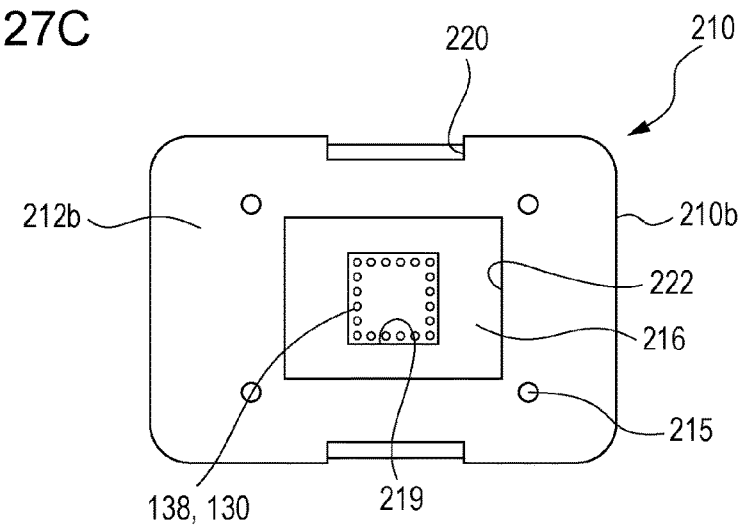
FIG. 27C is a plan view schematically illustrating a surface (a back surface) of the support plate illustrated in FIG. 27A that is opposite to the supporting surface.

FIG. 27C is a schematic illustration of a surface 212b of the support plate 210 illustrated in FIG. 27A that is opposite to the supporting surface 212s of the support plate 210 (i.e., a back surface 212b). In an example of the configuration illustrated in FIG. 27C, an opening 222 that allows the upper plate 216 to be exposed therethrough is formed in the lower plate 210b. As illustrated in FIG. 27A, the upper plate 216 has a concave portion 219 formed therein. The holes 138 are located inside the concave portion 219. When the object unit 200u is placed on the module mount unit 112e, the protruding portion 113 (refer to FIG. 25) of the module mount unit 112e is located inside the concave portion 219.

Figure 28A:
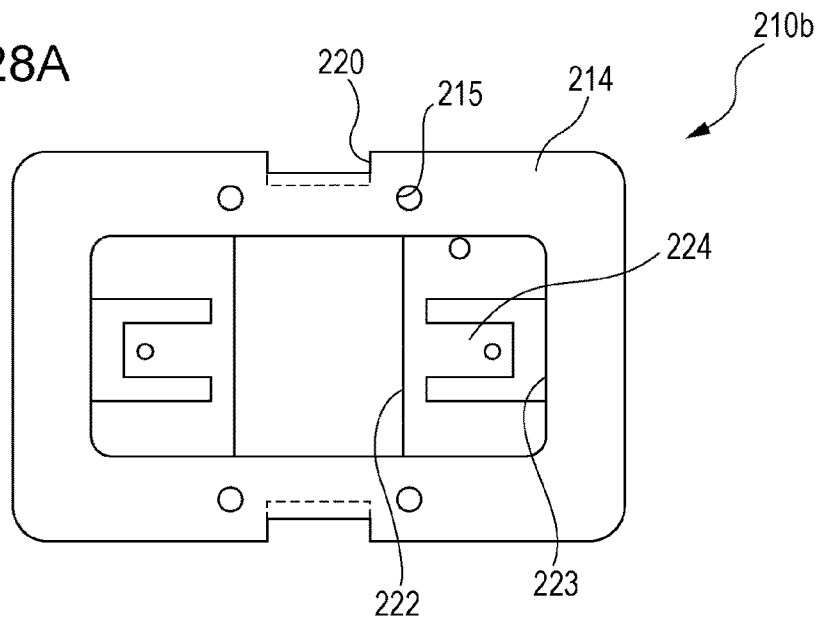
FIG. 28A is a plan view of the support plate illustrated in FIG. 27A with an upper plate removed.
Figure 28B:
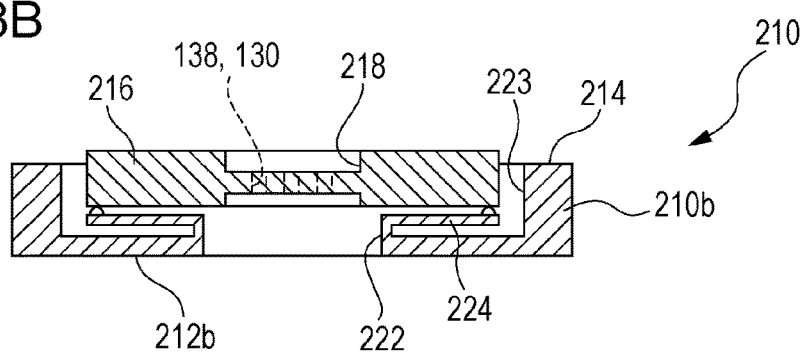
FIG. 28B is a cross-sectional view taken along a line XXVIIIB-XXVIIIB of FIG. 27A.

FIG. 28A illustrates the support plate 210 illustrated in FIG. 27A with the upper plate 216 removed. FIG. 28B is a cross-sectional view taken along a line XXVIIIB-XXVIIIB of FIG. 27A.

In an example described herein, as illustrated in FIG. 28B, the lower plate 210b includes a concave portion 223 that allows the upper plate 216 to be disposed therein. The concave portion 223 has a cantilever 224 formed therein. As illustrated in FIG. 28B, when the upper plate 216 is inserted into the concave portion 223 of the lower plate 210b, the upper plate 216 is supported by the cantilever 224 of the lower plate 210b. In this manner, an elastic force is exerted on the upper plate 216 in a direction toward the back surface 250b of the presser 250 (refer to FIG. 26B). When the module M is held between the support plate 210 and the presser 250 and if the upper plate 216 having the elastic force exerted thereon urges the module M against the back surface 250b of the presser 250, the module M can be more stably held.

As described above, when the module M is mounted on the supporting surface 212s, the module M is placed on the support plate 210 so that the imaging device 7 is disposed inside the concave portion 218 of the upper plate 216. When the presser 250 is connected to the support plate 210 and, thus, the module M is held between the support plate 210 and the presser 250, the back surface 8b of the transparent plate 8 of the module M presses the upper plate 216. Thus, the cantilever 224 deforms, and the upper plate 216 is pressed downward. If the height of the top surface of the upper plate 216 that is pressed by the transparent plate 8 becomes the same as the height of the flat portion 214, the back surface 8b of the transparent plate 8 of the module M is brought into contact with the flat portion 214.

Figure 28C:
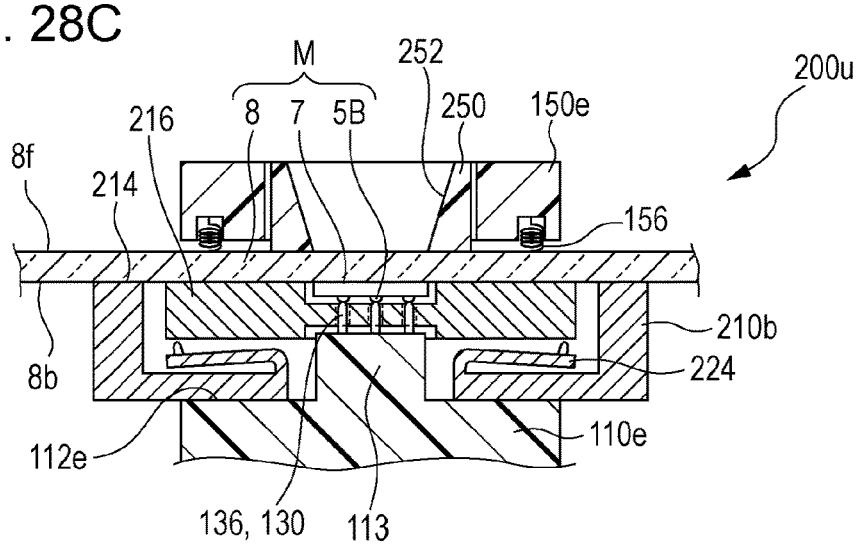
FIG. 28C is a cross-sectional view of the object unit mounted on the module mount unit and the second base member fixed to the first base member.

In addition, if the object unit 200u is mounted on the module mount unit 112e and the second base member 150e is fixed to the first base member 110e, the second base member 150e urges the transparent plate 8 of the module M against the first base member 110e, as illustrated in FIG. 28C. Thus, the back surface 8b of the transparent plate 8 of the module M is urged against the flat portion 214 and, thus, the transparent plate 8 is in more reliable contact with the flat portion 214. Accordingly, the positional relationship between the socket 100e and the module M can be kept unchanged before and after a change in the orientation of the socket 100e. That is, when the socket 100e that holds the object unit 200u is mounted on the stage 320 of the image acquiring apparatus 300 and the orientation of the stage 320 is changed, a relationship between the inclination of the stage 320 relative to the reference plane and the inclination of the module M relative to the reference plane (e.g., a parallel relationship) can be kept unchanged before and after a change in the orientation of the stage 320. If the second base member 150e includes a pressing portion having an elastic force exerted thereon (the pressing portion 156 in this example), the pressing force exerted by the upper plate 216 and the pressing force exerted by the second base member 150e are controlled so as to have an appropriate greater-lesser relationship.

In addition, when the second base member 150e urges the transparent plate 8 of the module M against the first base member 110e, the top ends of the top surface electrodes 136 of the first base member 110e protrude from the holes 138 formed in the upper plate 216 of the support plate 210 of the object unit 200u. Thus, the top ends of the top surface electrodes 136 are brought into contact with the backside electrode 5B of the imaging device 7 of the module M. In this manner, the imaging device 7 is electrically connected to the electric connection portion 130 of the first base member 110e. Note that even when, instead of the holes 138, through-via are formed in the concave portion 218 of the upper plate 216, the same effect as the above-described effect can be obtained. The number of the holes 138 need not be the same as the number of the top surface electrodes 136. For example, a single hole having an opening space that is greater than the total area of the portions where the top surface electrodes 136 are disposed may be formed in the concave portion 218 of the upper plate 216.

In this manner, a portion on which the module M is to be mounted may be removable from the first base member. Like the above-described example, even in the configuration in which the module M is held by the adaptor 200 that is removable from the socket 100e, a relationship between the inclination of the stage 320 relative to the reference plane and the inclination of the module M relative to the reference plane (e.g., a parallel relationship) can be kept unchanged. In addition, by holding the module M using the adaptor 200, the module M can be easily handled.

As described above, during production of the module M, the encapsulating medium 6 is sometimes used and, thus, the distance between the transparent plate 8 and the imaging surface of the imaging device 7 is easily changed until the encapsulating medium 6 completely dries. In addition, since the distance between the transparent plate 8 and the imaging surface of the imaging device 7 may vary when the module M is inclined, a module having the encapsulating medium 6 that is undried is not suitable for capturing a sub-image.

By sandwiching the module M between the support plate 210 and the presser 250 and connecting the presser 250 to the support plate 210, a space between the presser 250 and the support plate 210 can be regulated. Accordingly, by mounting the adaptor 200 on the module M, the encapsulating medium 6 can be dried while regulating the distance between the transparent plate 8 and the imaging surface of the imaging device 7 of the imaging device 7. In addition, since the distance between the transparent plate 8 and the imaging surface of the imaging device 7 is regulated, a sub-image can be captured even when the encapsulating medium 6 is undried, and the imaging device 7 is not peeled off from the transparent plate 8 after the sub-image is captured. Furthermore, the object unit 200u can be placed outside the image acquiring apparatus 300 without using a dedicated stand until the encapsulating medium 6 dries. Note that to avoid a problem caused by deposition of the encapsulating medium 6, such as a change of color and/or dissolution, it is desirable that at least an area of the support plate 210 and the presser 250 that is in contact with the module M be formed of polyetherimide (e.g., ULTEM™) or polycarbonate.

To capture the images of a plurality of objects, a plurality of the object units 200u equal in number to the number of objects are prepared. At that time, the socket can be attached to the stage 320 of the image acquiring apparatus 300, and the object unit 200u can be replaced by another one. As can be seen from the above description, the operation to replace an object unit formed by integrating a module and an adaptor is easier than the operation to replace an object unit formed by integrating a module and a socket. Accordingly, the image can be smoothly captured and, thus, the efficiency of the operation can be increased. Note that the specification of the module M may be changed in accordance with the specification of the image sensor used. Accordingly, the shape of the supporting surface 212s of the support plate 210 of the adaptor 200 may be determined so as to conform to the specification of the module M, and the shape of the surface opposite to the supporting surface 212s may be a common shape. In this manner, a plurality of types of module having different specifications can be used by using a common socket.

Assembly Jig

An example of an assembly jig that can be used to assemble the above-described adaptor 200 and an example of the operation performed by the assembly jig are described below with reference to FIGS. 29 to 36.

Figure 29:
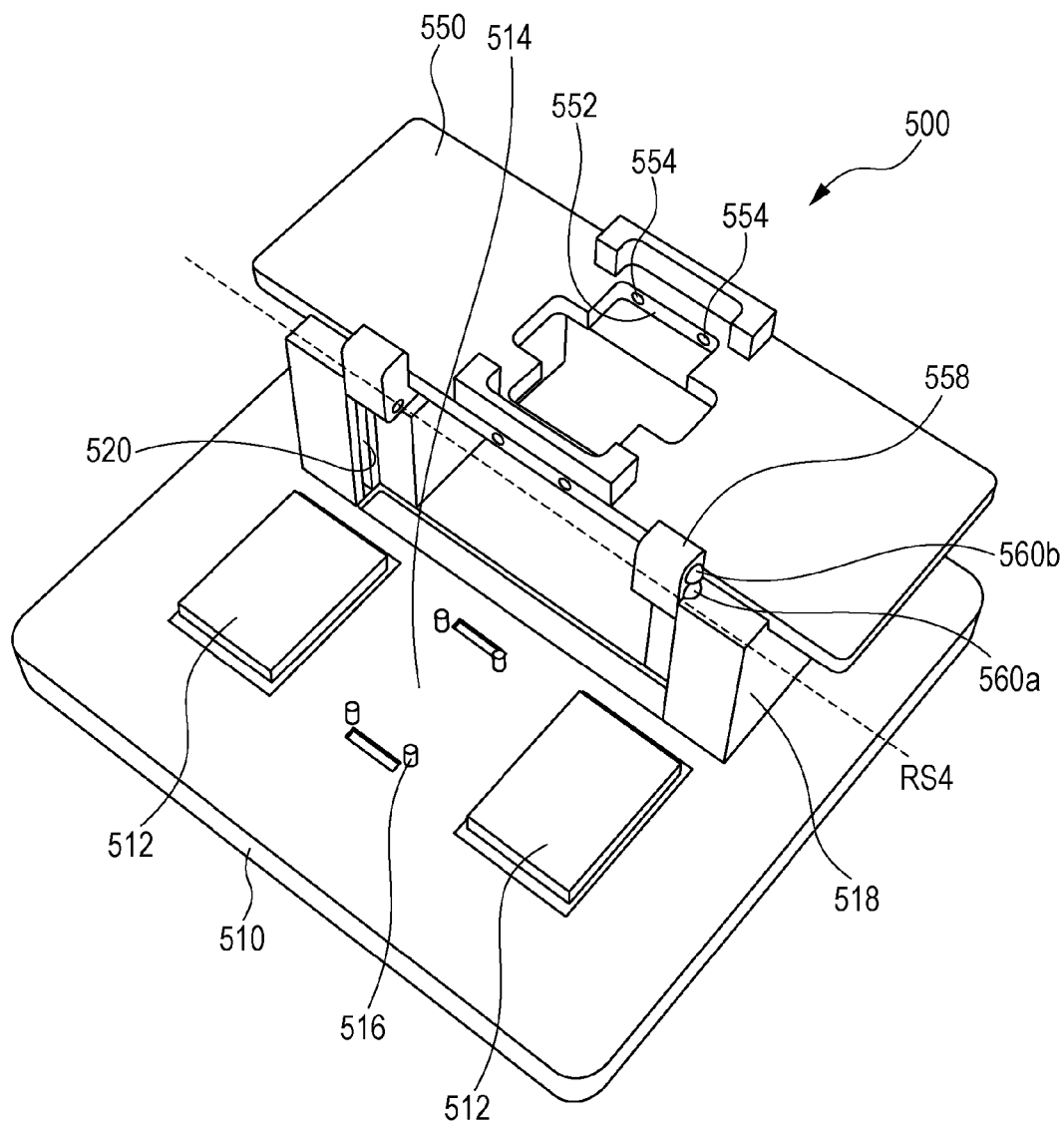
FIG. 29 is a perspective view illustrating the appearance of an example of an assembly jig.

FIG. 29 is an external view of an example of the assembly jig. As schematically illustrated in FIG. 29, an assembly jig 500 includes a bottom plate 510 and a substantially plate-like flap 550 movably attached to the bottom plate 510. In FIG. 29, the flap 550 is disposed parallel to the bottom plate 510. The upper surface of the bottom plate 510 has two plate mount portions 512 formed thereon. The two plate mount portions 512 protrude from the upper surface. A support plate holding portion 514 is formed between the two plate mount portions 512. The support plate holding portion 514 has pins 516 each corresponding to one of the positioning holes 215 of the support plate 210.

In the configuration illustrated in FIG. 29, the flap 550 has an opening 552 formed therein. The opening 552 allows the presser 250 to be inserted thereinto. A ball plunger 554 is embedded inside the flap 550, A top end portion of the ball plunger 554 protrudes from the side surface of the opening 552 toward the inside of the opening 552.

In an example illustrated in FIG. 29, the bottom plate 510 has two wall portions 518 attached thereto. The wall portions 518 extend from the bottom plate 510 upward. Each of a surface of one of the wall portions 518 and a surface of the other wall portion 518 that face each other has a guide rail 520 formed thereon. In addition, the flap 550 has two arms 558 formed thereon. The two arms extend from a principal surface of the flap 550 in a direction perpendicular to the principal surface. Each of the arms 558 has a shaft (not illustrated) that protrudes therefrom. A top end of each of the shafts is fitted into the guide rail 520 of one of the wall portions 518. In this manner, the flap 550 is connected to the wall portions 518 in a rotatable manner about an axis RS4.

Each of the arms 558 has ball plungers 560a and 560b embedded therein. The top ends of the ball plungers 560a and 560b protrude from the arm 558. Note that in each of the arms 558, the above-described shaft, the ball plunger 560a, and the ball plunger 560b are linearly arranged.

How to use the assembly jig 500 is described below.

Figure 30:
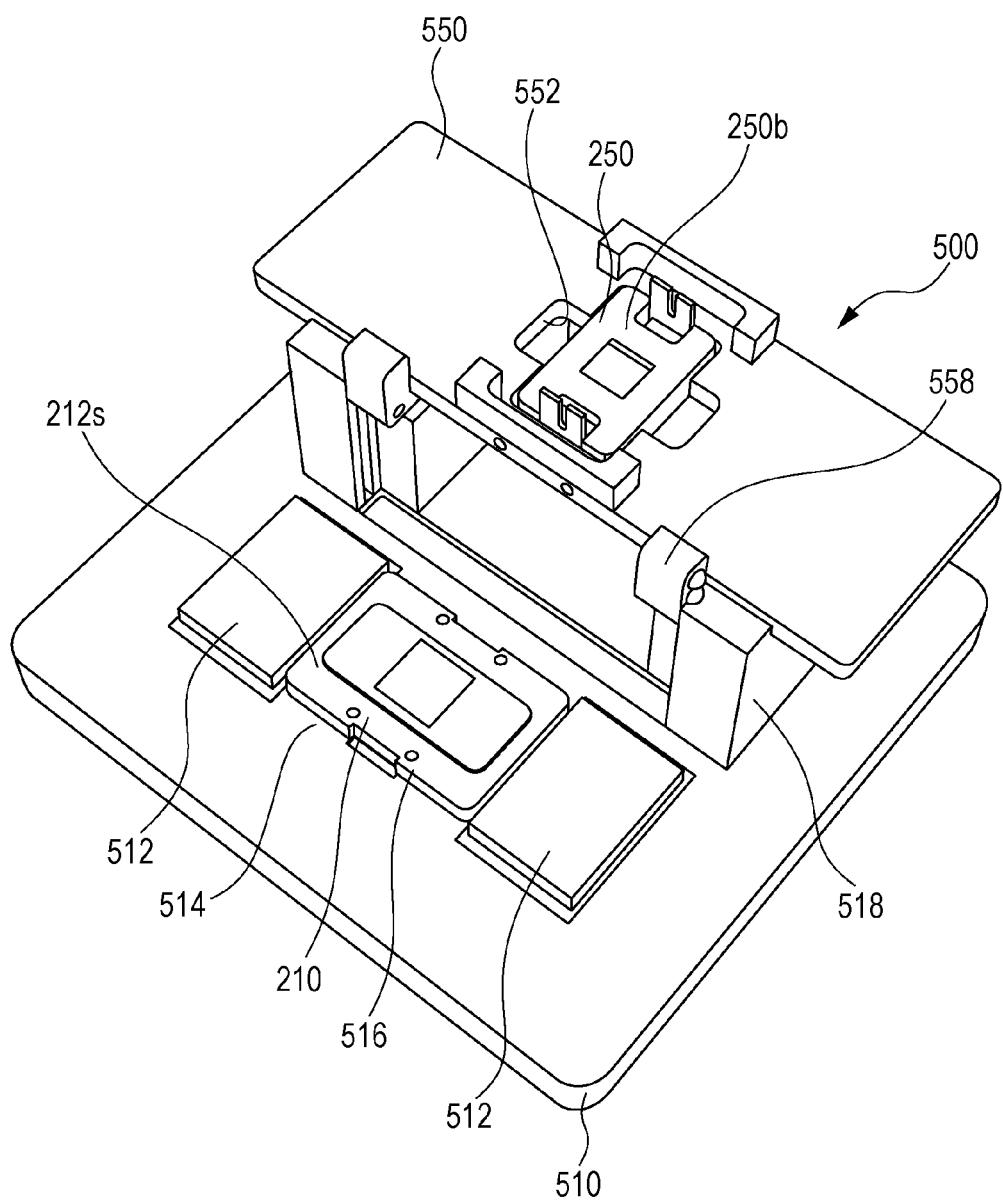
FIG. 30 is a perspective view illustrating how to use the assembly jig.

As illustrated in FIG. 30, the support plate 210 is placed on the support plate holding portion 514 with the supporting surface 212s facing upward first. At that time, the pins 516 of the support plate holding portion 514 are inserted into the positioning holes 215 of the support plate 210 and, thus, the position of the support plate 210 is fixed. In addition, the presser 250 is inserted into the opening 552 of the flap 550 with the back surface 250b of the presser 250 facing upward. At that time, the top end of the ball plunger 554 presses the side surface of the presser 250 and, thus, fall-off of the presser 250 can be prevented.

Figure 31:
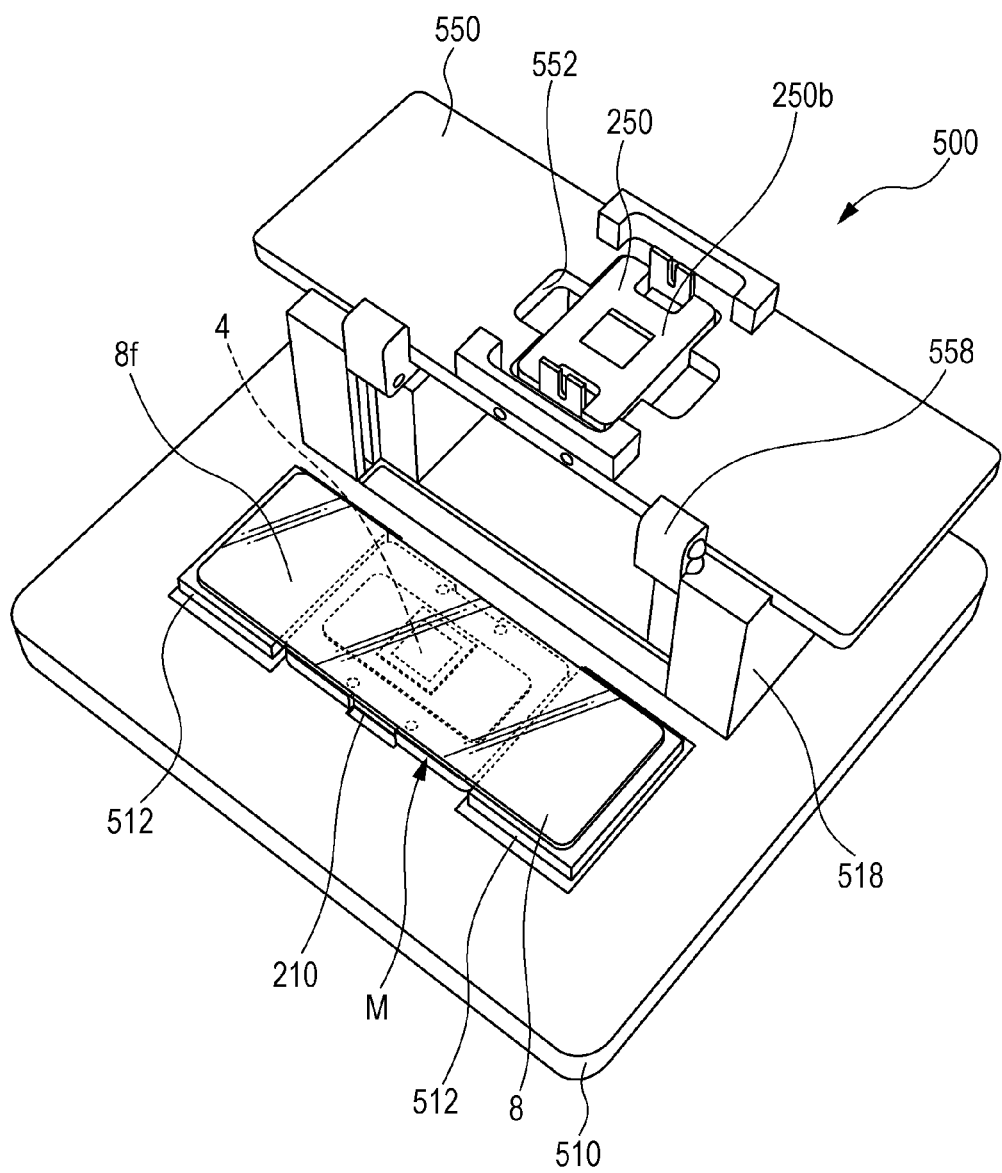
FIG. 31 is a perspective view illustrating how to use the assembly jig.

Subsequently, as illustrated in FIG. 31, the module M is disposed on the support plate 210. At that time, the transparent plate 8 of the module M is supported by the plate mount portions 512.

Figure 32:
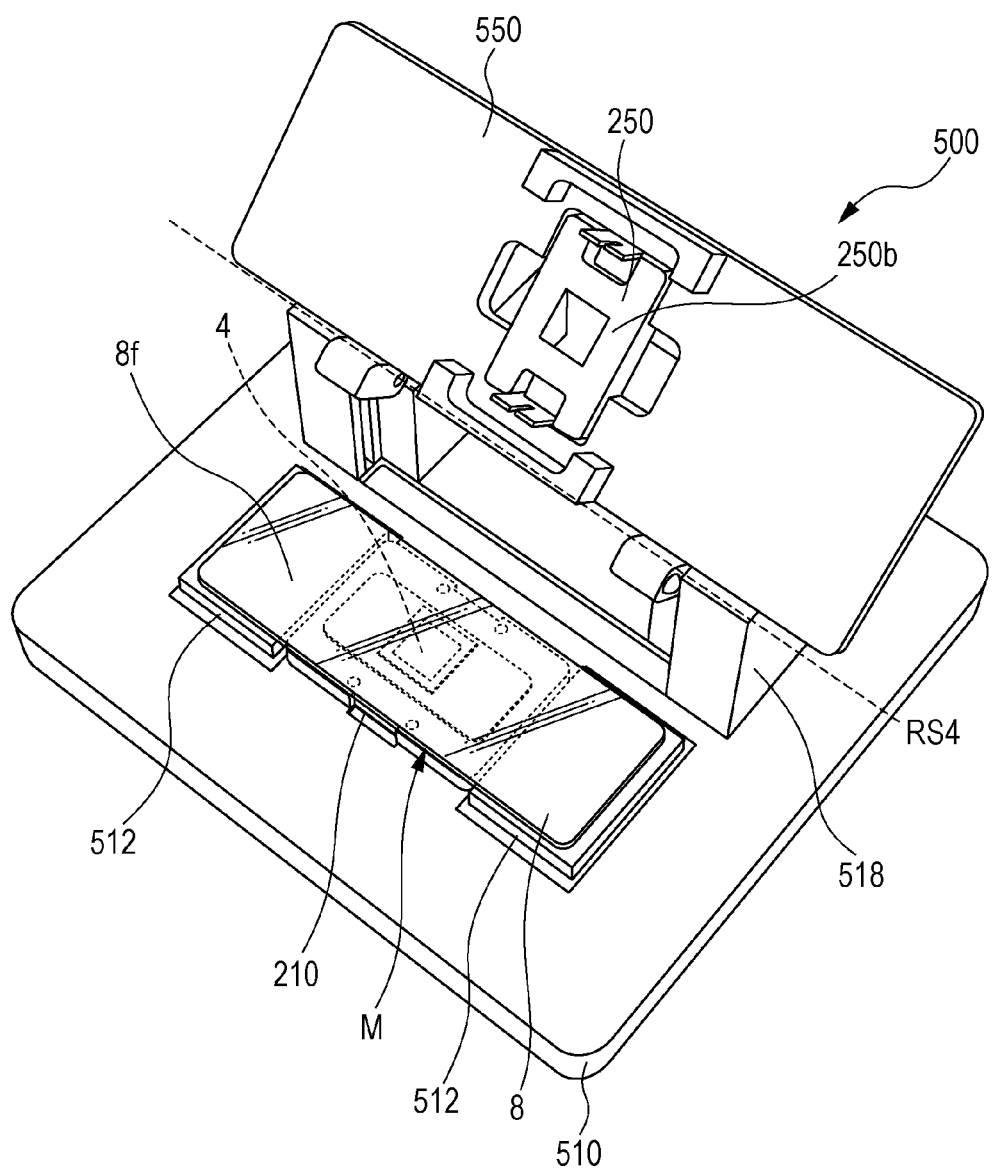
FIG. 32 is a perspective view illustrating how to use the assembly jig.
Figure 33A:
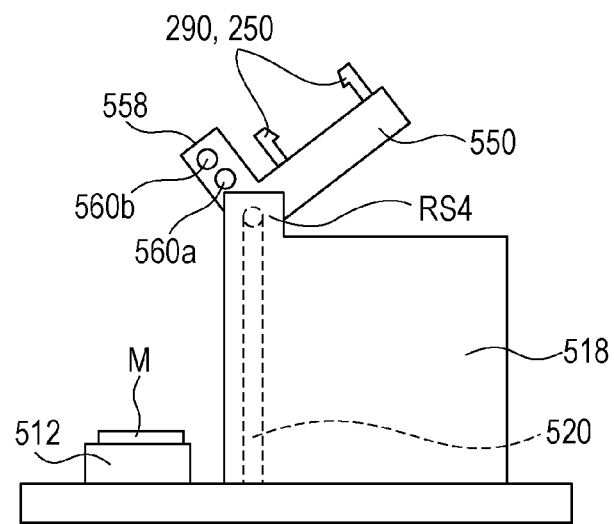
FIG. 33A is a side view illustrating a flap that is rotated.
Figure 33B:
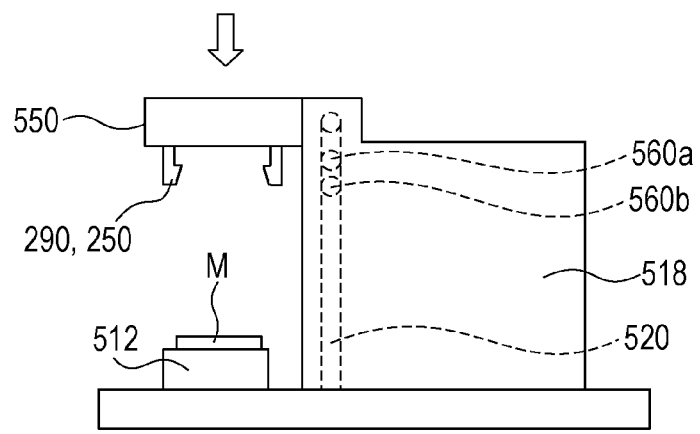
FIG. 33B is a side view illustrating the flap that is turned over.

Subsequently, as illustrated in FIGS. 32 and 33A, the flap 550 is rotated about the axis RS4. In this example, the flap 550 is turned over about the axis RS4 by 180°. In this manner, as illustrated in FIG. 33B, the ball plungers 560a and 560b are sequentially fitted into the guide rails 520 of the wall portions 518. After the flap 550 is turned over about the axis RS4 by 180°, the hooks 290 of the presser 250 face the module M. At that time, the support plate holding portion 514 of the bottom plate 510 faces the opening 552 of the flap 550. Note that if the rotation angle of the flap 550 to cause the support plate holding portion 514 of the bottom plate 510 to face the opening 552 of the flap 550 is set to 90° or greater and 180° or less, the operation can be facilitated. If the rotation angle of the flap is 180°, the operation to connect the presser 250 to the support plate 210 is facilitated. This is because the presser 250 can be connected to the support plate 210 by moving the presser 250 downward. If the rotation angle of the flap is 90°, the operation to insert the presser 250 into the opening 552 of the flap 550 is facilitated. This is because the presser 250 can be inserted into the opening 552 by moving the presser 250 from the front to the back. If the rotation angle of the flap 550 is 0°, the operation to insert the presser 250 into the opening 552 of the flap 550 is facilitated. This is because the presser 250 can be inserted into the opening 552 of the flap 550 with the back surface 250b of the presser 250 facing upward.

Figure 34:
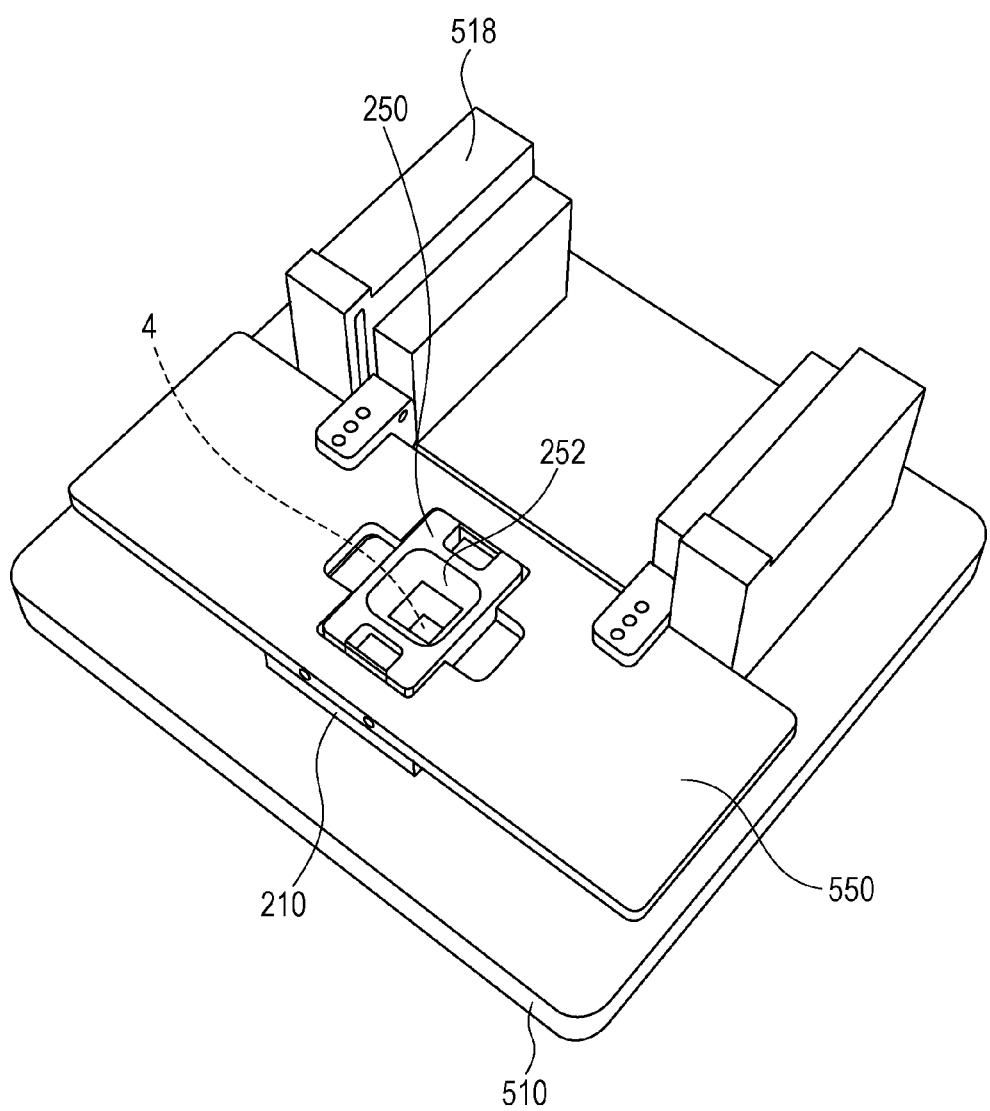
FIG. 34 is a perspective view illustrating how to use the assembly jig.
Figure 35A:
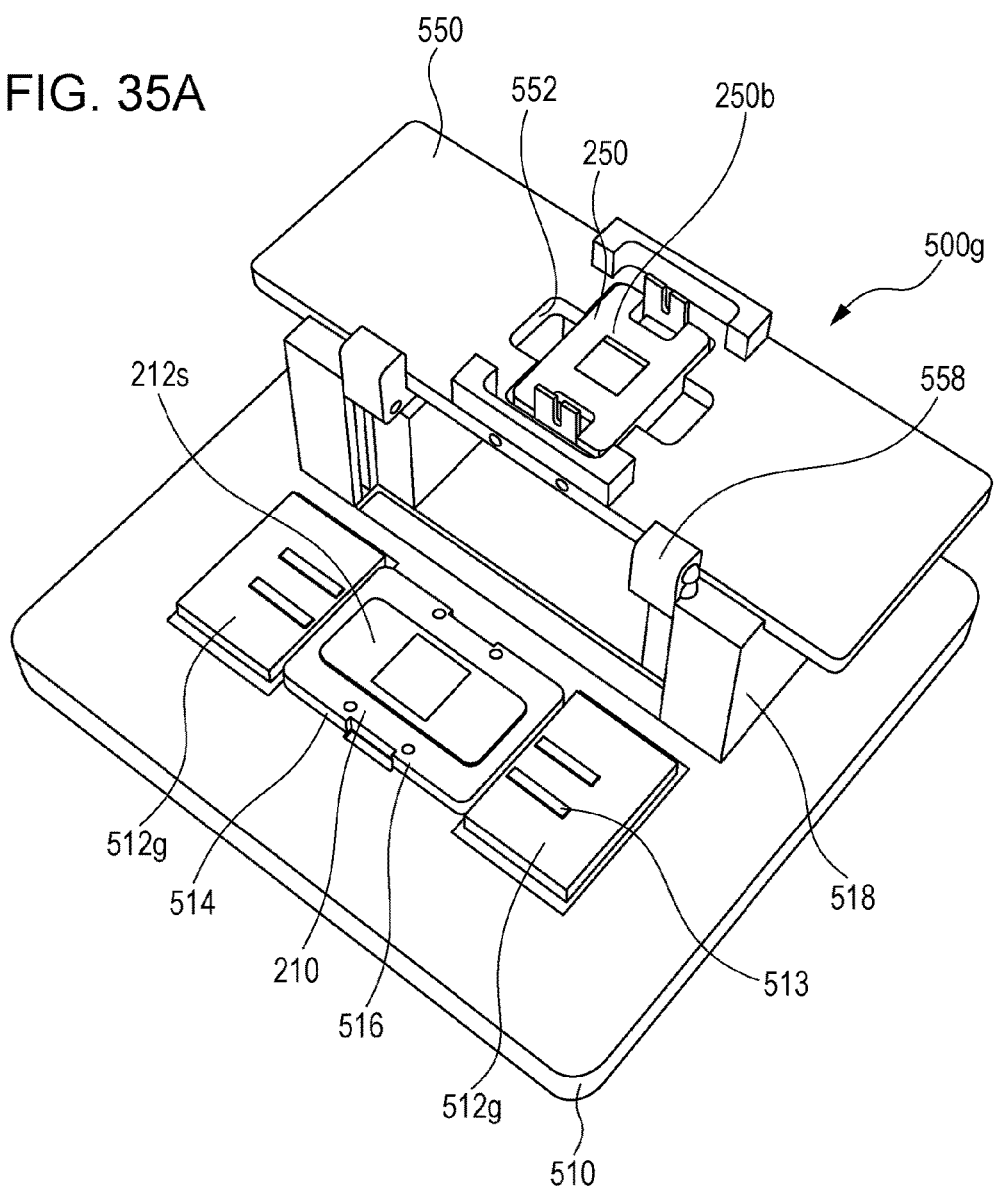
FIG. 35A is a perspective view of an assembly jig having a guide structure on the top surface of a plate mount portion, where the guide structure regulates a direction in which a module is disposed.
Figure 35B:
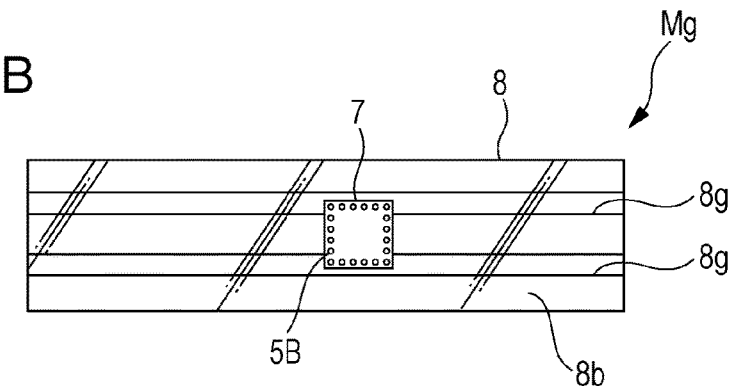
FIG. 35B is a plan view of a module having two grooves in the back surface of a transparent plate.

Thereafter, as illustrated in FIGS. 33B and 34, the flap 550 is lowered toward the module M. Since the shaft and the ball plungers 560a and 560b of the arm 558 are linearly arranged, the flap 550 can be vertically pushed down along the guide rails 520. In this manner, the hooks 290 of the presser 250 are fitted into the notches 220 of the support plate 210, and the support plate 210 is connected to the presser 250. If the flap 550 is raised, the presser 250 is separated from the opening 552 of the flap 550. Thus, the object unit 200u illustrated in FIG. 25 is obtained.

By using the assembly jig 500 having the above-described configuration, the module M can be more easily fixed between the support plate 210 and the presser 250. In addition, since the presser 250 can be moved close to the supporting surface 212s of the support plate 210 in a direction perpendicular to the supporting surface 212s and be connected to the support plate 210, application of a shear stress to the object can be prevented when the support plate 210 is connected to the presser 250. That is, since the object is not urged by the imaging device 7 in a diagonal direction, mixture of bubbles into the encapsulating medium 6 and/or a variation of the distance between the transparent plate 8 and the imaging surface of the imaging device 7 can be prevented.

Note that a guide structure that regulates the mounting direction of the module may be formed on the top surface of the plate mount portion. In an assembly jig 500g illustrated in FIG. 35A as an example, the upper surface of each of two plate mount portions 512g has two protruding portions 513 formed thereon. Each of the protruding portions 513 has a cuboid shape. In such a case, a module including a transparent plate having a concave portion corresponding to the protruding portion 513 can be used. In a module Mg illustrated in FIG. 35B as an example, two grooves 8g are formed in the back surface 8b of the transparent plate 8. In the example illustrated in FIG. 35A, the grooves 8g are formed so as to extend along a long side of the transparent plate 8 having a cuboid shape.

Figure 36:
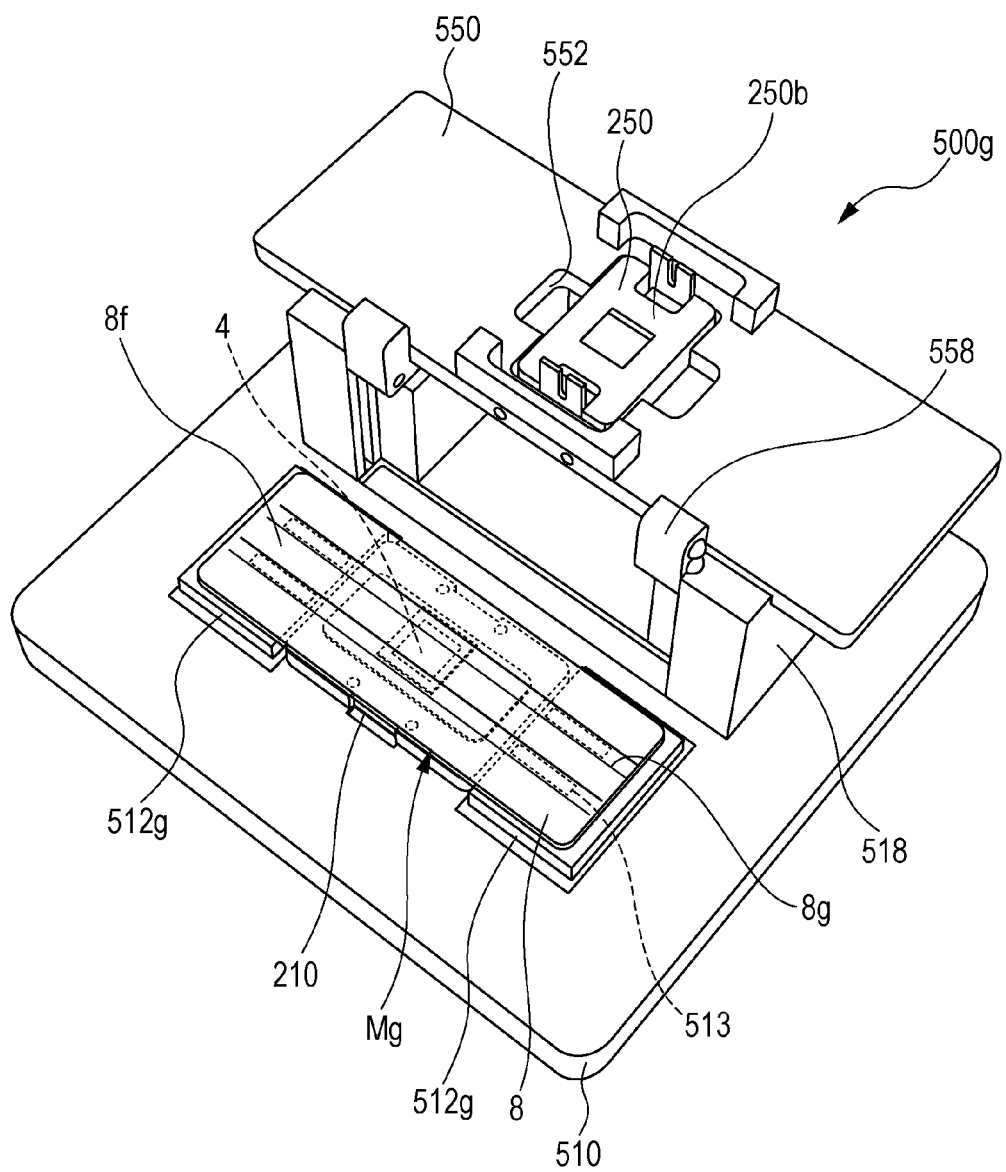
FIG. 36 is a perspective view of a module placed on a plate mount portion so that a protruding portion of the plate mount portion is fitted into the groove of the transparent plate.

As illustrated in FIG. 36, by placing the module Mg on the plate mount portions 512g so that the protruding portions 513 of the plate mount portions 512g are fitted into the grooves 8g of the transparent plate 8, the module Mg can be disposed on the support plate 210 in a predetermined direction. That is, it can be prevented that the direction of the module Mg is at an angle relative to the direction of the support plate 210. Accordingly, when the support plate 210 is connected to the presser 250, damage of the presser 250 caused by collision of the hooks 290 with the transparent plate can be prevented. In addition, even when a length W3 of the flat portion 214 measured along a short side direction of the transparent plate 8 (refer to FIG. 27A) is substantially the same as a length W2 of a short side of the transparent plate 8, the direction of the module Mg is not at an angle relative to the direction of the support plate 210. Accordingly, the object unit 200u can be reliably attached to the first base member 110e. In addition, the shape of the protruding portion 513, the number of the protruding portions 513, and the arrangement of the protruding portions 513 are not limited to those illustrated in FIG. 35A. Instead of the protruding portion, a concave portion having a shape corresponding to the external shape of the transparent plate 8 may be provided, for example. In addition, the structure formed on the back surface 8b of the transparent plate 8 may have any shape that corresponds to the guide structure of the plate mount portion 512. That is, the shape is not limited to the shape of the groove.

In the configuration described above with reference to FIGS. 35A to 36, the direction of the module Mg is regulated in accordance with the direction of the support plate 210. Accordingly, if the transparent plate 8 is placed on the plate mount portions 512g, the direction of the imaging device 7 relative to the direction of the support plate 210 is determined. At that time, even when in the module Mg, the direction of the package 5 is at an angle relative to the direction of the transparent plate 8, the imaging device 7 can be disposed inside the concave portion 218 if the concave portion 218 (refer to FIG. 27A) of the support plate 210 that stores the module M is sufficiently large.

Image Sensor of Module

The image sensor 4 is not limited to a CCD image sensor. For example, the image sensor 4 may be a complementary metal-oxide semiconductor (CMOS) image sensor or another type of image sensor (e.g., a photoelectric conversion film stacked image sensor described below). Each of a CCD image sensor and a CMOS image sensor may be a front illuminated image sensor or a back illuminated image sensor. A relationship between the device structure of an image sensor and light incident on a photodiode of the image sensor is described below.

Figure 37:
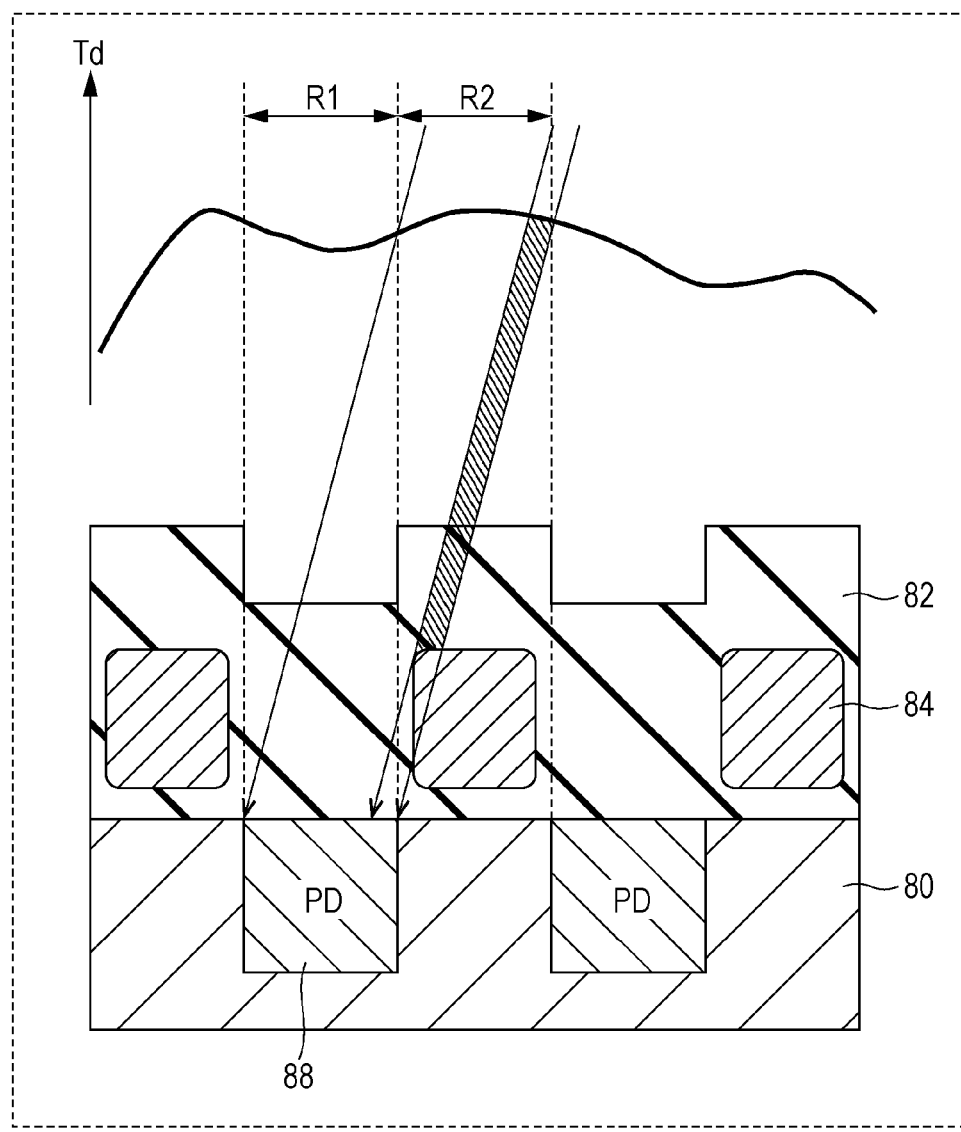
FIG. 37 illustrates the cross-section structure of a CCD image sensor and an example of the distribution of the relative transmittance Td of an object.

FIG. 37 illustrates the cross-section structure of the CCD image sensor and an example of the distribution of a relative transmittance Td of the object. As illustrated in FIG. 37, the CCD image sensor schematically includes a substrate 80, an insulating layer 82 formed on the substrate 80, and wires 84 disposed in the insulating layer 82. The substrate 80 has a plurality of photodiodes 88 formed therein. A light shielding layer (not illustrated in FIG. 37) is formed on the wires 84. In FIG. 37, transistors are not illustrated. In addition, transistors are not illustrated in the subsequent drawings. Note that the schematic cross-section structure in the vicinity of the photodiode of a front illuminated CMOS image sensor is substantially the same as the schematic cross-section structure in the vicinity of the photodiode of a CCD image sensor. Accordingly, hereinafter, the cross-section structure of the front illuminated CMOS image sensor is not illustrated, and description of the front illuminated CMOS image sensor is not provided.

As illustrated in FIG. 37, if the illumination light is delivered in the normal direction of the imaging surface, the illumination light transmitted through an area R1 of the object located immediately above the photodiode 88 is incident on the photodiode 88. In contrast, the illumination light transmitted through an area R2 located immediately above the wire 84 is incident on a light shielding area of the image sensor (an area having a light shielding layer formed thereon). Accordingly, if the illumination light is delivered in the normal direction of the imaging surface, the image of the area R1 of the object located immediately above the photodiode 88 is captured.

To capture the image of the area located immediately above the light shielding film, the illumination light can be delivered in a direction at an angle relative to the normal direction of the imaging surface so that the light transmitted the area R2 is delivered to the photodiode 88. At that time, part of the light transmitted through the area R2 may be blocked by the wire 84 depending on the direction of the incoming ray of light. In the example illustrated in FIG. 37, the incoming ray of light transmitted through an area indicated by hatchings does not reach the photodiode 88. Accordingly, if the ray of light is incident at an angle, the pixel value may be slightly decreased. However, since all of the transmitted light are not blocked, the high-resolution image can be formed using the sub-image obtained at that time.

Figure 38A:
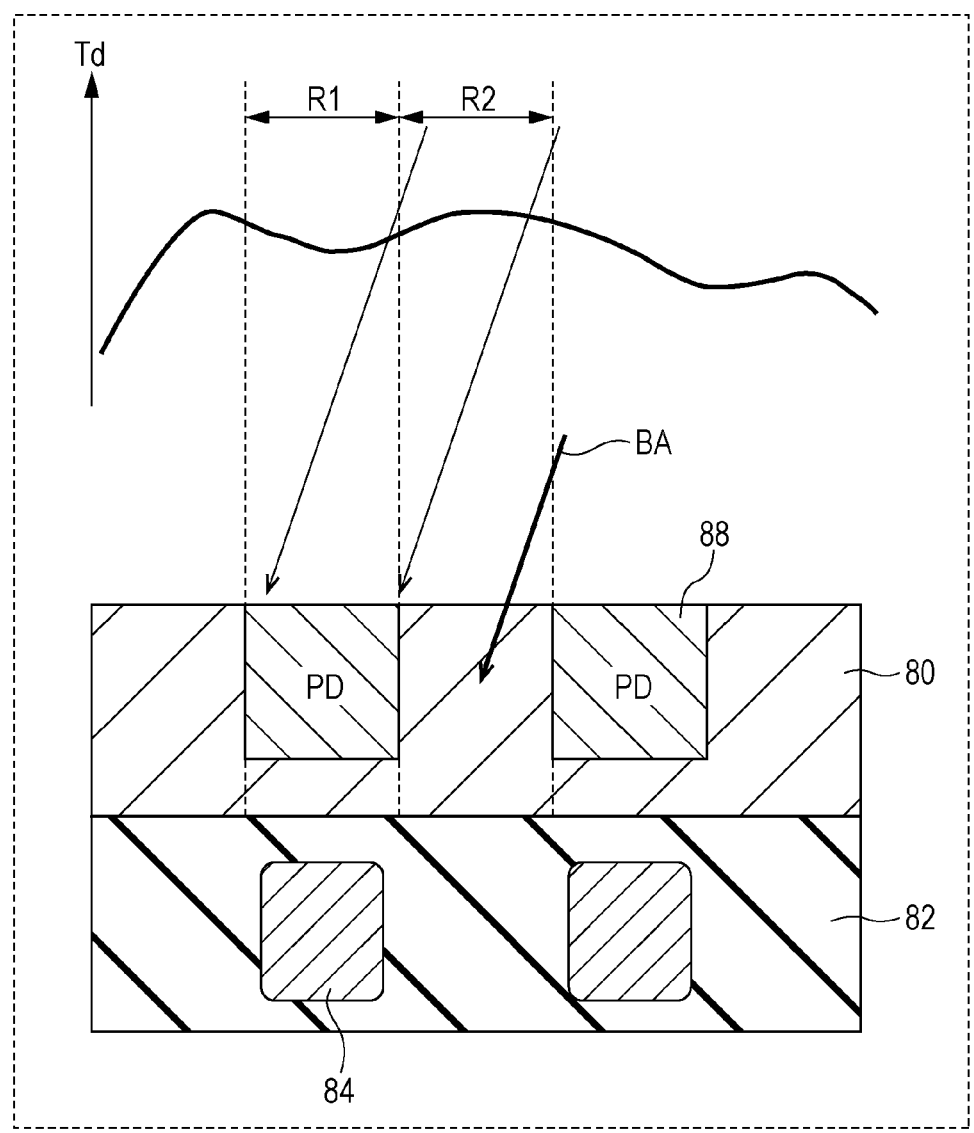
FIG. 38A illustrates the cross-section structure of a back illuminated CMOS image sensor and an example of the distribution of the relative transmittance Td of an object.
Figure 38B:
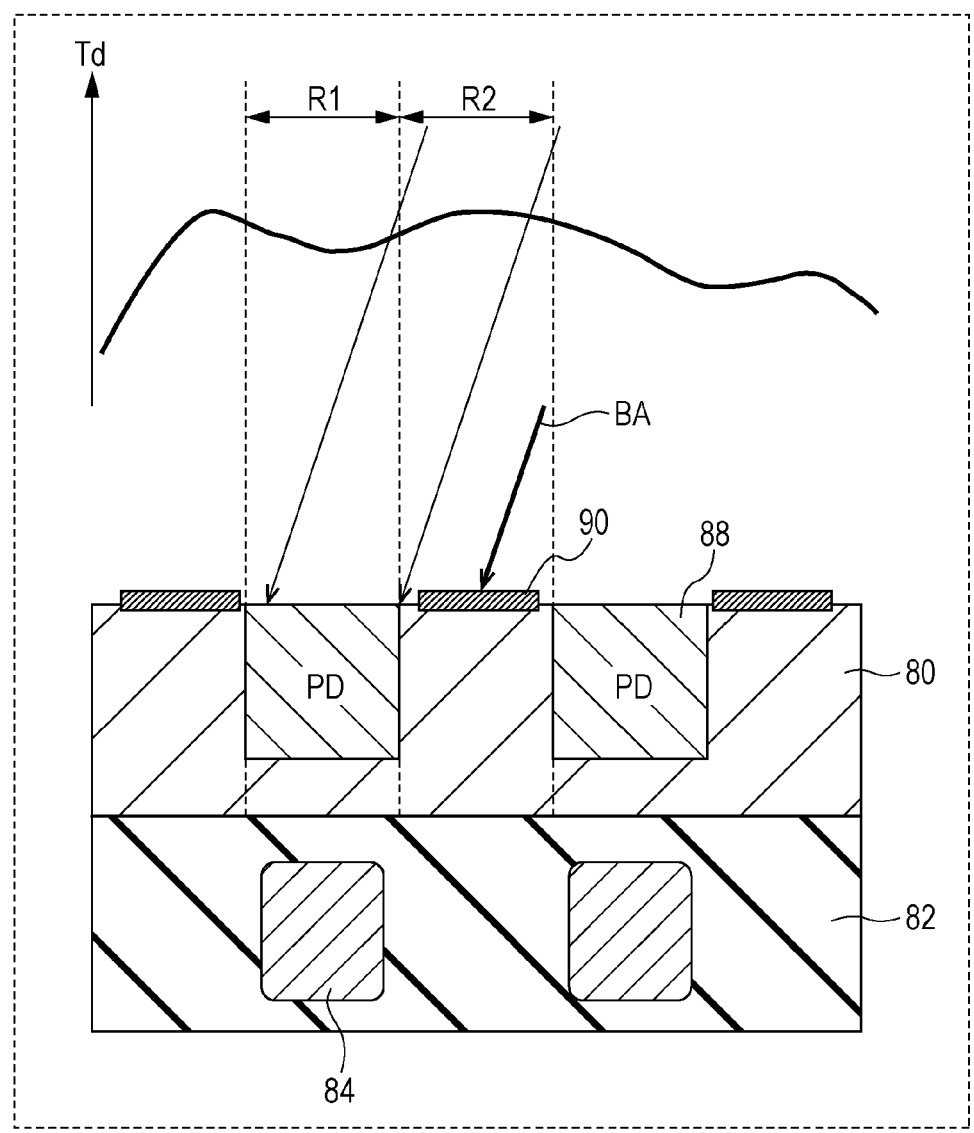
FIG. 38B illustrates the cross-section structure of a back illuminated CMOS image sensor and an example of the distribution of the relative transmittance Td of an object.

FIGS. 38A and 38B illustrate the cross-section structure of a back illuminated CMOS image sensor and an example of the distribution of the relative transmittance Td of the object. As illustrated in FIG. 38A, in the back illuminated CMOS image sensor, the transmitted light is not blocked by the wire 84 even when the ray of incoming light is incident at an angle. Note that if the light transmitted through an area of the object other than the area that is the target of image capture (a ray of light schematically indicated by a bold arrow BA in FIG. 38A and FIG. 38B described below) is incident on the substrate 80, noise is generated and, thus, the quality of the sub-image may be decreased. Such a decrease in the quality can be reduced by forming the light shielding layer 90 on an area of the substrate other than the area having the photodiode formed therein, as illustrated in FIG. 38B.

Figure 39:
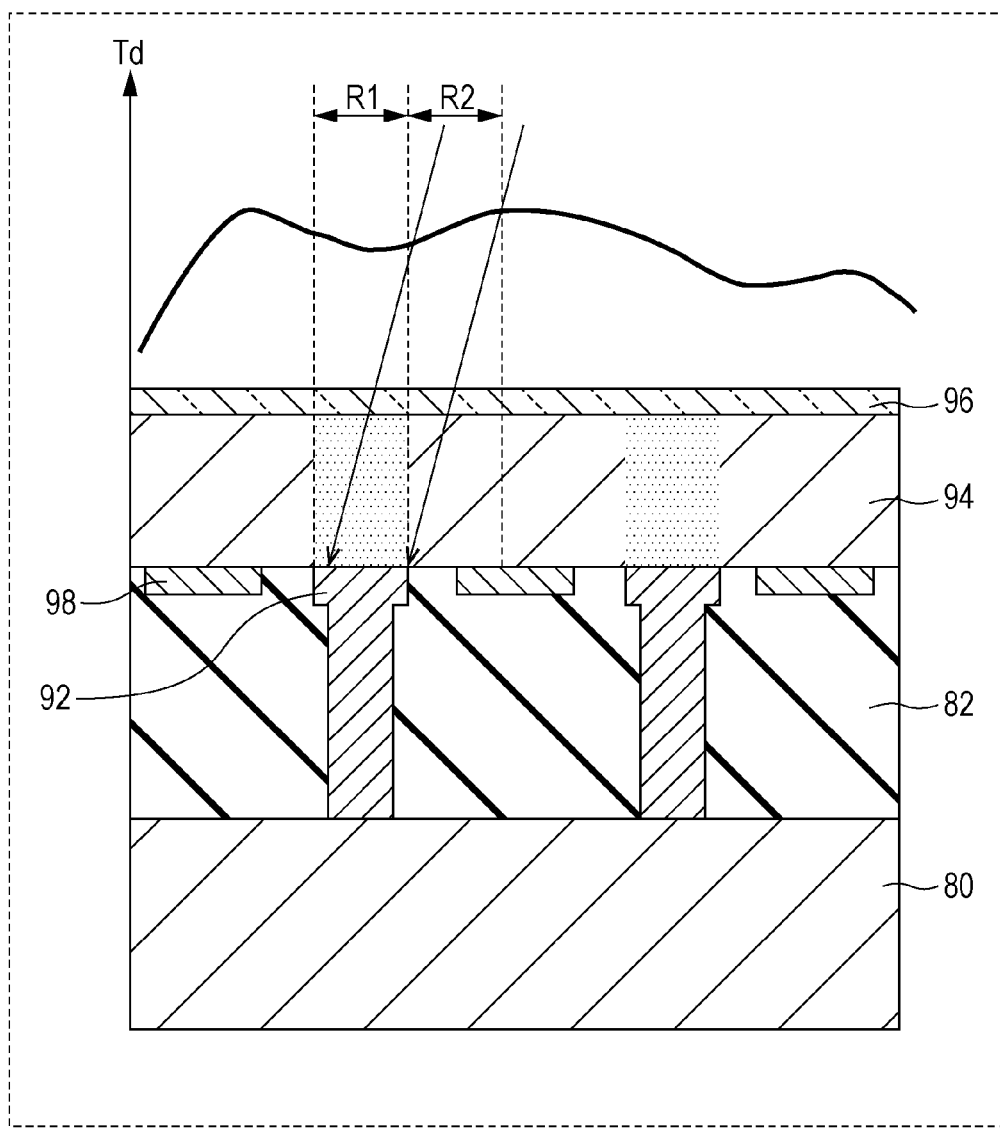
FIG. 39 illustrates the cross-section structure of a photoelectric conversion film stacked image sensor and an example of the distribution of the relative transmittance Td of an object.

FIG. 39 illustrates the cross-section structure of an image sensor having a photoelectric conversion film formed of an organic material or an inorganic material (hereinafter referred to as a "photoelectric conversion film stacked image sensor") and an example of the distribution of the relative transmittance Td of the object. As schematically illustrated in FIG. 39, the photoelectric conversion film stacked image sensor includes the substrate 80, the insulating layer 82 having a plurality of pixel electrodes formed therein, a photoelectric conversion film 94 formed on the insulating layer 82, and a transparent electrode 96 formed on the photoelectric conversion film 94. As illustrated in FIG. 39, in the photoelectric conversion film stacked image sensor, instead of a photodiode formed in a semiconductor substrate, the photoelectric conversion film 94 that performs photoelectric conversion is formed on the substrate 80 (e.g., a semiconductor substrate). Typically, the photoelectric conversion film 94 and the transparent electrode 96 are formed over the entire imaging surface. In FIG. 39, a protecting film that protects the photoelectric conversion film 94 is not illustrated.

In the photoelectric conversion film stacked image sensor, electric charge generated through photoelectric conversion of the incoming ray of light in the photoelectric conversion film 94 (electrons or holes) are collected by a pixel electrode 92. In this manner, a value indicating the intensity of the ray of light incident on the photoelectric conversion film 94 can be obtained. Accordingly, for the photoelectric conversion film stacked image sensor, a unit area of the imaging surface including one of the pixel electrodes 92 corresponds to a pixel. Like the back illuminated CMOS image sensor, in the photoelectric conversion film stacked image sensor, even when the ray of light is incoming at an angle, the transmitted light is not blocked by the wire.

As described above with reference to FIGS. 1A to 6, to form a high-resolution image, a plurality of sub-images indicating the images of different parts of the object are used. At that time, in a typical photoelectric conversion film stacked image sensor, the photoelectric conversion film 94 is formed over the entire imaging surface. Accordingly, even when the light is delivered in the vertical direction, photoelectric conversion may be performed by the photoelectric conversion film 94 due to the light transmitted through an area of the object other than a desired area. If unwanted electrons or holes generated at that time are drawn by the pixel electrode 92, an appropriate sub-image may not be obtained. Accordingly, it is desirable that electrical charge generated in an area in which the pixel electrode 92 overlaps the transparent electrode 96 (an area with hatchings in FIG. 39) be selectively drawn by the pixel electrode 92.

In the example of the configuration illustrated in FIG. 39, a dummy electrode 98 corresponding to each of the pixel electrodes 92 is provided in a pixel. When the image of the object is captured, an appropriate potential difference is provided between the pixel electrode 92 and the dummy electrode 98. In this manner, electrical charge generated in an area other than the area in which the pixel electrode 92 overlaps the transparent electrode 96 can be drawn by the dummy electrode 98, and electrical charge generated in the area in which the pixel electrode 92 overlaps the transparent electrode 96 can be selectively drawn by the pixel electrode 92. Note that the same effect can be provided using the patterning of the transparent electrode 96 or the photoelectric conversion film 94. In such a configuration, the ratio of an area S3 of the pixel electrode 92 to an area S1 of the pixel (S3/S1) corresponds to the "aperture ratio".

As described above, when N denotes an integer greater than or equal to 2 and if the aperture ratio of the image sensor 4 is approximately equal to 1/N, the resolution can be increased to up to N times the original resolution. That is, the resolution can be more easily increased with decreasing aperture ratio. In the photoelectric conversion film stacked image sensor, by controlling the area S3 of the pixel electrode 92, the ratio (S3/S1) corresponding to the aperture ratio can be controlled. The ratio (S3/S1) is set to, for example, a value in the range from 10% to 50%. A photoelectric conversion film stacked image sensor having the ratio (S3/S1) within the above-described range can be used for super resolution.

Note that as can be seen from FIGS. 37 and 38B, the front surfaces of the CCD image sensor and the front illuminated CMOS image sensor that face the object are not flat. For example, in the CCD image sensor, the front surface has a stepped portion. In addition, in the back illuminated CMOS image sensor, to capture the sub-image that forms the high-resolution image, a patterned light shielding layer needs to be provided on the imaging surface. Thus, the front surface that faces the object is not flat.

In contrast, as can be seen from FIG. 39, the imaging surface of the photoelectric conversion film stacked image sensor is substantially flat. Accordingly, even when an object is disposed on the imaging surface, deformation of the object due to the shape of the imaging surface is less likely. That is, by capturing the sub-image using a photoelectric conversion film stacked image sensor, the more details of the structure of the object can be observed.

It should be noted that the above-described variety of exemplary embodiments can be combined in any way as long as no conflict arises.

INDUSTRIAL APPLICABILITY

The socket, the adaptor, and the object unit according to the exemplary embodiments of the present disclosure are applicable to image forming systems that employ a high resolution technology that provides a resolution that is higher than the resolution determined by the pixel size of an image sensor. The high-resolution image provides beneficial information in, for example, pathological diagnosis.

What is claimed is:

1. An assembly jig comprising:
a bottom plate including a first holding portion that allows a support plate to be placed thereon;
a wall portion that extends upward from the bottom plate in a direction perpendicular to the bottom plate; and
a movable portion that has a rotation axis perpendicular to the wall portion and that is connected to the wall portion in a slidable manner in a direction perpendicular to the bottom plate, the movable portion including a second holding portion that allows a presser to be inserted thereinto,
wherein the assembly jig has a first state in which the bottom plate is parallel to the movable portion and a second state in which the movable portion is rotated about the rotation axis from the first state at an angle greater than or equal to 90° and less than or equal to 180°, and
wherein in one of the first state and the second state, the movable portion is located so that the first holding portion is disposed on top of the second holding portion.

* * * * *